United States Patent
Ino et al.

(10) Patent No.: US 7,608,849 B2
(45) Date of Patent: Oct. 27, 2009

(54) NON-VOLATILE SWITCHING ELEMENT, METHOD FOR MANUFACTURING THE SAME, AND INTEGRATED CIRCUIT HAVING NON-VOLATILE SWITCHING ELEMENTS

(75) Inventors: Tsunehiro Ino, Fujisawa (JP); Masato Koyama, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 11/554,808

(22) Filed: Oct. 31, 2006

(65) Prior Publication Data
US 2007/0145345 A1 Jun. 28, 2007

(30) Foreign Application Priority Data
Dec. 28, 2005 (JP) ............... 2005-379267

(51) Int. Cl.
*H01L 29/02* (2006.01)
*H01L 47/00* (2006.01)

(52) U.S. Cl. .............. 257/4; 257/2; 257/467; 257/930; 257/E23.082; 136/203; 136/204

(58) Field of Classification Search ...... 257/2, 257/4, 467, 930, E23.082; 136/203, 204
See application file for complete search history.

(56) References Cited

U.S. PATENT DOCUMENTS

| | | | | |
|---|---|---|---|---|
| 6,246,100 | B1 * | 6/2001 | Strnad | 257/467 |
| 6,399,872 | B2 * | 6/2002 | Strnad | 136/201 |
| 6,744,110 | B2 * | 6/2004 | Sterzel et al. | 257/467 |
| 7,005,665 | B2 * | 2/2006 | Furkay et al. | 257/2 |
| 2004/0188668 | A1 | 9/2004 | Hamann et al. | |
| 2004/0232893 | A1 * | 11/2004 | Odagawa et al. | 320/154 |
| 2006/0249724 | A1 * | 11/2006 | Krusin-Elbaum et al. | 257/2 |
| 2009/0052222 | A1 * | 2/2009 | Hu et al. | 365/129 |

FOREIGN PATENT DOCUMENTS

JP 2002-368504 12/2002
JP 2006196650 A * 7/2006

OTHER PUBLICATIONS

H. Kuwamoto, et al., "Electrical properties of the $(V_{1-x}Cr_x)_2O_3$ system.", Physical Review B, vol. 22, No. 6, Sep. 15, 1980, pp. 2626-2636.

* cited by examiner

*Primary Examiner*—Kiesha L Rose
*Assistant Examiner*—Eric Ward
(74) *Attorney, Agent, or Firm*—Oblon, Spivak, McClelland, Maier & Neustadt, L.L.P.

(57) ABSTRACT

The present invention provides a non-volatile switching element having a novel structure that operates at a high speed and enables high integration, and an integrated circuit that includes such non-volatile switching elements. The switching element includes: a switching film formed on a substrate, made of a material causing a 10 times or greater change in electric resistance with a temperature change within a range of ±80 K from a predetermined temperature; a Peltier element causing the switching film to have the temperature change; a heat conducting/electric insulating film provided between the switching film and the Peltier element, to conduct heat from the Peltier element; and a pair of electrodes connected to the switching film.

24 Claims, 71 Drawing Sheets

A-A SECTION

B-B SECTION

A-A SECTION

A-A SECTION

A-A SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

A-A SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

B-B SECTION

A-A SECTION

A-A SECTION

A-A SECTION

A-A SECTION

A-A SECTION

A-A SECTION

A-A SECTION

A-A SECTION

B-B SECTION

A-A SECTION

B-B SECTION

A-A SECTION

A-A SECTION

NON-VOLATILE SWITCHING ELEMENT, METHOD FOR MANUFACTURING THE SAME, AND INTEGRATED CIRCUIT HAVING NON-VOLATILE SWITCHING ELEMENTS

CROSS-REFERENCE TO RELATED APPLICATION

This application is based upon and claims the benefit of priority from prior Japanese Patent Application No. 2005-379267 filed on Dec. 28, 2005 in Japan, the entire contents of which are incorporated herein by reference.

BACKGROUND OF THE INVENTION

1. Field of the Invention

The present invention relates to non-volatile switching elements, a method of manufacturing the non-volatile switching elements, and an integrated circuit that includes the non-volatile switching elements.

2. Related Art

In an integrated circuit including cells for performing switching electrically, a transistor formed with a semiconductor material is most often used to serve as a switching element. As the gate insulating film of each transistor has become thinner with the miniaturization of semiconductor circuits in recent years, it has become difficult to restrain excess power consumption, even in a CMOS, due to the increases in leakage current.

Meanwhile, DRAMs (Dynamic Random Access Memories) and SRAMs (Static Random Access Memories) are most often used as volatile memories. Flash memories are most often used as non-volatile memories. However, MRAMs (Magnetic Random Access Memories), FRAMs (Ferroelectric Random Access Memories), OUMs (Ovonic Unified Memories), and RRAMs (Resistive Random Access Memories) have been proposed as memories with possibly improved characteristics (see the specification of U.S.P Application Publication No. 2004/0188668, for example).

However, DRAMs have problems such as scaling, SRAMs have problems such as large cell areas and power consumption, flash memories have problems such as long writing time, MRAMs have problems such as large power consumption, and FRAMs have problems such as scaling and poor reliability. As for OUMs and RRAMs, they are still being developed.

On the other hand, thermistors formed with materials that exhibit variations in electric resistance with temperature changes have been known over a long period of time, and have been used in current limiters, current-decay noncontact switches, temperature detectors, fixed-temperature heat generators, temperature sensors (infrared detectors), and the likes. However, there is no need to integrate those devices, or there is a heat source outside each of those circuits.

Although known to have variations in resistance with heat, thermal electric switching elements with heating sources or cooling sources have not been considered to be integrated to form a non-volatile memory or a logic circuit.

Also, a metal-insulator transition with a hysteresis is known in $V_2O_3$ oxides (see Physical Review B, Volume 22, Number 6, 1980, p.p. 2626, for example). In this paper, however, applications to non-volatile memories or logic circuits are not discussed, though the principles of a metal-insulator transition in $V_2O_3$ oxides are described

SUMMARY OF THE INVENTION

A non-volatile switching element according to a first aspect of the present invention includes: a switching film formed on a substrate, made of a material causing a 10 times or greater change in electric resistance with a temperature change within a range of ±80 K from a predetermined temperature; a Peltier element causing the switching film to have the temperature change; a heat conducting/electric insulating film provided between the switching film and the Peltier element, to conduct heat from the Peltier element; and a pair of electrodes connected to the switching film.

An integrated circuit according to a second aspect of the present invention: a plurality of cells arranged in a matrix form, each of the cells having the non-volatile switching element above described.

A method for manufacturing a non-volatile switching element according to a third aspect of the present invention, includes: forming a switching film on a substrate, the switching film made of a material causing a 10 times or more change in electric resistivity with a temperature change within a range of ±80 K from a predetermined temperature; forming a heat conducting/electric insulating film on the switching film; forming a first Peltier electrode film of a first conductivity type on the heat conducting/electric insulating film so as to overlap the switching film; forming a second Peltier electrode film of a second conductivity type on the first Peltier electrode film so as to overlap the switching film; forming a Peltier element that includes the first Peltier electrode film and the second Peltier electrode film by patterning the first and second Peltier electrode films; performing ion implantation to the switching film located on both sides of the Peltier element, so as to form a switching portion at the portion of the switching film that is located immediately below the Peltier element and to which ions are not injected; and forming electrodes of the switching portion by performing heat treatment to alloy the portion of the switching film to which the ions are injected.

DETAILED DESCRIPTION OF THE INVENTION

The following is a description of embodiments of the present invention, with reference to the accompanying drawings.

First Embodiment

Figure 1A:
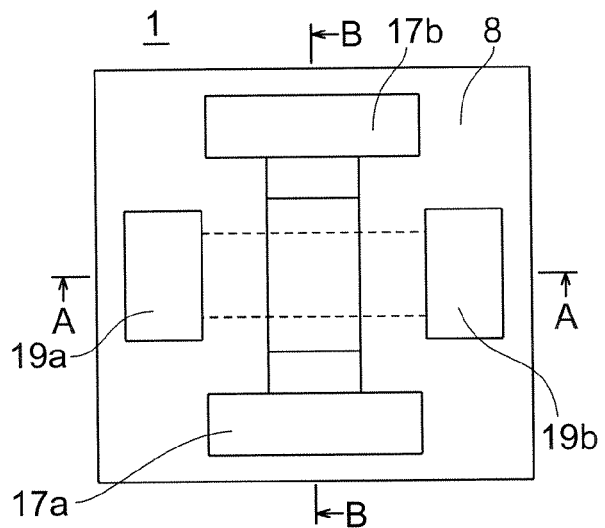
FIGS. 1A through 1C illustrate a switching element in accordance with a first embodiment of the present invention.

Referring to FIGS. 1A through 8C, an integrated circuit in accordance with a first embodiment of the present invention is described. The integrated circuit of this embodiment includes cells that are arranged in a matrix form, and each of the cells has a non-volatile switching element (hereinafter also referred to simply as "switching element") shown in FIGS. 1A, 1B, and 1C. FIG. 1A is a plan view of a switching element 1 in accordance with this embodiment. FIG. 1B is a cross-sectional view of the switching element 1, taken along the line A-A of FIG. 1A. FIG. 1C is a cross-sectional view of the switching element 1, taken along the line B-B of FIG. 1A. In the plan view of FIG. 1A, an interlayer insulating film 16 that is described later is not shown.

The switching element 1 in accordance with this embodiment includes a switching portion 6 formed on a substrate 2, electrode portions 6a and 6b disposed in contact with the side faces of the switching portion 6, a heat conducting/electric insulating film 8 that is formed on the switching portion 6 and is made of an electric insulating material with high heat conductivity, and a Peltier element 13 provided on the heat conducting/electric insulating film 8. The switching portion 6 and the electrode portions 6a and 6b are surrounded by an element isolating region 4 that is formed on the substrate 2 and is made of an insulating material, and are electrically isolated from the other switching elements. As described later, the switching portion 6 is made of such a material that can change from a low-resistance state to a high-resistance state, or from a high-resistance state to a low-resistance state, in accordance with changes in temperature. The electrode 6a is electrically connected to the outside via a contact 19a formed in an interlayer insulating film 16 that is formed to cover the Peltier element 13. The electrode 6b is electrically connected to the outside via a contact 19b formed in the interlayer insulating film 16. The Peltier element 13 includes a first Peltier electrode 10 and a second Peltier electrode 12 that overlaps the first Peltier electrode 10. The overlapping portion between the first Peltier electrode 10 and the second Peltier electrode 12 is arranged to cover the switching portion 6. The first Peltier electrode 10 is electrically connected to the outside via a contact 17a formed in the interlayer insulating film 16, and the second Peltier electrode 12 is electrically connected to the outside via a contact 17b formed in the interlayer insulating film 16.

In the switching element 1 in accordance with this embodiment, current is applied to the Peltier element 13 from one of the contacts 17a and 17b, so as to heat the Peltier element 13 or cause the Peltier element 13 to absorb heat. The heat is conducted to the switching portion 6 via the heat conducting/electric insulating film 8, and the switching unit 6 is switched to one of the low-resistance state and the high-resistance state to the other. The resistance state after the transition is detected by applying current between the contacts 19a and 19b. Since the overlapping portion between the first Peltier electrode 10 and the second Peltier electrode 12 is arranged to cover the switching portion 6, generated heat or absorbed heat is efficiently conducted from the Peltier element 13 to the switching portion 6. The Peltier element 13 generates heat where current is applied from the p-type Peltier electrode (the Peltier electrode 12 in this embodiment) to the n-type Peltier electrode (the Peltier electrode 10 in this embodiment), and heat is absorbed where current is applied from the n-type Peltier electrode to the p-type Peltier electrode.

Next, a method for manufacturing the switching element 1 in accordance with this embodiment is described. The procedures for manufacturing the switching element 1 are shown in FIGS. 2A through 8C.

Figure 2A:
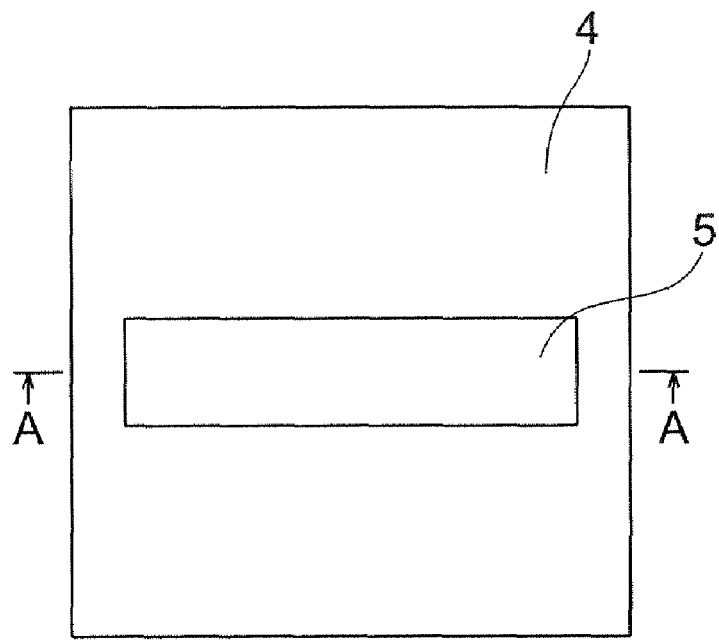
FIGS. 2A and 2B illustrate a procedure for manufacturing the switching element in accordance with the first embodiment.
Figure 2B:
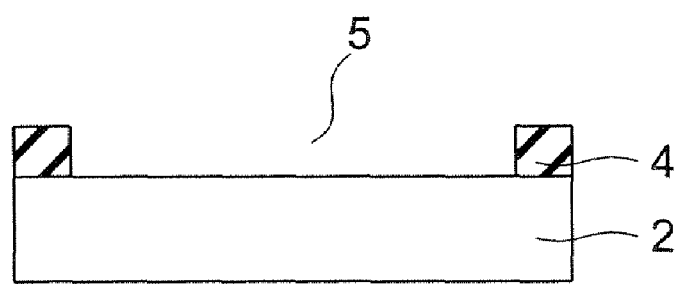
Figure 3A:
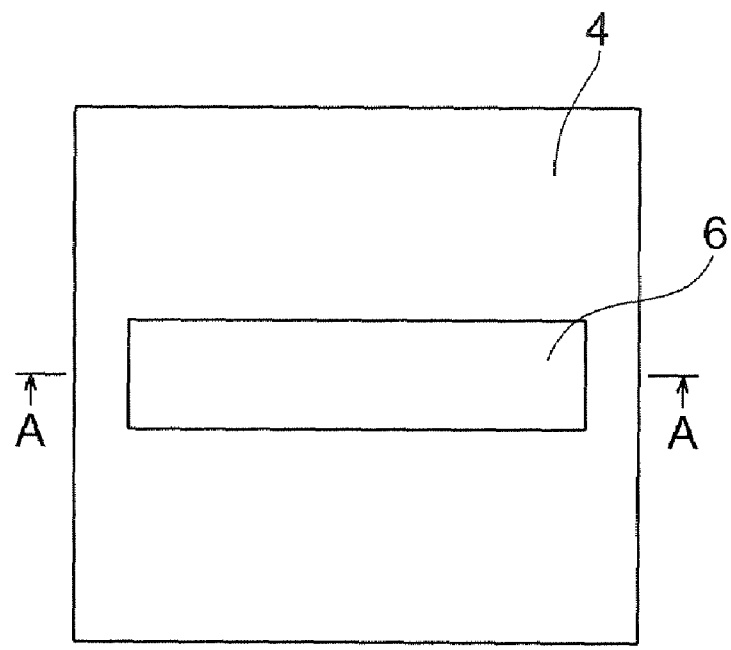
FIGS. 3A and 3B illustrate a procedure for manufacturing the switching element in accordance with the first embodiment.
Figure 3B:
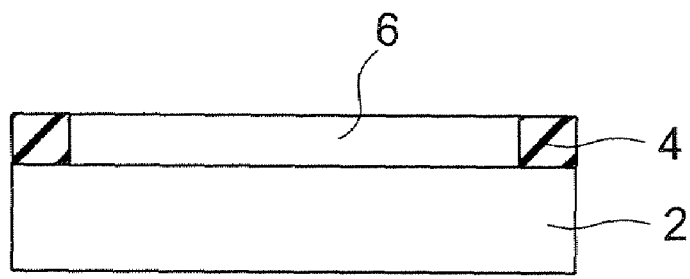

First, as shown in FIGS. 2A and 2B, the single-crystal Si substrate 2 having the device isolating region 4 formed to surround a device formation region 5 is prepared. The single-crystal Si substrate must have higher resistivity than about $10^{-1}$ Ωm so as not to short-out the electrode 6a and 6b. Alternatively, we can form insulating buffer film on low resistant silicon substrate for example silicon dioxide thin film of 10 nm in thickness by oxidizing the substrate. In this case, we can make contact between either electrode 6a or 6b to the conductive silicon substrate, and we can abbreviate corresponding either contact of 19a or 19b. (Figure was not shown.) This structure has an advantage to be applicable for a modified conventional interconnect technology. FIG. 2A is a plan view, and FIG. 2B is a cross-sectional view of the structure, taken along the line A-A of FIG. 2A. A $(V_{0.9885}Cr_{0.0115})_2O_3$ film of 5 nm in film thickness is formed as the switching portion 6 on the device formation region 5 (see FIGS. 3A and 3B). FIG. 3A is a plan view, and FIG. 3B is a cross-sectional view, taken along the line A-A of FIG. 3A.

The $(V_{0.9885}Cr_{0.0115})_2O_3$ film can be formed by sputtering, CVD (Chemical Vapor Deposition), ALD (Atomic Layer Deposition), solution application, MBE (Molecular Beam Epitaxy), or the like. The $(V_{0.9885}Cr_{0.0115})_2O_3$ film may be epitaxially formed directly on the substrate 2, or may be epitaxially formed, with a buffer film (not shown) being interposed between the substrate 2 and the $(V_{0.9885}Cr_{0.0115})_2O_3$ film. With an interfacial layer for example epitaxial $Zr_{0.91}Si_{0.09}O_2$ film of a-axis oriented to the thickness direction (not shown) being interposed, the $(V_{0.9885}Cr_{0.0115})_2O_3$ film may be formed in a highly orientated state, or a polycrystalline state, or an amorphous state. This interfacial layer may be amorphous silicon dioxide in the case of polycrystalline state or amorphous state of $(V_{0.9885}Cr_{0.0115})_2O_3$. The material, $(V_{0.9885}Cr_{0.0115})_2O_3$, used for the switching portion 6 exhibits crystal orientation dependence in electric conduction. Therefore, when this material is used as an epitaxial film, better switching characteristics are achieved to form a logic circuit or the like, but the film forming conditions should be restricted. Since the electric conduction of the $(V_{0.9885}Cr_{0.0115})_2O_3$ material does not have high crystal orientation dependence, it can be used as a polycrystalline film or an amorphous film. Although the switching characteristics of this film as a polycrystalline film or an amorphous film are not as good as those of an epitaxial film, the $(V_{0.9885}Cr_{0.0115})_2O_3$ material as a polycrystalline film or an amorphous film has a structure suitable enough for a non-volatile memory for example reliability.

The substrate 2 is not limited to a single-crystal silicon substrate, but may be a substrate made of a material other than silicon. In principle, the substrate 2 may be made of a single substance, a compound, or an organic material. Also, the substrate 2 does not have to be a single-crystal substrate, but may be a polycrystalline substrate or an amorphous substrate. For example, an amorphous $SiO_2$ substrate or an acrylic substrate can be employed in accordance with the types of possible usage. In a case where a silicon substrate is employed, an amplifier circuit such as a transistor is produced on the substrate, so as to amplify changes in resistance in the switching element. On a substrate of any other type, an amplifier circuit such as a TFT (Thin Film Transistor) can be provided closer to the substrate than to the switching element. If the substrate was conductive, insulating layer must be interposed under the $(V_{0.9885}Cr_{0.0115})_2O_3$ material of 6 and 6a and 6b.

An epitaxial film of the $V_2O_3$ group may also be formed as the switching portion 6, so as to apply in-plane tension or stress from the substrate to the film. In the case where in-plane tension or stress is applied to a film of the $V_2O_3$ group, it is effective to employ a substance with a suitable lattice constant for the substrate, instead of silicon. In such a case, without Cr addition, the $V_2O_3$ material can be switched from one of a low-resistance state (a metallic state) and a high-resistance state (an insulating state) to the other at room temperature, which is in the neighborhood of 25° C. Accordingly, the switching element can be advantageously used in a first temperature environment in which the temperature varies from 20° C. to 28° C. or a second temperature environment in which the temperature varies from 1° C. to 60° C. The stress to be applied to the switching portion 6 may not be the stress from the substrate, but may be process stress or stress from a film other than the switching portion 6. In a case where such stress is applied to the switching portion 6, the composition of the switching portion 6 may be expanded up to $(V_{1-x}Cr_x)_2O_3$ (x being in the range of 0 to 0.02), with the range of possibly applied stress in reality being taken into consideration.

In the above description, the material for the switching portion 6 is a $(V_{0.9885}Cr_{0.0115})_2O_3$ film. However, as long as "X" in "$(V_{1-x}Cr_x)_2O_3$" is in the range of 0.0097 to 0.0140, the resistance state is reversed (a change from a low-resistance state to a high-resistance state, or a change from a high-resistance state to a low-resistance state) by a temperature change of ±80° C. from the first temperature environment, as can be seen from FIG. 14 (H. Kuwamoto, J. M. Honig, J. Appel, Phys. Rev. B22, 2626, (1980)) and FIG. 69 (resistance variation range by the temperature change of ±80° C. were added for the edge compositions of x in the FIG. 14). Once reversed, the resistance state cannot be reversed even if the temperature state returns to the first temperature environment. Accordingly, the switching portion with the above described composition can be used in the first temperature environment in practice. The switching portion may be used in an environment having a temperature control mechanism to maintain the first temperature environment. Even in this composition range, it is not necessary to change the amount of titanium ion implantation from the values shown later.

Figure 14:
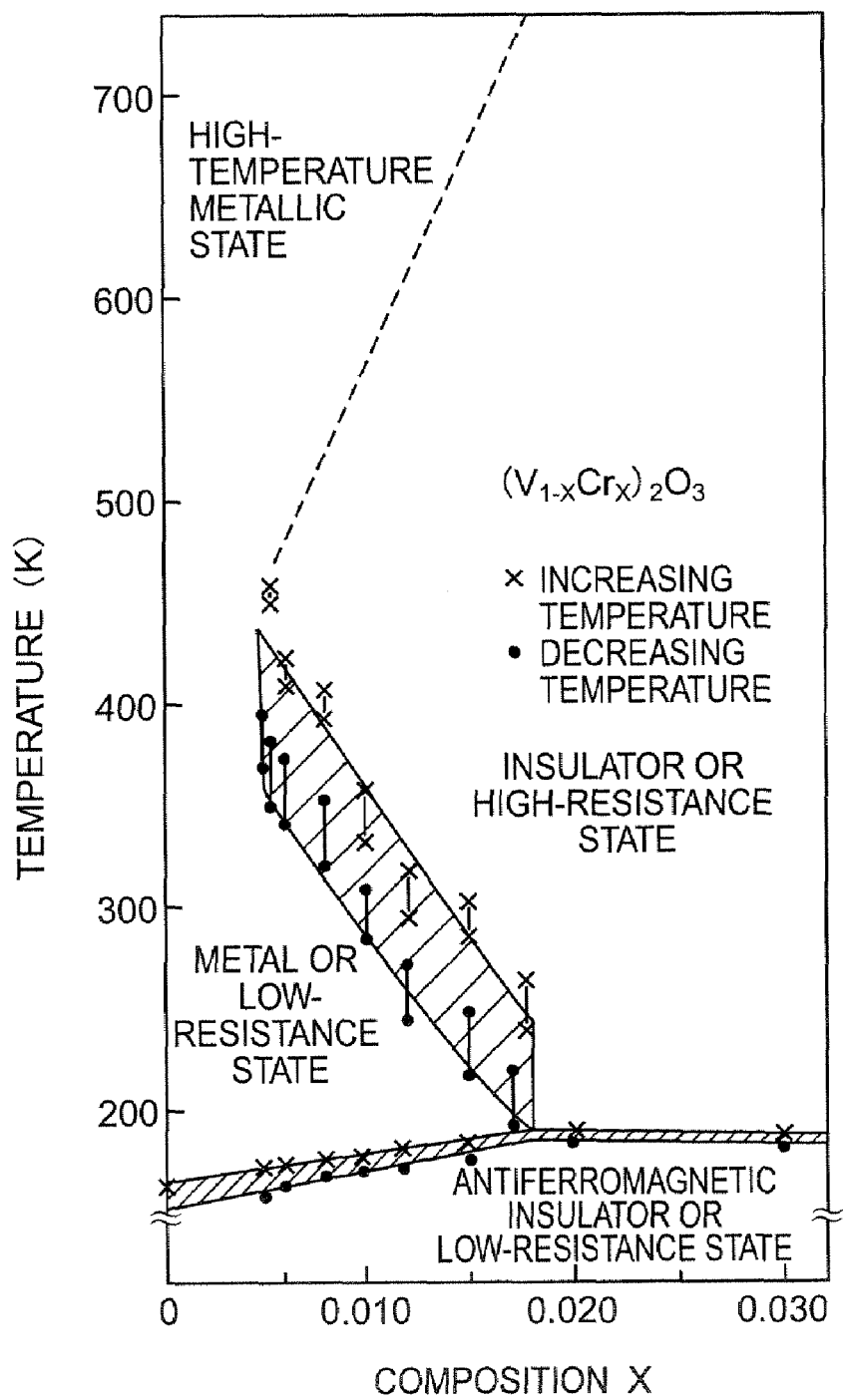
FIG. 14 is a phase diagram corresponding to the composition x of $(V_{1-x}Cr_x)_2O_3$.
Figure 68:
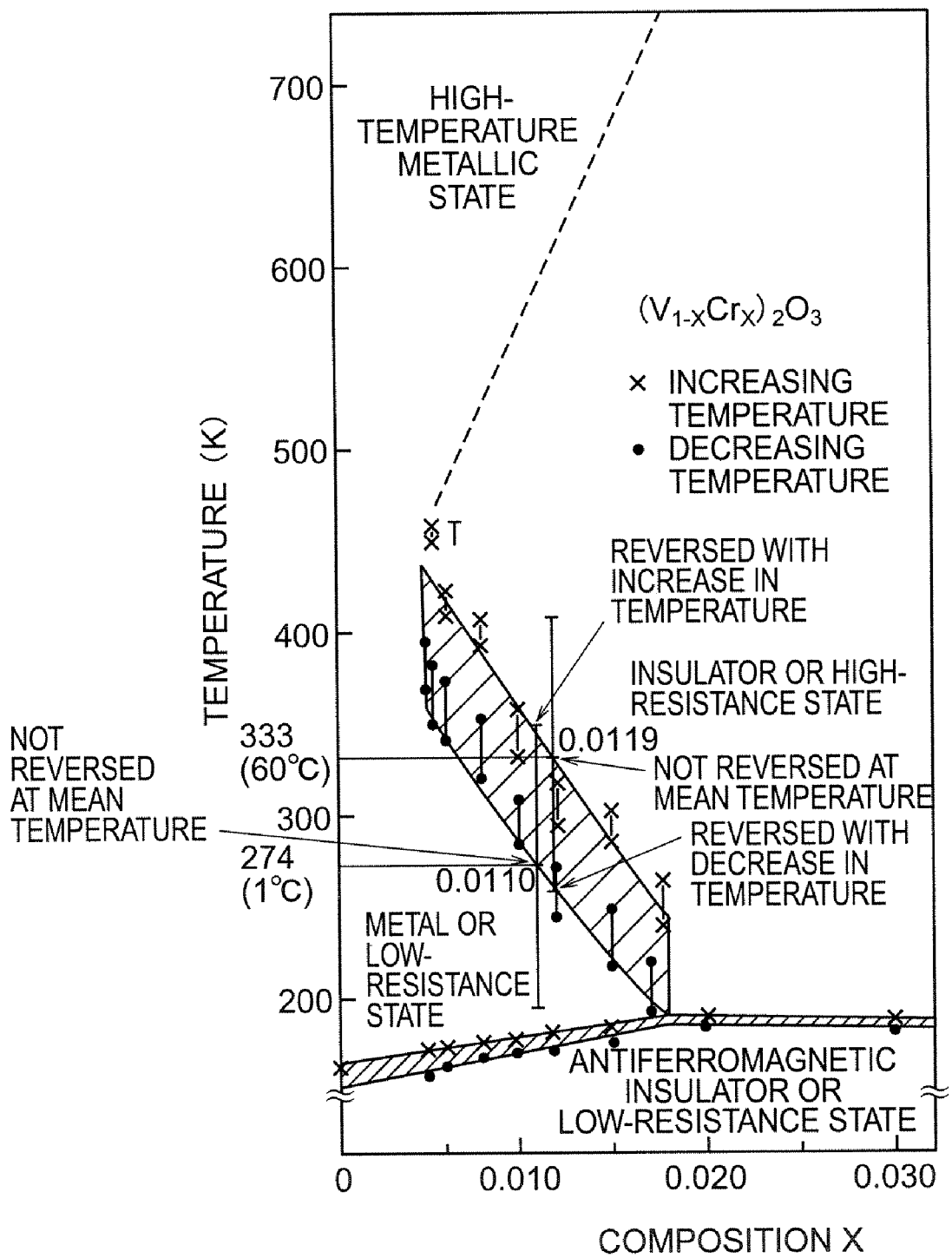
FIG. 68 shows the principle of nonvolatile operation mode within room temperature (1° C.~60° C.) environment (second temperature environment) depending on the phase diagram in FIG. 14, corresponding to the composition x of $(V_{1-x}Cr_x)_2O_3$.

Also, as long as "x" in "$(V_{1-x}Cr_x)_2O_3$" is in the range of 0.0110 to 0.0119, the resistance state is reversed by a temperature change of ±80° C. from the second temperature environment, but, once reversed, the resistance state cannot be reversed even if the temperature state returns to the second temperature environment, as can be seen from FIG. 68 (resistance variation range by the temperature change of ±80° C. were added for the edge compositions of x in the FIG. 14). Accordingly, the switching portion with the above described composition can be used in the second temperature environment in practice. The switching portion can be used in a normal outdoor environment, without active use of a temperature control mechanism. Even in this composition range, the amount of titanium ion implantation should be equivalent to the values shown later.

Figure 70:
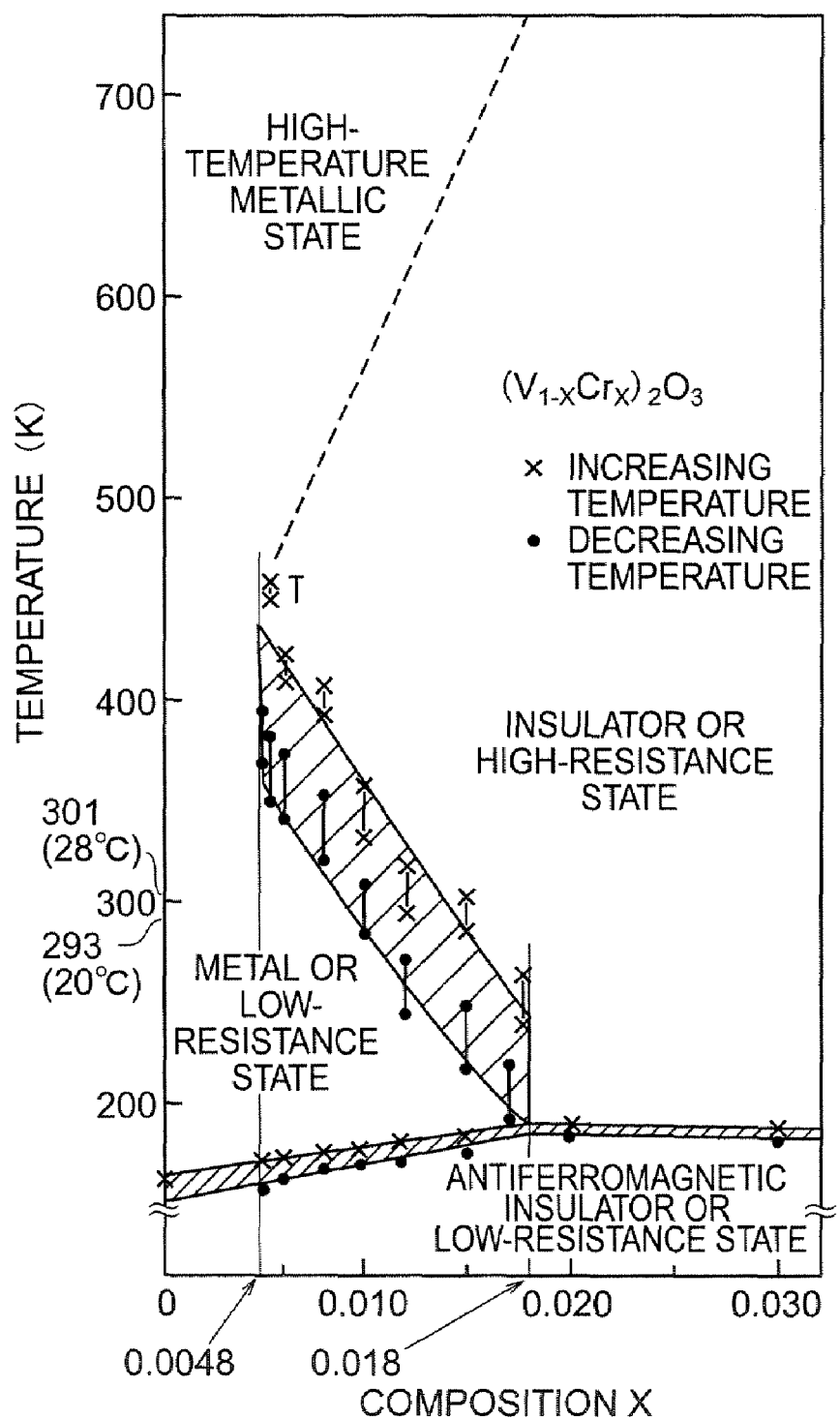
FIG. 70 shows the principle of nonvolatile operation mode at controlled temperature (T<20° C., ΔT≦4° C.) environment (third temperature environment) and other controlled temperature (T>28° C., ΔT≦4° C.) environment (fourth temperature environment) depending on the phase diagram in FIG. 14, corresponding to the composition x of $(V_{1-x}Cr_x)_2O_3$. Higher x limit for the forth temperature environment is shown in FIG. 69.

So as to use the switching portion in a third temperature environment having temperature changes of ±4° C. from a temperature less than 20° C., any suitable value in the composition range of 0 to 0.018 (0≦x≦0.018), as can be seen from FIG. 70 (the edge compositions of x were added for the third temperature environment of x≦0.018 and for the fourth temperature environment of x≧0.048 in the FIG. 14). For example, the switching element can be used in an environment in which a cooling mechanism is provided. With this composition range, a suitable amount of titanium ion implantation (described later) is essential, but the suitable amount can be readily calculated by the technique shown in FIG. 12 (D. B. McWhan, A. Menth, J. P. Remeika, W. F. Brinkman, T. M. Rice, Phys. Rev. B7, 1920 (1973)) or FIG. 14.

Figure 69:
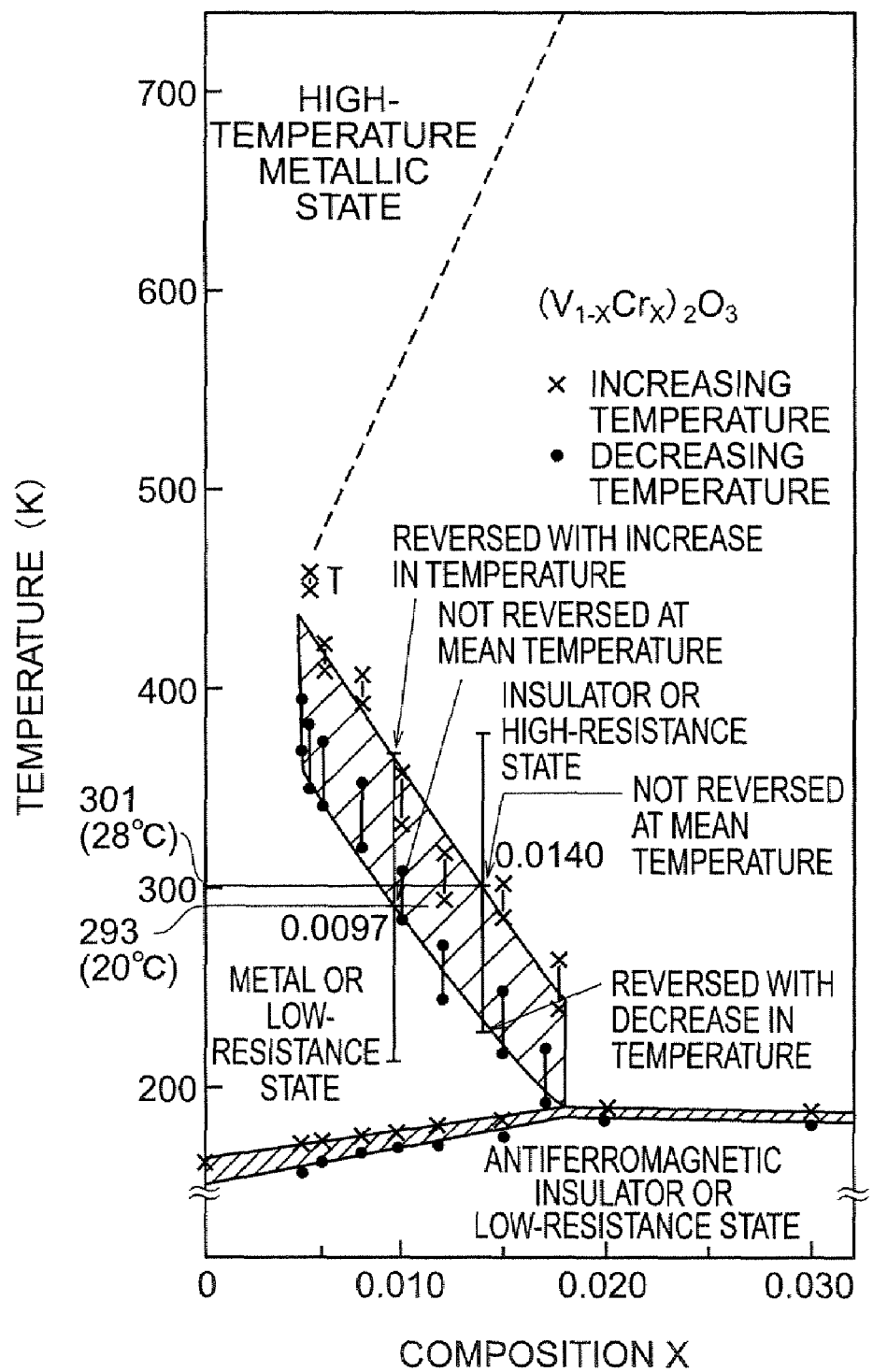
FIG. 69 shows the principle of nonvolatile operation mode at controlled temperature (20° C.~28° C.) environment (first temperature environment) and other controlled temperature (T>28° C., ΔT≦4° C.) environment (fourth temperature environment) depending on the phase diagram in FIG. 14, corresponding to the composition x of $(V_{1-x}Cr_x)_2O_3$.

So as to use the switching portion in a fourth temperature environment having temperature changes of ±4° C. from a temperature higher than 28° C., any suitable value in the composition range of 0.0048 to 0.0140 (0.0048≦x≦0.0140), as can be seen from FIG. 69 (the edge compositions of x were added for the fourth temperature environment of x≦0.0140) and 70. For example, the switching element can be used in an environment in which a temperature rise is inevitable and a decrease in cooling cost is expected. With this composition range, a suitable amount of titanium ion implantation (described later) is essential, but the suitable amount can be readily calculated by the technique shown in FIG. 12 or FIG. 14.

Figure 71:
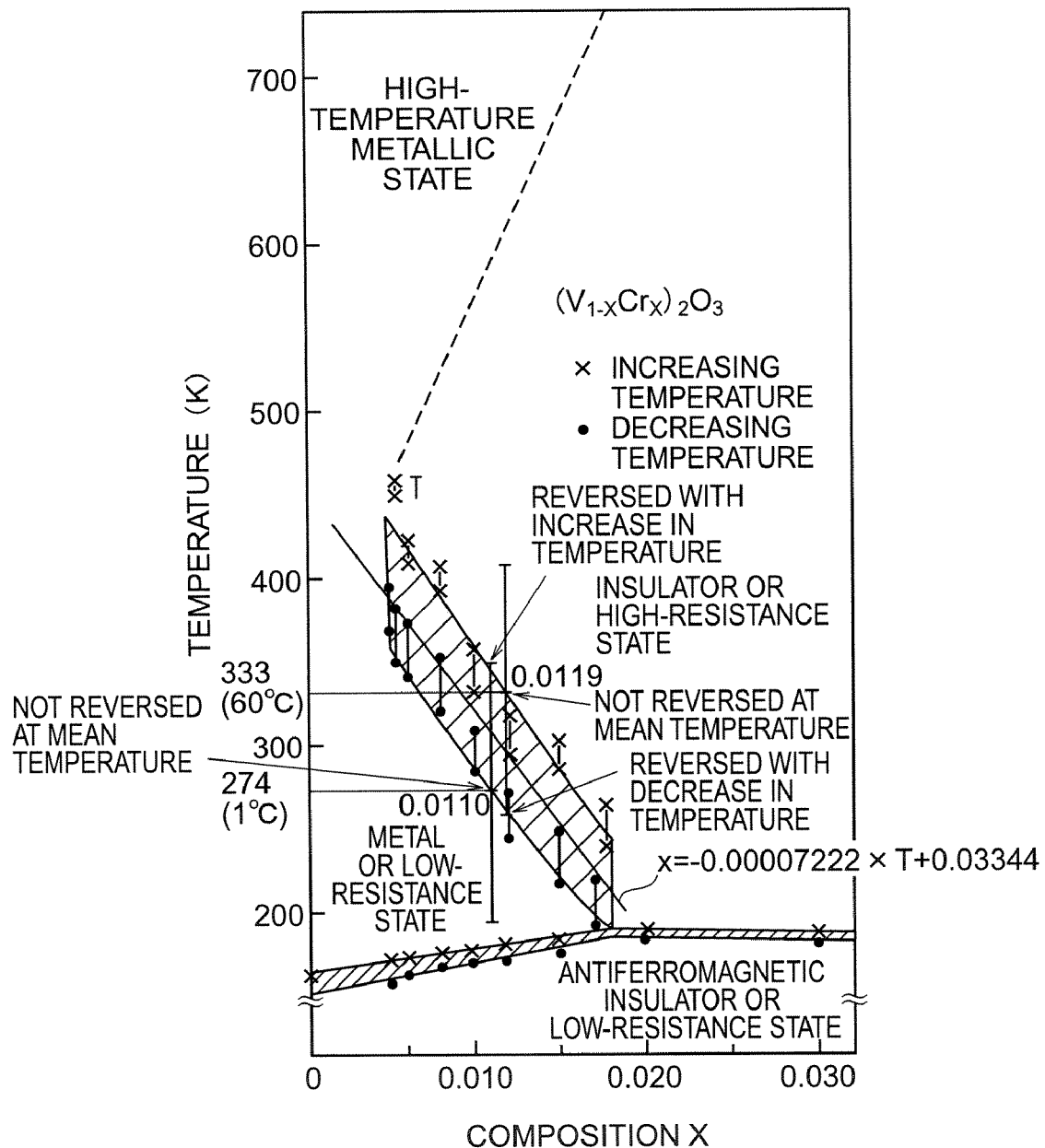
FIG. 71 shows the principle of nonvolatile operation mode at controlled temperature (173 K≦T≦403 K, ΔT≦30 K) environment (fifth temperature environment) depending on the phase diagram in FIG. 14, corresponding to the composition x of $(V_{1-x}Cr_x)_2O_3$.

In a case where the switching element is used in a fifth temperature environment in which the time mean value of temperature T is constant in the range of 173 K≦T≦403 K and the time variation in temperature T (K) is ±30 K, the composition range should be set so that the designed time mean temperature T (K) becomes $(V_{1-x}Cr_x)_2O_3$ ($-0.00007222 \times T + 0.03344 - 0.0004 \leq x \leq -0.00007222 \times T + 0.03344 + 0.0004$), as can be seen from FIG. 71 and the same technique as the composition range calculating technique in the second temperature environment. The range of the temperature T is set as 173 K≦T≦403 K, which is −100° C. to 130° C., because the switching element might be used without the active use of a temperature control mechanism such as a thermal head or only with the use of a simple temperature control mechanism for the entire element in the fifth temperature environment in which the outdoor temperature variation is very wide. With this being taken into consideration, the lowest possible time mean temperature is −100° C. in the Antarctic, and the highest possible time mean temperature is 130° C. in a greenhouse in the sun.

Although the temperature valuation ΔT is ±80 K in the first through fifth temperature environments, it should be larger than the value of the thermal hysteresis unique to the material used. In a case where a material that causes a resistance variation ten or more times wider with respect to ΔT=±80 K is employed, when the absolute value |ΔT| of ΔT is larger than 80 K, the variation in electric resistance often becomes even wider. If the absolute value |ΔT| is small, the power required for operating the element is small, but the lower limit is equivalent to the thermal hysteresis unique to the material used for the switching portion. In a case where a $V_2O_3$ material is used as described above, the thermal hysteresis is approximately 80 K, and therefore, the lower limit is 80 K. If the absolute value |ΔT| is too large, the power required for switching becomes larger, and the aging degradation of the switching element might become more conspicuous due to increasing thermal shock. Therefore, the absolute value |ΔT| cannot be made indefinitely larger. When the absolute value |ΔT| becomes larger than 270 K, which is almost the same as the value with a conventional PRAM, the most advantageous aspect of the switching element of this embodiment, which is low power consumption, is not achieved. Therefore, the upper limit of the absolute value |ΔT| in reality is 270 K. It is desirable to set the absolute value |ΔT| to a temperature close to the lower limit.

The resistance variation with respect to the above described temperature variation ΔT is ten times. A wider resistance variation is preferred, because it allows easier design of an integrated circuit. The upper limit is a variation of an actually existing substance, which might be $10^6$ times with respect to a $V_2O_3$ material at a low temperature, or $10^{15}$ times with respect to a EuO material at a low temperature. If the resistance variation is within 10 times, it becomes difficult to amplify the variation with a transistor or the like, and distinction between an ON state and an OFF state becomes difficult. Therefore, the actual upper limit is 10 times.

If the $(V_{0.9885}Cr_{0.0115})_2O_3$ film 6 is smoothened by CMP (Chemical Mechanical Polishing) or the like after the film formation, as shown in FIGS. 3A and 3B, the device forming process thereafter becomes relatively simple. However, the CMP is not essential at this stage. In this embodiment, the CMP is performed in the procedure shown in FIGS. 3A and 3B, for ease of explanation.

Figure 4A:
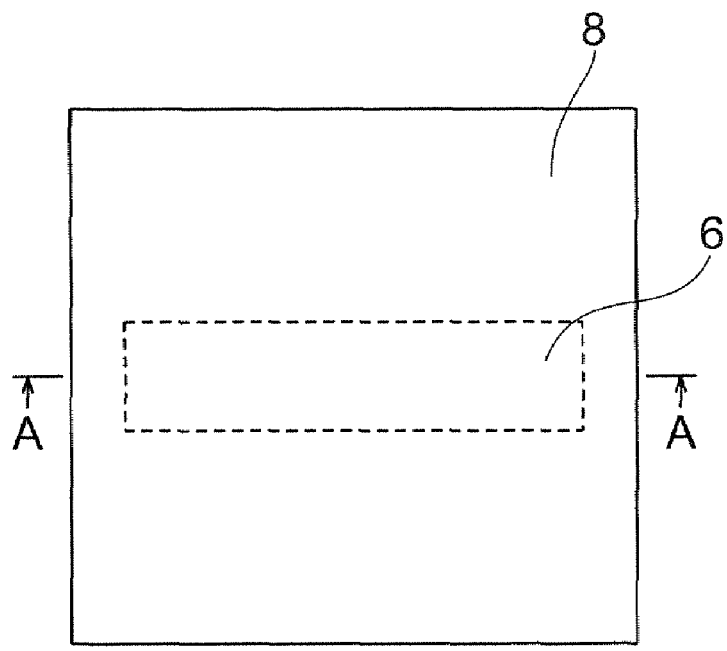
FIGS. 4A and 4B illustrate a procedure for manufacturing the switching element in accordance with the first embodiment.
Figure 4B:
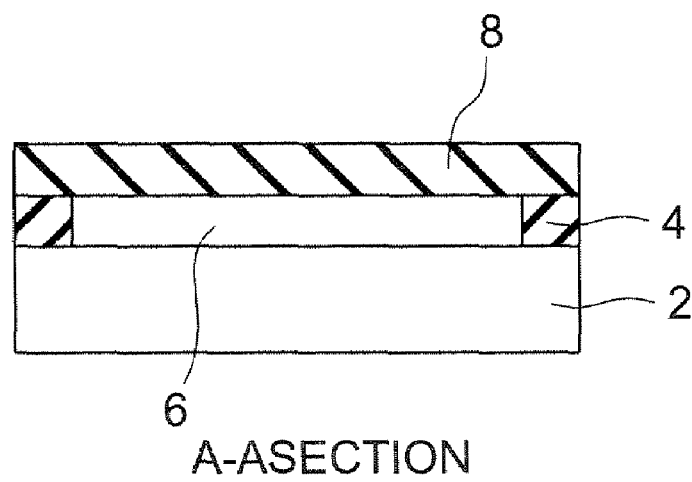

As shown in FIGS. 4A and 4B, an AlN film of 2 nm in thickness, for example, is formed as the heat conducting/electric insulating film 8 on the $(V_{0.9885}Cr_{0.0115})_2O_3$ film 6. FIG. 4A is a plan view, and FIG. 4B is a cross-sectional view, taken along the line A-A of FIG. 4A.

Figure 5A:
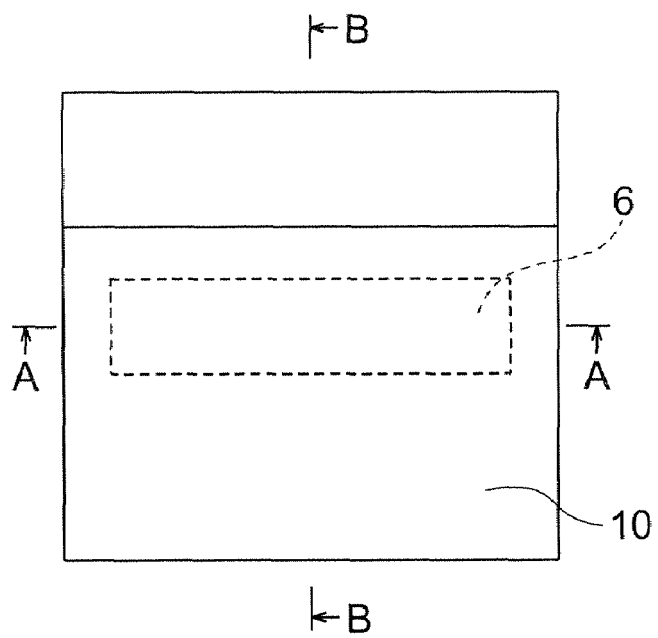
FIGS. 5A through 5C illustrate a procedure for manufacturing the switching element in accordance with the first embodiment.
Figure 5B:
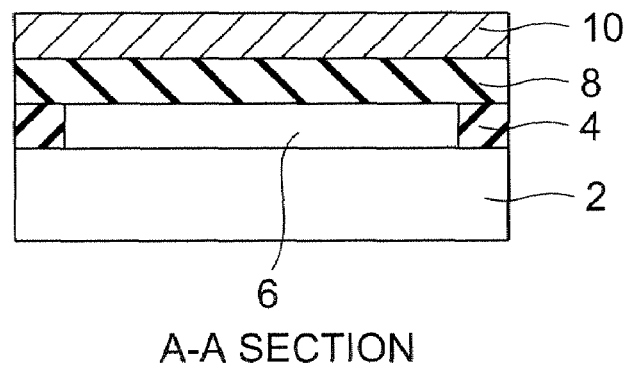
Figure 5C:
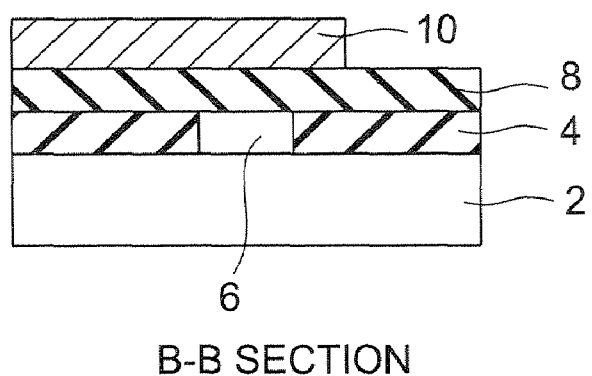

As shown in FIGS. 5A, 5B, and 5C, an n-type $Bi_2Te_3$ film (such as $(Bi_2Te_3)_{0.95}(Bi_2Se_3)_{0.05}$) of 3 nm in thickness to be the first Peltier electrode 10 of the Peltier element 13 is formed on the AlN film 8. The n-type $Bi_2Te_3$ film is patterned to form the first Peltier electrode 10. FIG. 5A is a plan view of the structure at this stage. FIG. 5B is a cross-sectional view of the structure, taken along the line A-A of FIG. 5A. FIG. 5C is a cross-sectional view of the structure, taken along the line B-B of FIG. 5A.

Figure 6A:
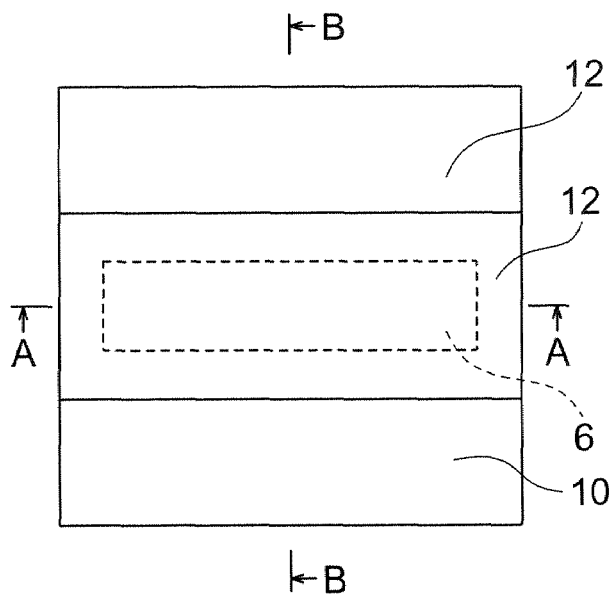
FIGS. 6A through 6C illustrate a procedure for manufacturing the switching element in accordance with the first embodiment.
Figure 6B:
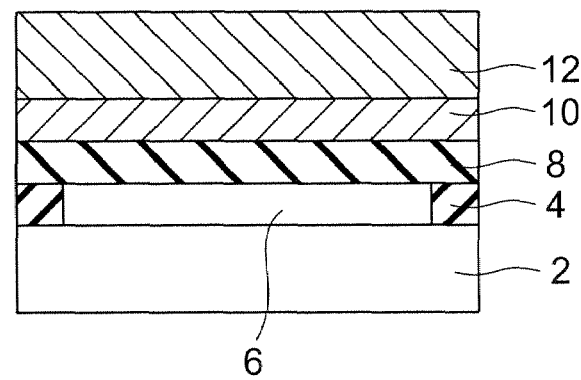
Figure 6C:
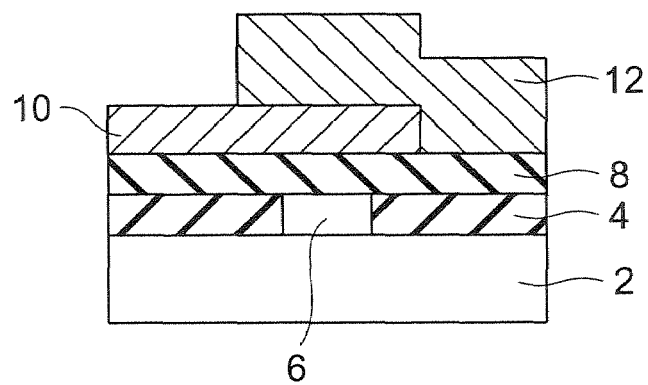

As shown in FIGS. 6A, 6B, and 6C, a p-type $Bi_2Te_3$ film (such as $(Bi_2Te_3)_{0.25}(Bi_2Se_3)_{0.75}$) of 3 nm in thickness to be the second Peltier electrode 12 is formed to cover the first Peltier electrode 10. The p-type $Bi_2Te_3$ film is patterned to form the second Peltier electrode 12. FIG. 6A is a plan view of the structure at this stage. FIG. 6B is a cross-sectional view of the structure, taken along the line A-A of FIG. 6A. FIG. 6C is a cross-sectional view of the structure, taken along the line B-B of FIG. 6A. Although the n-type $Bi_2Te_3$ film is formed first and the p-type $Bi_2Te_3$ film is then formed in this embodiment, the p-type $Bi_2Te_3$ film may be formed first. In other words, the n-type and the p-type of the Peltier electrodes may be reversed. Furthermore, in a case where switching elements having n-type Peltier electrodes 10 and p-type Peltier electrodes 12 and switching elements having p-type Peltier electrodes 10 and n-type Peltier electrodes 12 are alternatively arranged, the wirings can be simplified, and the interference between each two neighboring switching elements can be reduced.

In the above description, the switching element is to be used in the first or second temperature environment, and therefore, a $Bi_2Te_3$ material that can achieve the highest performance index in either the first or second temperature environment is employed for the Peltier electrodes. However, in a case where the switching element is to be used in the third temperature environment or the fifth temperature environment, the material for the Peltier electrodes should be selected in accordance with the temperature. The temperature at which the performance index of a Peltier electrode becomes high is well known. In this embodiment, the material for the Peltier electrodes can be replaced with the material used in the third temperature environment, without causing any inconvenience in principle. In a case where the switching element is used in the fourth temperature environment or the fifth temperature environment, the performance index of the above described $Bi_2Te_3$ material is suitable within a temperature range in which the material known to be for the switching portion to this date can be can be put into operation. However, any other Peltier electrode material showing a high performance index at high temperatures as disclosed in known documents may be selected.

Figure 7A:
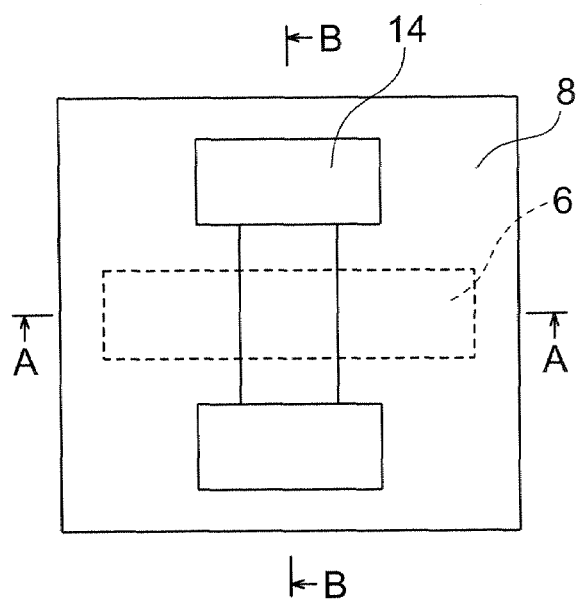
FIGS. 7A through 7C illustrate a procedure for manufacturing the switching element in accordance with the first embodiment.
Figure 7B:
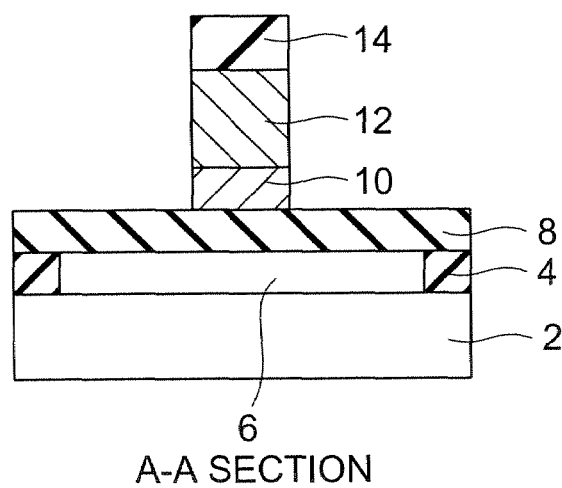
Figure 7C:
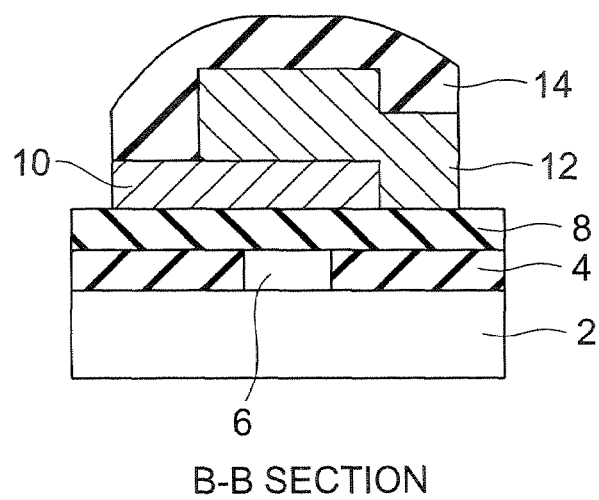

Next, a mask pattern 14 is formed on the first and second Peltier electrodes 10 and 12, and patterning is performed on the first and second Peltier electrodes 10 and 12, with the mask pattern 14 serving as a mask (see FIGS. 7A, 7B, and 7C). FIG. 7A is a plan view of the structure at this stage. FIG. 7B is a cross-sectional view of the structure, taken along the line A-A of FIG. 7A. FIG. 7C is a cross-sectional view of the structure, taken along the line B-B of FIG. 7A.

Figure 8A:
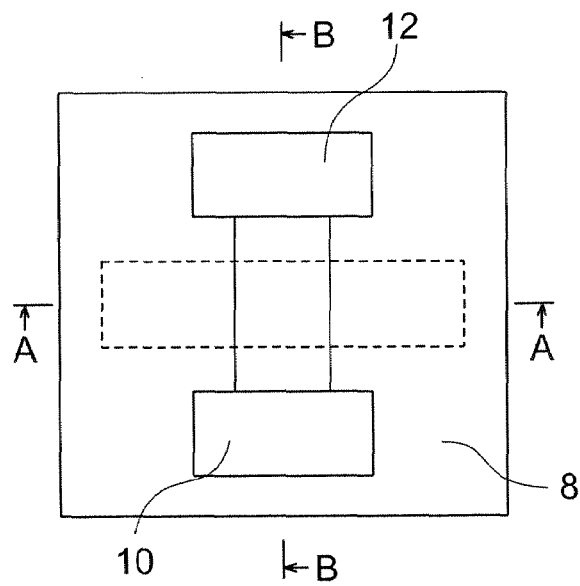
FIGS. 8A through 8C illustrate a procedure for manufacturing the switching element in accordance with the first embodiment.
Figure 8B:
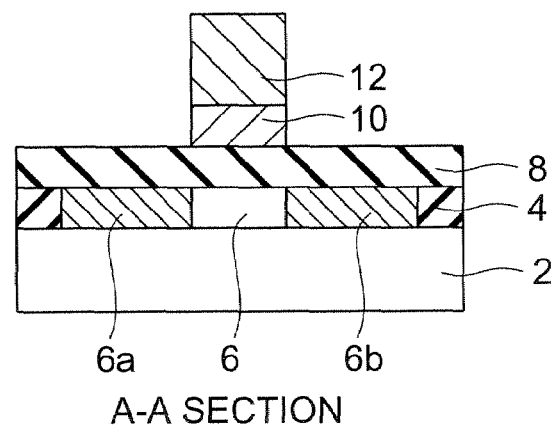
Figure 8C:
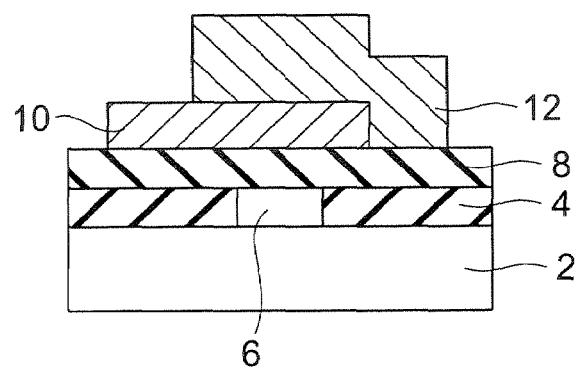

Next, titanium ion implantation using the mask pattern is performed so as to inject titanium ions into the portion of the $(V_{0.9885}Cr_{0.0115})_2O_3$ film not covered with the mask pattern 14 and form the electrodes 6a and 6b made of $(V_{0.9385}Cr_{0.0115}Ti_{0.05})_2O_3$, for example (see FIGS. 8A, 8B, and 8C). Although the thin heat conducting/electric insulating film 8 exists on the $(V_{0.9885}Cr_{0.0115})_2O_3$ film, ion implantation having the titanium concentration peak in the $(V_{0.9885}Cr_{0.0115})_2O_3$ film below the thin heat conducting/electric insulating film 8 is performed, as long as the ion implantation energy is normal keV. After the ion implantation, the mask pattern 14 is removed. FIG. 8A is a plan view of the structure at this stage. FIG. 8B is a cross-sectional view of the structure, taken along the line A-A of FIG. 8A. FIG. 8C is a cross-sectional view of the structure, taken along the line B-B of FIG. 8A.

Figure 1B:
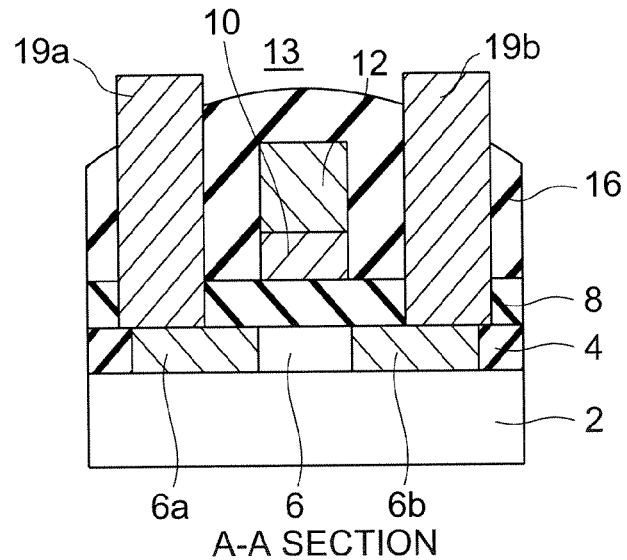
Figure 1C:
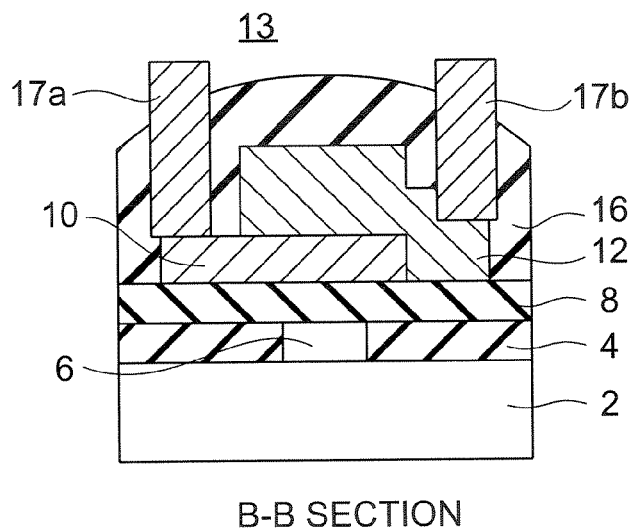

To facilitate the alloying of the titanium-injected $(V_{0.9385}Cr_{0.015}Ti_{0.05})_2O_3$ films 6a and 6b, 30-second annealing is performed at 1000° C. The annealing atmosphere of oxygen concentration must be suitably controlled so as not to be oxygen deficient nor include excess oxygen. The interlayer insulating film 16 is then formed as shown in FIGS. 1A, 1B, and 1C, and openings are formed in the interlayer insulating film 16. The openings are filled with a metal material, for example, so as to form the contacts 17a, 17b, 19a, and 19b. Thus, the switching element 1 is completed.

Figure 9:
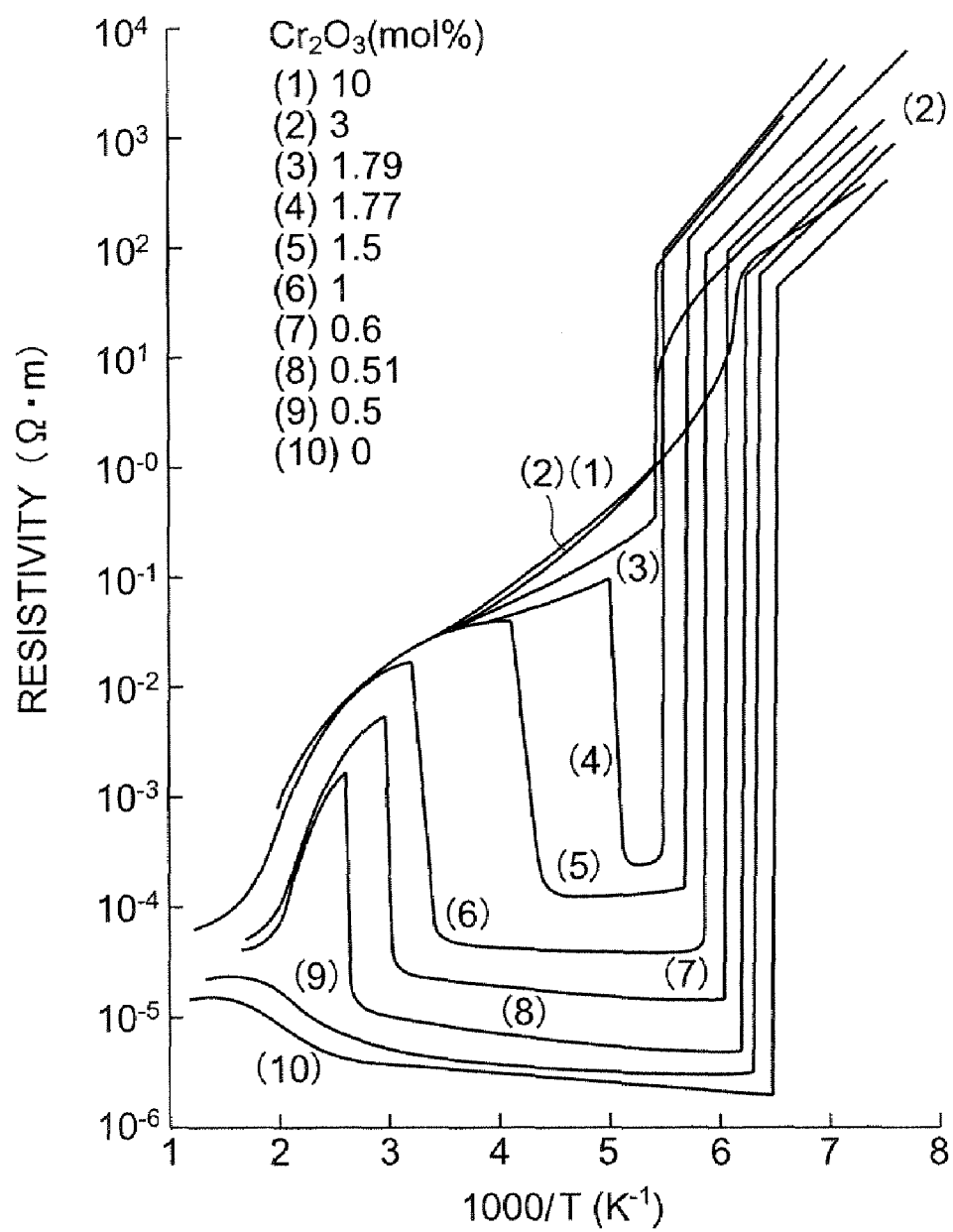
FIG. 9 illustrates a variation in resistivity of $(V_{1-x}Cr_x)_2O_3$ with changes in temperature.

FIG. 9 is a graph showing the temperature variation in the electric resistivity of the $V_2O_3$ material $((V_{1-x}Cr_x)_2O_3)$ used for the switching portion 6 of the switching element 1 in accordance with this embodiment, with the Cr composition x being the parameter (H. Kuwamoto, J. M. Honig, J. Appel, Phys. Rev. B22, 2626, (1980)). The electric resistivity indicated by the ordinate axis of the graph in FIG. 9 is the measurement value of $(V_{1-x}Cr_x)_2O_3$ in the direction of c-axis, and the measurement was carried out while the temperature is being lowered. As can be seen from FIG. 9, $(V_{0.99}Cr_{0.01})_2O_3$, which is a material that contains approximately 1 mol % of Cr, exhibits a hundreds-fold increase in the electric resistance at room temperature, which is approximately 25° C. Accordingly, if a temperature change of 80° C. is caused at approximately 25° C., the electric resistance becomes hundreds of times larger.

Figure 10:
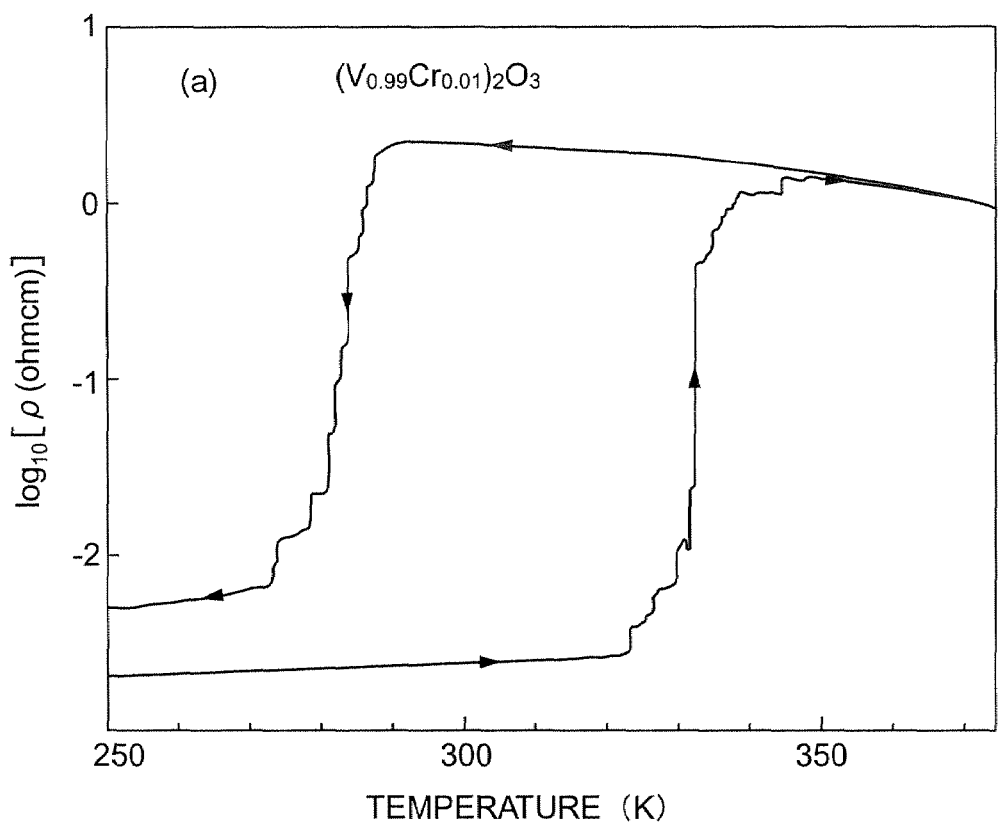
FIG. 10 shows the hysteresis of the resistivity of $(V_{0.99}Cr_{0.01})_2O_3$ relative to changes in temperature.

FIG. 10 shows the hysteresis curve of the electric resistivity of the material $(V_{0.99}Cr_{0.01})_2O_3$ (H. Kuwamoto, J. M. Honig, J. Appel, Phys. Rev. B22, 2626, (1980)). The material $(V_{0.99}Cr_{0.01})_2O_3$ is in a high-resistance state at a temperature approximately 40 K higher than room temperature, which is approximately 298 K. The material is in a low-resistance state at a temperature approximately 30 K lower than room temperature. Accordingly, there should be the hysteresis in between. In the following, calculations are made, with the variation in resistance being in the range of 1 Ωcm to $10^{-2}$ Ωcm, a margin included. Therefore the temperature variation must be equal or larger than about 80 K including artificial margin of 10 K.

In a case where the switching portion 6 is 10 nm in film thickness, 100 nm in length, and 10 nm in width, with margins included, the resistance in the length direction varies in the range of 10 Ω to 1 kΩ. The above 10-fold resistance variation rate is much smaller than a variation rate of $10^6$ achieved with a silicon transistor, for example. However, operations with the above variation rate were confirmed in an OUM memory, for example, and the above variation rate should be sufficient for practical use.

Since the switching portion 6 is $10^4$ nm$^3$ in volume and approximately 10 g/cm$^3$ in density, the mass should be estimated as $10^{-16}$ g. With the specific heat being 1.5 J/gK, the heat quantity required for causing a temperature change of 80° C. is approximately $2 \times 10^{-13}$ J.

The material $Bi_2Te_3$ for the Peltier electrodes 10 and 12 of the Peltier element 13 is approximately $2 \times 10^{-4}$ V/K in Seebeck coefficient, approximately $10^3$ $\Omega^{-1}$cm$^{-1}$ in electric conductivity (the inverse of resistivity), approximately 0.02 W/cmK in heat conductivity, and approximately 0.6 in dimensionless performance index, which is on a conservative estimate. Here, a thermal electromotive force of approximately 230 μV/K is achieved with the p-type $Bi_2Te_3$ material, while a thermal electromotive force of approximately −170 μV/K is achieved with the n-type $Bi_2Te_3$ material. When the quantity of heat absorbed at the cold side of the Peltier element 13 is estimated, a calculation is performed, with the electrode resistance being 600 Ω, and the maximum heat absorption current being $10^{-4}$ Ampere. Since the maximum temperature difference is 90 K, a change of 50 K should be enough for achieving a temperature change beyond the above described hysteresis range in FIG. 10, and there is a margin enough for operations. In this embodiment, the switching element 1 is designed to have power consumption and operation speed required for a temperature change of ±80° C. from room temperature, which is approximately 25° C. As will be described later, the switching element 1 of this embodiment can be used as a normally-on element or a normally-off element.

In a case where switching elements 1 are used as normally-on elements and normally-off elements, the necessary power consumption and operation speed for a temperature change of 80° C. are set to have margins. However, in a case where normally-on elements and normally-off elements are not mounted at the same time, a temperature change as small as 50 K might be sufficient. Accordingly, the structure for operations set in this embodiment is designed to have margins.

The above described estimates are the estimates made at the cold side of the Peltier element 13. At the hot side of the Peltier element 13, it is apparent that the same performance as above can be achieved with lower electric power than at the cold side, since the Joule heat in the Peltier electrodes 10 and 12 is added. In the actual device of the element, the composition of the switching element is set so that the operating environment temperature is lower than the mid value of the hysteresis range, rather than becoming equal to the mid value of the hysteresis range, to utilize the characteristics of the Peltier element 13 with higher efficiency.

The heat conductivity of AlN, which is the material of the heat conducting/electric insulating film 8 isolating the switching portion 6 from the Peltier element 13, is 250 W/mK, with a margin being allowed Accordingly, if the film thickness is made 10 nm, with a margin being allowed, the speed at which the heat amount of $2 \times 10^{-13}$ J moves is calculated to be 7 nsec, which does not affect the switching speed.

Figure 11:
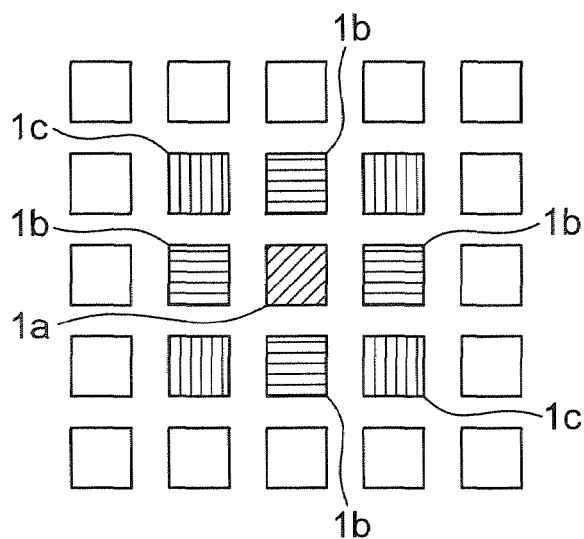
FIG. 11 shows an example for preventing interference between cells at the time of writing in a case where the integrated circuit of the first embodiment is used as a memory.

As shown in FIG. 11, in the integrated circuit in accordance with this embodiment, when a current to generate such a heat quantity as to cause a temperature rise of 80° C. in a single component (a write signal) is applied to a cell 1a for writing information, a current of the opposite sign to generate such a heat quantity as to cause a temperature decrease of 40 K in a single component (an interference suppression signal) may be applied to each cell 1b adjacent to the cell 1a in the longitudinal and transverse directions, and a current of the opposite sign to generate such a heat quantity as to cause a temperature decrease of 20 K (an interference suppression signal) in a single component may be applied to each cell 1c adjacent to the cell 1a in the oblique directions. FIG. 11 is a plan view of the integrated circuit of this embodiment, and the integrated circuit has cells arranged in an array. Although the writing is realized by a temperature rise in the above described example case, it may be realized by a temperature decrease. In such a case, it is necessary to apply such a current as to cause a temperature rise in each single component to each adjacent cell.

By supplying the above interference suppression signal to each adjacent cell at the time of writing, the temperature change in each adjacent cell can be maintained the range of 20 K or less. In this manner, the already written information can be kept, and interference between cells can be suppressed. Further, a lower current (an interference suppression signal) may be applied to the cells in the neighborhood, so as to further suppress the interference between the cells.

While the write current is calculated to be 0.1 mA in the above described example case, a write current of 10 mA is required in a MRAM, and 1 mA is required in an OUM, for example. Accordingly, the write current in this embodiment is advantageously lower. The resistance variations with temperature are the same as in an OUM. In an OUM, however, the switching material is melted to cause a phase transition, resulting in a resistance variation. Therefore, the temperature change caused in the switching material is as large as 270 K.

In this embodiment, on the other hand, the temperature change to be caused in the switching portion 6 is as small as 80 K, which is sufficient. The benefit brought out by the difference in write current mainly depends on this aspect of this embodiment. Infrared picture elements are already known for the fine processing of the switching portion, and have been actually used. Accordingly, there is no difficulty in principle in the fine processing in the integrated circuit in accordance with this embodiment, which can be actually produced.

As described above, the integrated circuit of this embodiment can be used as a non-volatile memory. In this case, as the size of each component is smaller than the above described value, the heat capacity can be further reduced. Accordingly, a higher switching speed can be achieved with less power. Also, interference between cells at the time of writing can be restrained by supplying such an interference suppression signal as to cancel the temperature changes of the adjacent cells. Accordingly, the integrated circuit of this embodiment used as a non-volatile memory is more advantageous in terms of size than a non-volatile memory operating on the conventional operating principles, and higher integration can be achieved.

As described above, this embodiment can provide a non-volatile switching element that can operate at a high speed and can be integrated, and an integrated circuit including such non-volatile switching elements.

In this embodiment and the later described modifications of this embodiment, as well as the other embodiments of the present invention, the switching portion 6 should preferably be made of a material that causes a 10-fold or larger change in electric resistivity with a temperature change of $\pm 80$ K from a certain temperature (the first temperature environment, the second temperature environment, the third temperature environment, the fourth temperature environment, or the fifth temperature environment in this embodiment).

As shown in FIGS. 9 and 10, a $V_2O_3$ material such as $(V_{0.9885}Cr_{0.0115})_2O_3$ can obtain a value 100 to 1000 times larger as a change in electric resistivity, when given a temperature change of $\pm 80$ K in the first temperature environment, the second temperature environment, or the fifth temperature environment. As can be seen from FIG. 9, a $V_2O_3$ material can obtain a value $10^4$ to $10^7$ times larger as a change in electric resistivity, when given a temperature change of $\pm 80$ K in the third temperature environment or the fourth temperature environment. We estimated for a nonvolatile memory circuit that the variation of resistivity is enough with only about 10 times.

(Modification 1)

In the integrated circuit of this embodiment, there may be many cells that perform only temperature rising operations or only temperature decreasing operations, depending on the characteristics of information to be written. To cope with such a situation, bias power may be supplied to the Peltier element in each cell, so that the entire integrated circuit of this embodiment is returned to the original temperature of the operation environment. In this case, the write signal is superimposed on the bias power.

Also, the temperature in the environment in which the integrated circuit of this embodiment is actually located might be higher or lower than the original temperature of the operation environment. In such a case, bias power may be supplied to the Peltier element in each cell, so that the entire integrated circuit of this embodiment is returned to the original temperature of the operation environment. As in the above described case, the write signal is superimposed on the bias power.

(Modification 2)

In the integrated circuit of this embodiment, a temperature control device (such as a thermal head) for heating or cooling the entire integrated circuit can be effectively employed. With the combined use of the temperature control device and the bias power to each cell as described in Modification 1, finer temperature control can be performed. In the first temperature environment, the third temperature environment, and the fourth temperature environment, it is desirable to provide a temperature control device such as a thermal head for all the elements. In the second temperature environment and the fifth temperature environment, it is desirable to provide a simple temperature control device for all the elements.

(Modification 3)

In a case where the integrated circuit of this embodiment is used in a cold environment with a temperature variation of $\pm 30°$ C., with $-10°$ C. (T=263.15 K) being the mid value, which is an example of the fifth temperature environment, the composition of the material $(V_{0.9885}Cr_{0.0115})_2O_3$ for the switching portion 6 may be changed to $(V_{0.98556}Cr_{0.01444})_2O_3$, which is $(V_{1-x}Cr_x)_2O_3$ (x=$-0.00007222 \times T+0.03344$, or x=0.01444). As shown in FIG. 71, when the chromium amount x increases approximately 0.3%, the boundary temperature between the low-resistance state and the high-resistance state drops by approximately 35° C., as can be calculated from the graph shown in FIG. 71, or as can be calculated by the equation: x=0.003=$-0.00007222 \times T+0.03344$. Accordingly, this composition is more beneficial in the case where the integrated circuit is used in such a temperature environment as in this modification.

In a case where the integrated circuit of this embodiment is used in a hot environment with a temperature variation of $\pm 30°$ C., with $50°$ C. (T=323.15 K) being the mid value, which is another example of the fifth temperature environment, the composition of the material $(V_{0.9885}Cr_{0.0115})_2O_3$ for the switching portion 6 may be changed to $(V_{0.9899}Cr_{0.0101})_2O_3$, as calculated from the same graph or the same equation as above. This composition is beneficial in the case where the integrated circuit is used in an environment where the boundary temperature between the low-resistance state and the high-resistance state is approximately 323 K, which is approximately 50° C., increased by approximately 25° C.

When the composition of the material for the switching portion 6 is adjusted in this manner, the temperature at which the electric resistivity varies becomes lower. Accordingly, the temperature control load described in Modification 1 and Modification 2 becomes advantageously smaller.

(Modification 4)

In the integrated circuit of this embodiment, each Peltier element may be replaced with a heater, and cooling may be performed by a temperature control device provided outside the integrated circuit. With this arrangement, the device structure can be advantageously simplified.

(Modification 5)

Figure 72:
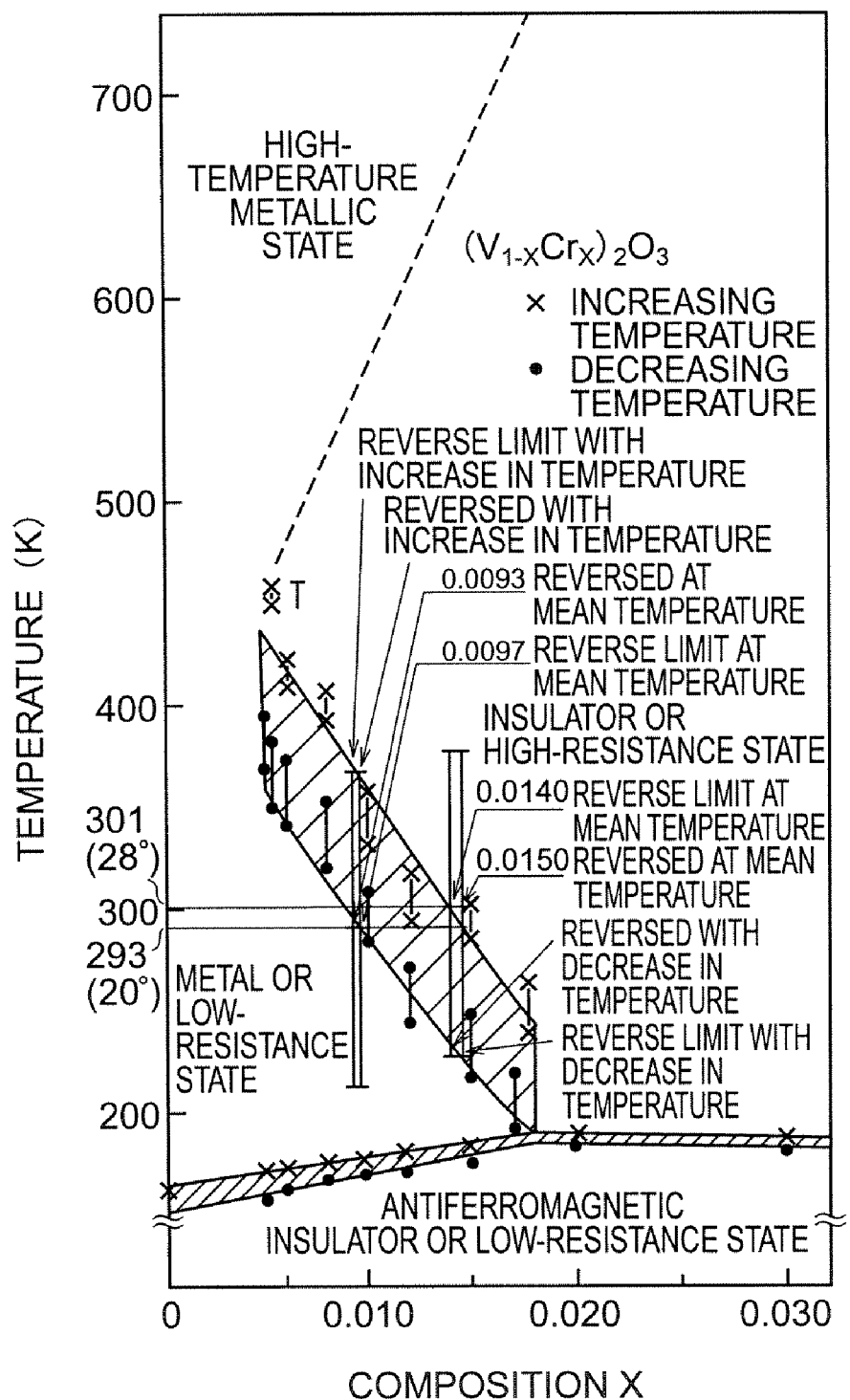
FIG. 72 shows the principle of 'normally on' and 'normally off' operation mode at controlled temperature (20° C.~28° C.) environment (first temperature environment) depending on the phase diagram in FIG. 14, corresponding to the composition x of $(V_{1-x}Cr_x)_2O_3$.

In a case where the material having the composition of $(V_{0.9906}Cr_{0.0094})_2O_3$ is used as the switching portion 6 of the integrated circuit of this embodiment in the first temperature environment, the switching portion 6 is in the low-resistance state in the first temperature environment, but switches to the high-resistance state when the temperature is increased 80° C. from the first temperature environment (see FIG. 72). When returned to the first temperature environment, the switching portion 6 switches back to the low-resistance state and is put into a switched-on state. Such an element is put into a switched-off state when heated by the Peltier element 13 or the like, and switches back to a switched-on state when the power supply to the Peltier element 13 is stopped. In this manner, a normally-on element is realized. The composition of such a switching material may be $(V_{1-x}Cr_x)_2O_3$ ($0.0093 \leq x < 0.0097$), for example.

In this modification, the benefit gained from replacing each Peltier element with a heater as described in Modification 4 is greater.

In this modification, the use of a $BaTiO_3$ material with a smaller thermal hysteresis, instead of a $V_2O_3$ material with a larger thermal hysteresis, is advantageous in that the temperature change required for switching the resistance states can be smaller than 80° C. The composition of the $BaTiO_3$ material may be $Ba_{0.0969}Sr_{0.030}Ce_{0.001}TiO_3$, for example. In a case where the $BaTiO_3$ material is $Ba_{0.999-x}Sr_xCe_{0.001}TiO_3$ ($0 \leq x \leq 0.4$), a 100- to 3000-fold change in resistance can be achieved by causing a temperature change of ±80 K in the first temperature environment, the second temperature environment, or the fourth temperature environment, as can be seen from FIG. 27.

(Modification 6)

Figure 23:
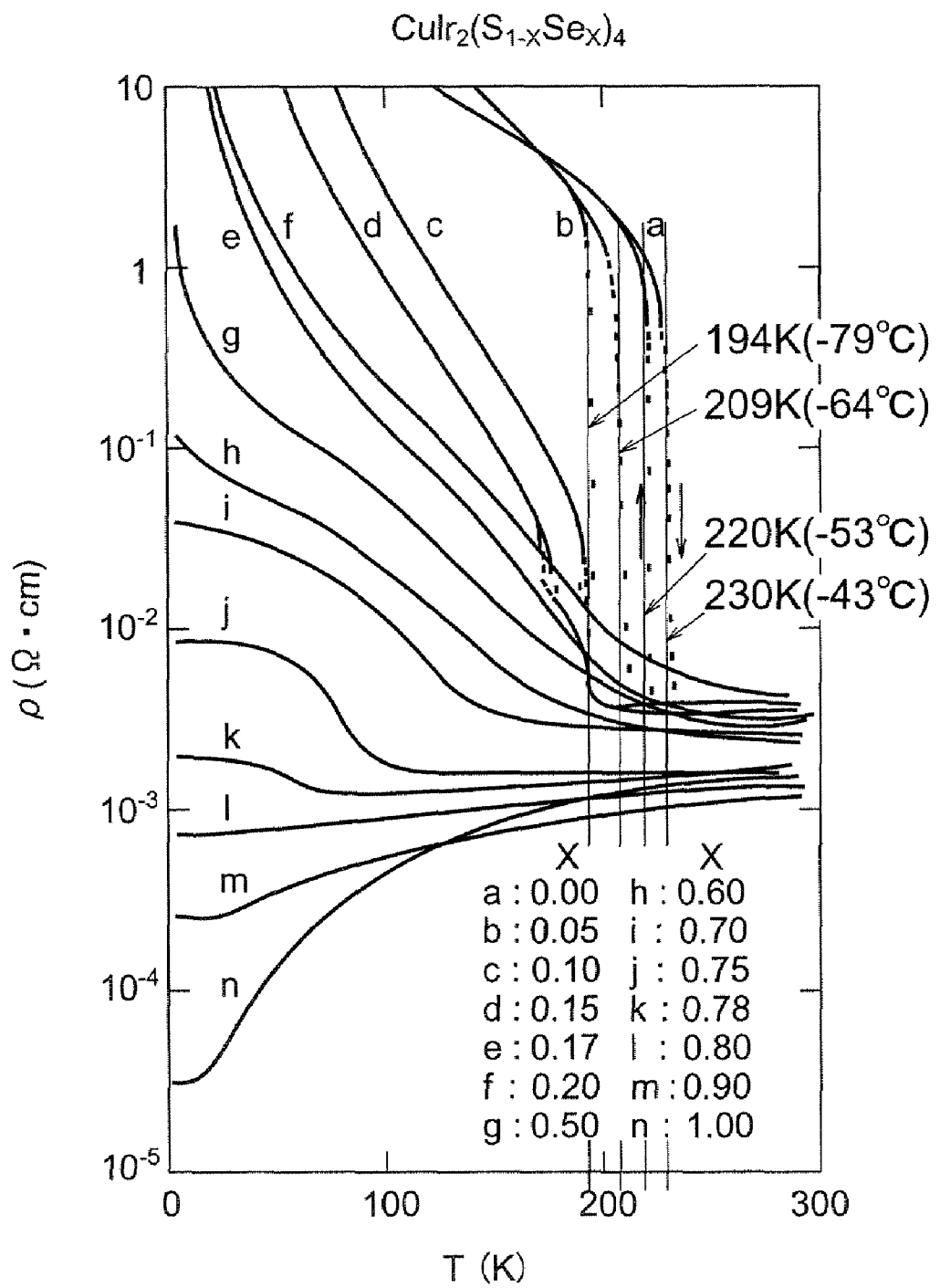
FIG. 23 shows a variation in resistivity of $CuIr_2(S_{1-x}Se_x)_4$ with changes in temperature.

In a case where a switching material having the composition of $(V_{0.9854}Cr_{0.0146})_2O_3$ is used as the switching portion 6 of this embodiment in the first temperature environment, the switching portion 6 is in the high-resistance state in the first temperature environment, but switches to the low-resistance state when the temperature is lowered 80° C. from the first temperature environment (see FIG. 23). When returned to the first temperature environment, the switching portion 6 switches back to the high-resistance state and is put into a switched-off state. Such an element is put into a switched-on state when cooled by the Peltier element 13 or the like, and switches back to a switched-off state when the power supply to the Peltier element 13 is stopped. In this manner, a normally-off element is realized. The composition of such a switching material may be $(V_{1-x}Cr_x)_2O_3$ ($0.0140 \leq x \leq 0.0150$) or $BaCo_{0.9}Ni_{0.1}S_{2-x}$ (x=0.15), for example. In the case of $BaCo_{0.9}Ni_{0.1}S_{2-x}$ (x=0.15), a 200-fold change in resistance can be achieved by causing a temperature change of 80 K, as can be seen from FIG. 24.

(Modification 6-1)

In a case where a switching material having the composition of $CuIr_2S_4$ is used as the switching portion 6 of this embodiment in the first temperature environment, the switching portion 6 is in the low-resistance state in the first temperature environment, but switches to the high-resistance state when the temperature is lowered 80° C. from the first temperature environment (see FIG. 23). When returned to the first temperature environment, the switching portion 6 switches back to the low-resistance state and is put into a switched-on state. Such an element is put into a switched-off state when cooled by the Peltier element 13 or the like, and switches back to a switched-on state when the power supply to the Peltier element 13 is stopped. In this manner, a normally-on element is realized. The composition of such a switching material may be $WO_{3.0}$, for example. In the case of $CuIr_2(S_{1-x}Se_x)_4$ ($0.00 \leq x \leq 0.05$), a 100-fold resistance change can be achieved by causing a temperature change of 80 K, as can be seen from FIG. 23. In the case of $WO_{3.0}$, a 100-fold resistance change can be achieved by causing a temperature change of 80 K, as can be seen from FIG. 22.

(Modification 7)

In any of the integrated circuits of this embodiment and Modifications 1 through 6-1, an amorphous $SiO_2$ substrate with low heat conductivity may be employed, instead of a Si substrate. In such a case, the heat quantity generated by the Peltier element 13 can be efficiently utilized.

Second Embodiment

Figure 13A:
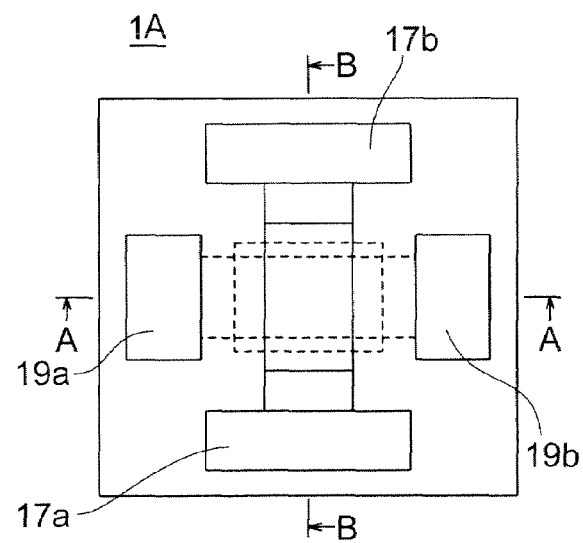
FIGS. 13A through 13C illustrate a switching element in accordance with a second embodiment of the present invention.
Figure 13B:
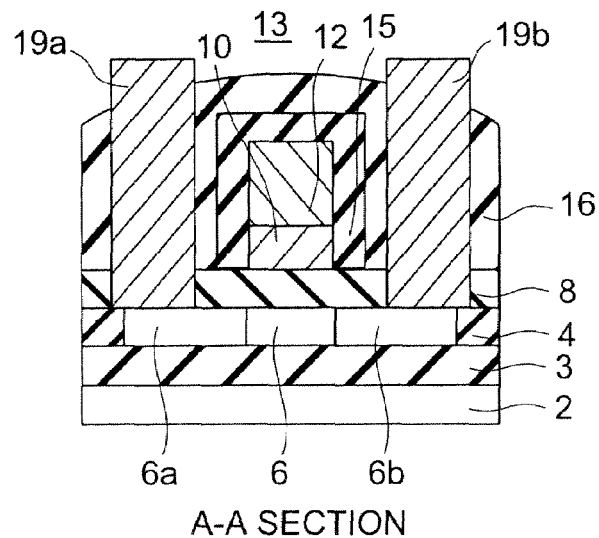
Figure 13C:
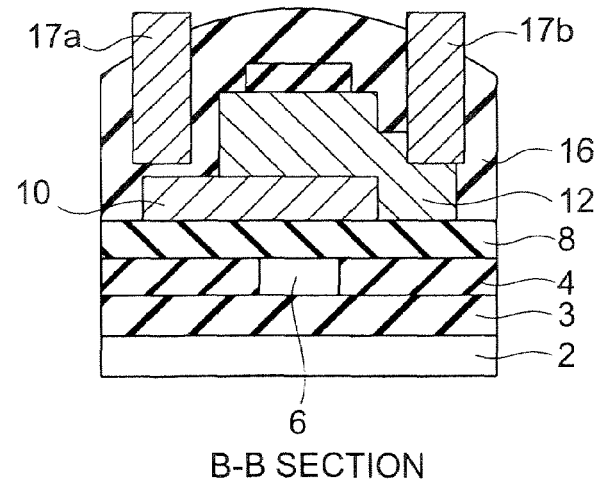

Referring now to FIGS. 13A, 13B, and 13C, an integrated circuit in accordance with a second embodiment of the present invention is described. FIG. 13A is a plan view of a switching element 1A forming a cell in the integrated circuit in accordance with this embodiment. FIG. 13B is a cross-sectional view of the switching element 1A, taken along the line A-A of FIG. 13A. FIG. 13C is a cross-sectional view of the switching element 1A, taken along the line B-B of FIG. 13A. The integrated circuit in accordance with this embodiment has the same structure as the integrated circuit of the first embodiment, except that each switching element 1 forming a cell is replaced with the switching element 1A.

The switching element 1A in accordance with this embodiment is the same as the switching element 1 in accordance with the first embodiment, except that a film 3 made of a material with a heat conductivity lower than 2.0 (W/mK), such as $SiO_2$, is formed between the substrate 2 and the switching portion 6, and the first and second Peltier electrodes 10 and 12 of the Peltier element 13 are covered with a film 15 with a heat conductivity lower than 2.0 (W/mK), such as amorphous $SiO_2$. With this structure, the heat quantity generated by the Peltier element 13 can be advantageously utilized with high efficiency. Although both the film 3 and the film 15 are provided in this embodiment, the heat quantity generated by the Peltier element 13 can be efficiently utilized with only one of the two films.

The same effects as those of the first embodiment can of course be achieved by this embodiment. Also, it is of course possible to apply the structures of Modifications 1 through 7 of the first embodiment to this embodiment.

(Modification 8)

In any of the integrated circuits of the first embodiment and its modifications and the second embodiment, $V_2O_3$ is used as the material of each switching portion 6, and each switching portion 6 can be cooled to 160 K. A freezer or a cold head may be used for the cooling. For this composition and the operating temperature, the change in electric conductivity at the boundary between the anti-ferromagnetic insulator phase (the high-resistance state) and the metal phase (the low-resistance state) shown in FIG. 9 is utilized. As shown in FIG. 9, the change in electric conductivity in this region is as large as $10^6$ times. Accordingly, the integrated circuit of this modification may be used in a logic circuit. Meanwhile, FIG. 14 shows a phase diagram of the composition x of $(V_{1-x}Cr_x)_2O_3$ (H. Kuwamoto, J. M. Honig, J. Appel, Phys. Rev. B22, 2626, (1980)). As can be seen from FIG. 14, there exists a thermal hysteresis of ±5 K at the boundary between the AFI phase (the high-resistance state) and the M phase (the low-resistance state). Accordingly, the integrated circuit of this modification can be used as a non-volatile circuit.

Figure 12:
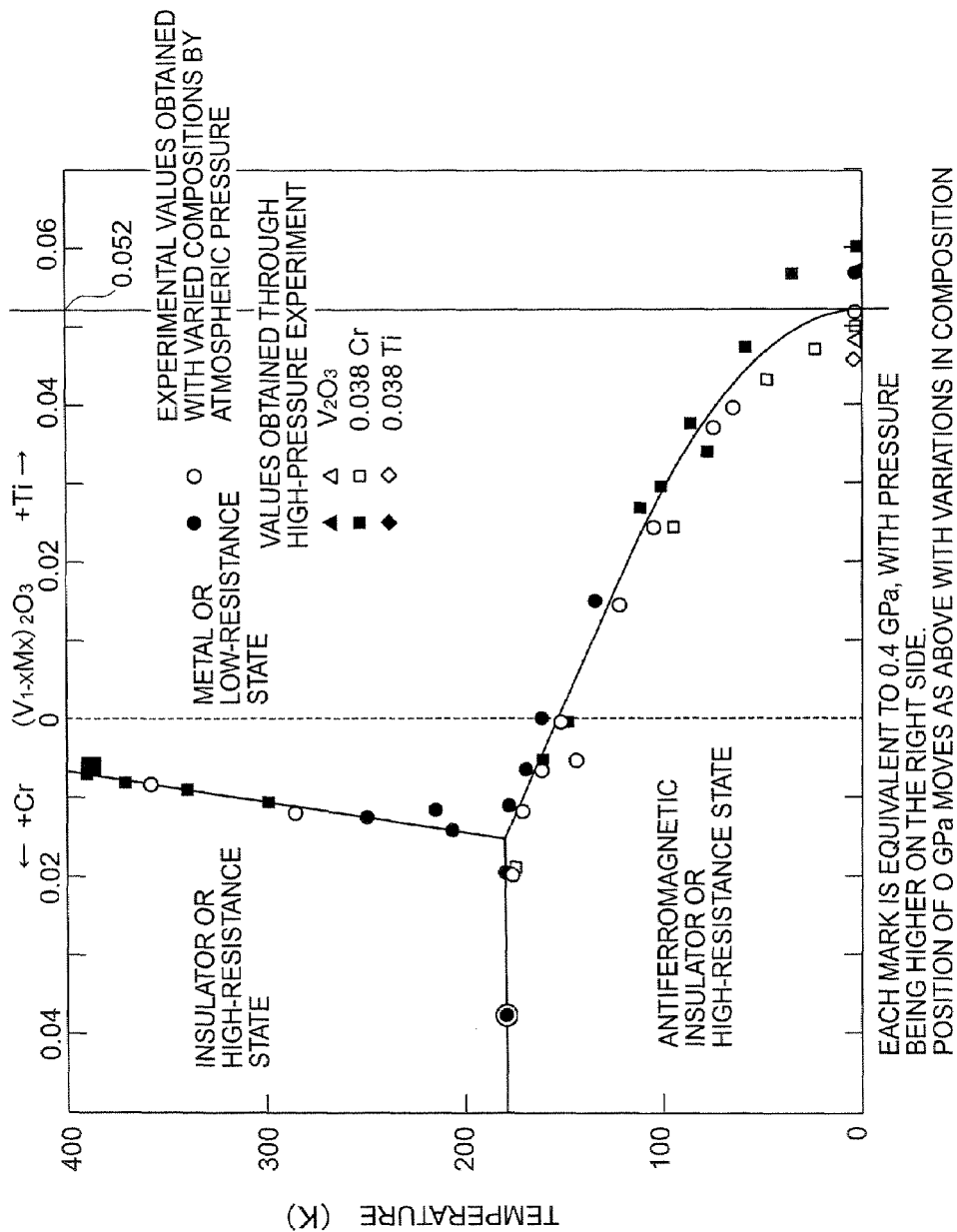
FIG. 12 is a phase diagram of $(V_{1-x-y}Cr_xTi_y)_2O_3$.

The integrated circuit of this modification can also be used as a non-volatile element when cooled to a reasonable temperature less than 200 K by a cold head, with the composition range of $(V_{1-x}Cr_x)_2O_3$ ($0 \leq x \leq 1.8$) as shown in FIG. 68 or $(V_{1-x}Ti_x)_2O_3$ ($0 \leq x \leq 0.05$) as shown in FIG. 12. It should be obvious to those skilled in the art that a suitable composition and a suitable temperature range can be easily calculated based on the principles of the present invention. In the case of $(V_{1-x}Cr_x)_2O_3$ ($0 \leq x \leq 1.8$), however, the doping amount in Ti ion implantation or the like should be appropriately adjusted. Still, it should be easy for those skilled in the art to calculate an appropriate doping amount in accordance with the graph shown in FIG. 12.

In a case where the switching elements in the integrated circuit in accordance with this modification are supposed to be used in the third temperature environment, each of the switching elements is in the low-resistance state or the high-resistance state in the predetermined temperature environment, and such a composition as to switch the resistance states within a temperature range of 80° C. can be selected. In such a case, each switching element is a normally-on element that operates in the third temperature environment, or a normally-off element.

(Modification 9)

Figure 15:
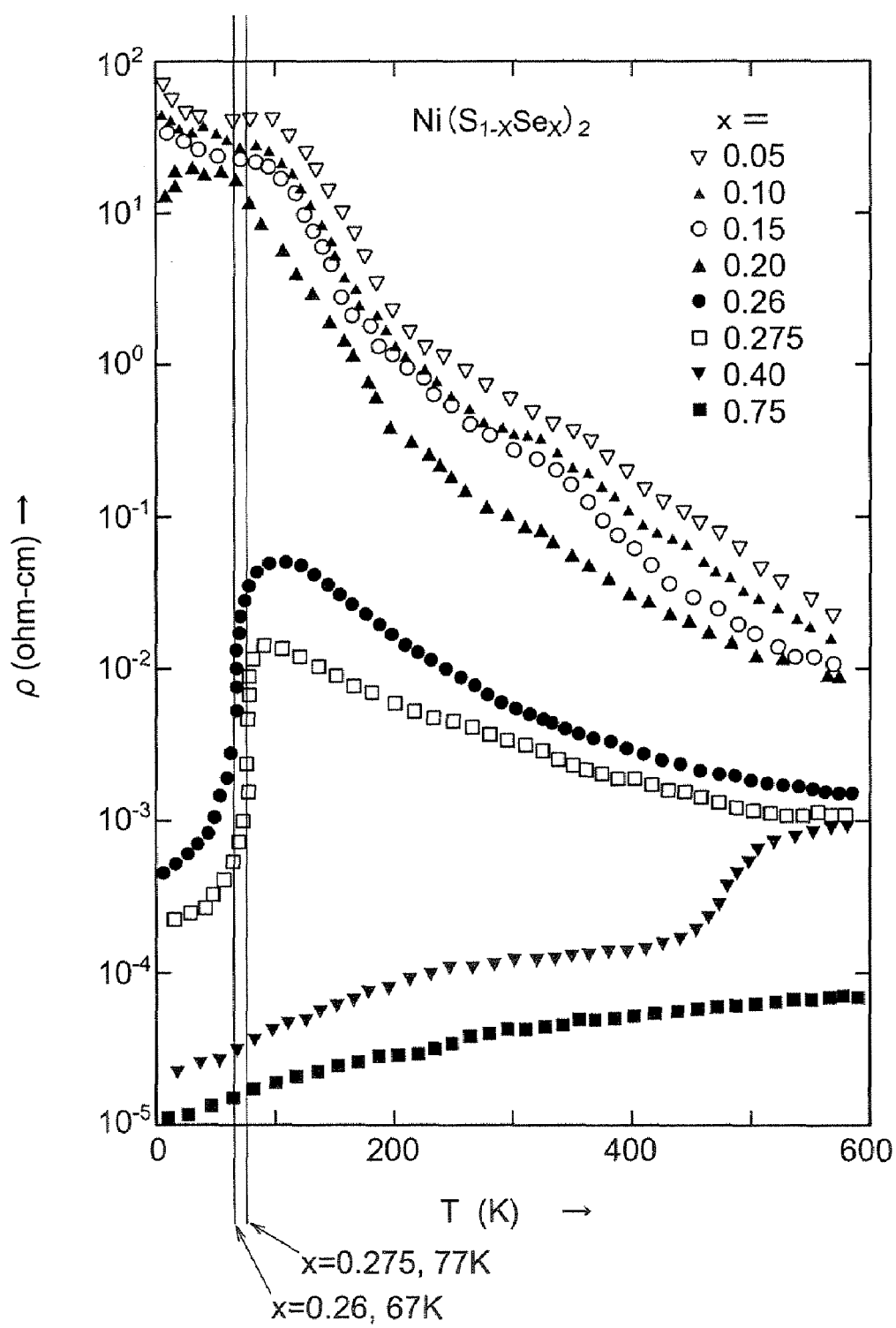
FIG. 15 shows a variation in resistivity of $Ni(S_{1-x}Se_x)_2$ with changes in temperature.

In each of the integrated circuits of the first and second embodiments and the modifications, a $V_2O_3$ material is used as the material of each switching portion 6. However, it is also possible to employ $Ni(S_{1-x}Se_x)$ ($0.26 \leq x \leq 0.275$). FIG. 15 shows a phase diagram of $Ni(S_{1-x}Se_x)_2$ (P. Kwizera, M. S. Dresselhaus, and D. Alder, Phys. Rev. B21, 2328, (1980)). In this group of materials, a resistance change is caused by a CDW (Charge Density Wave) phase transition, and the anisotropy in electric resistance is high. Therefore, attention should be paid to the anisotropy, using an epitaxial film or the like. Although only a 10-fold resistance change can be achieved, the integrated circuit can be used as a memory, with an amplifying transistor or the like being provided in each element.

(Modification 9-1)

Figure 16:
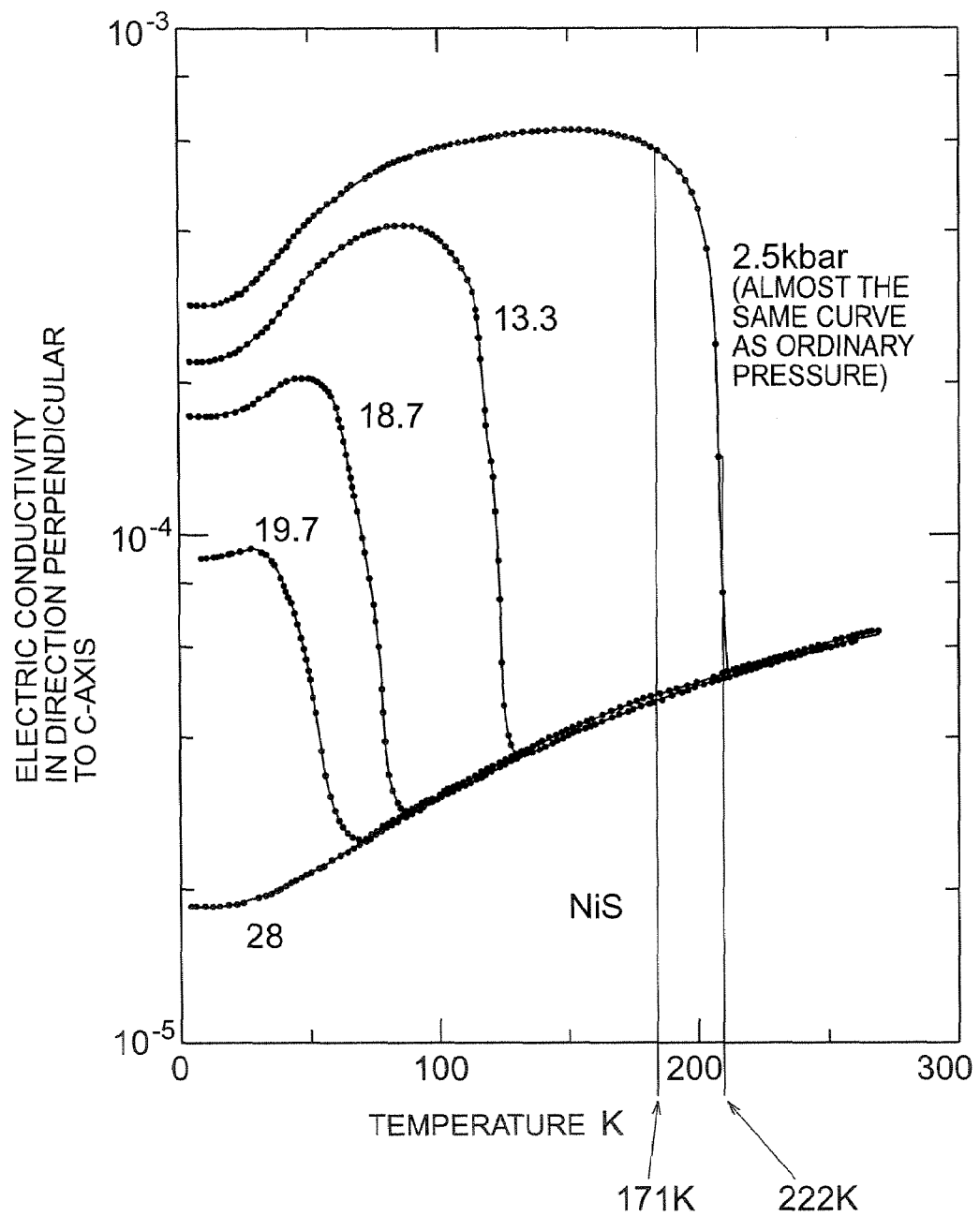
FIG. 16 shows a variation in resistivity of NiS with changes in pressure.

In each of the integrated circuits of the first and second embodiments and the modifications, a $V_2O_3$ material is used as the material of each switching portion 6. However, it is also possible to employ NiS. FIG. 16 shows a phase diagram of NiS (D. B. McWhan, M. Marezio, J. P. Remeika, and P. D. Dernier, Phys. Rev. B5, 2552, (1972)). In this group of materials, a resistance change is also caused by a CDW (Charge Density Wave) phase transition, and attention should be paid to the anisotropy, using an epitaxial film or the like. Although only a 10-fold resistance change can be achieved, the integrated circuit can be used as a memory, with an amplifying transistor or the like being provided in each element.

(Modification 10)

Figure 17:
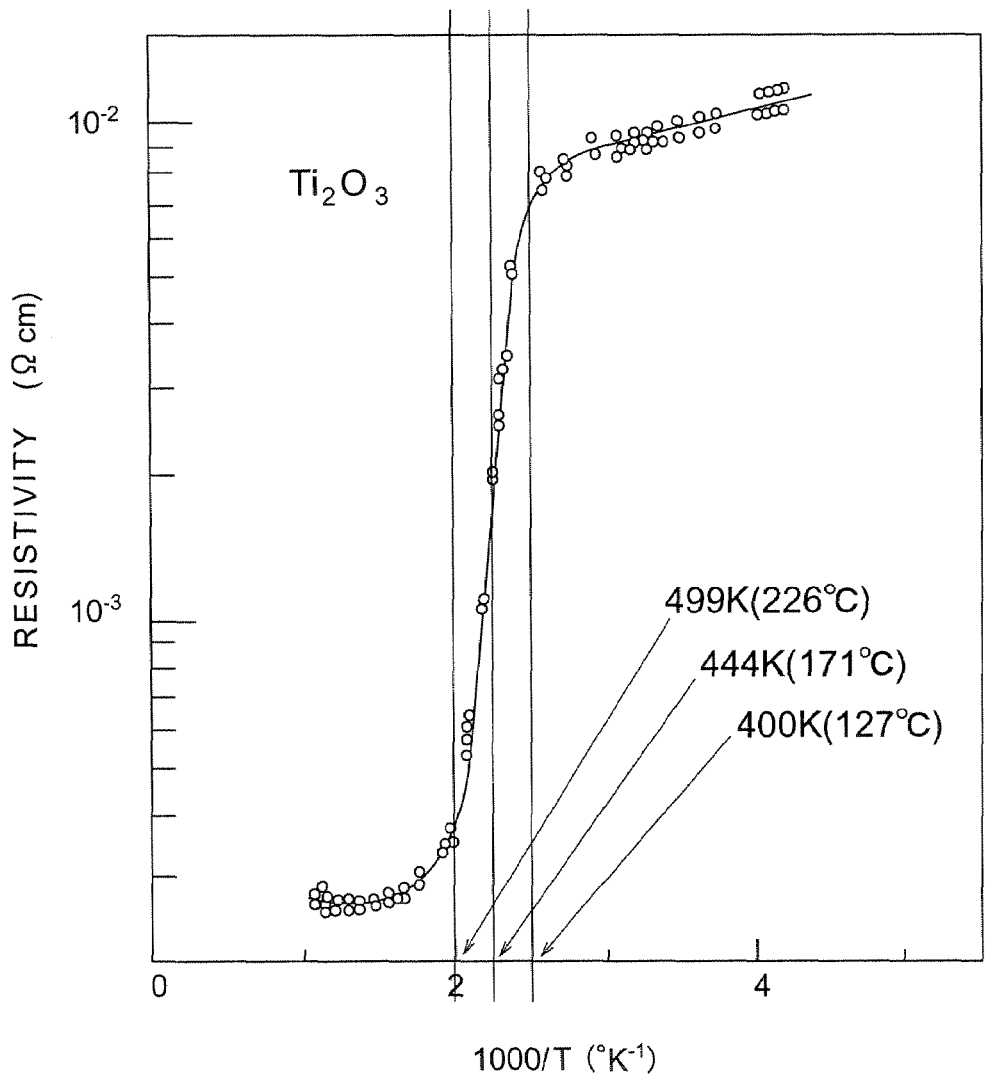
FIG. 17 shows a variation in resistivity of $Ti_2O_3$ with changes in temperature.

In each of the integrated circuits of the first and second embodiments and the modifications, a $V_2O_3$ material is used as the material of each switching portion 6. However, it is also possible to employ $Ti_2O_3$. In this case, $Ti_{0.95}Re_{0.05}O_2$ (Re being added through ion implantation) or the like is used for the electrodes 6a and 6b of each switching portion 6. The entire integrated circuit may be heated to 171° C. by a heater, and the temperature change by the Peltier element can be ±70° C. FIG. 17 shows a phase diagram of $Ti_2O_3$ (J. M. Honig and T. B. Reed, Phys. Rev. 174, 1020, (1968)).

As can be seen from FIG. 17, the resistance of $Ti_2O_3$ becomes 1000 times higher or lower with a temperature change of ±70° C. from 171° C. Although the thermal hysteresis is not shown, the thermal hysteresis is considered to exist, with the resistance variation being taken into account. Accordingly, each switching element can be used as a non-volatile element. Since there is only a 100-fold difference in electric resistivity between the low-resistance state and the high-resistance state, the integrated circuit of this modification can be effectively applied as a memory.

(Modification 11)

Figure 18:
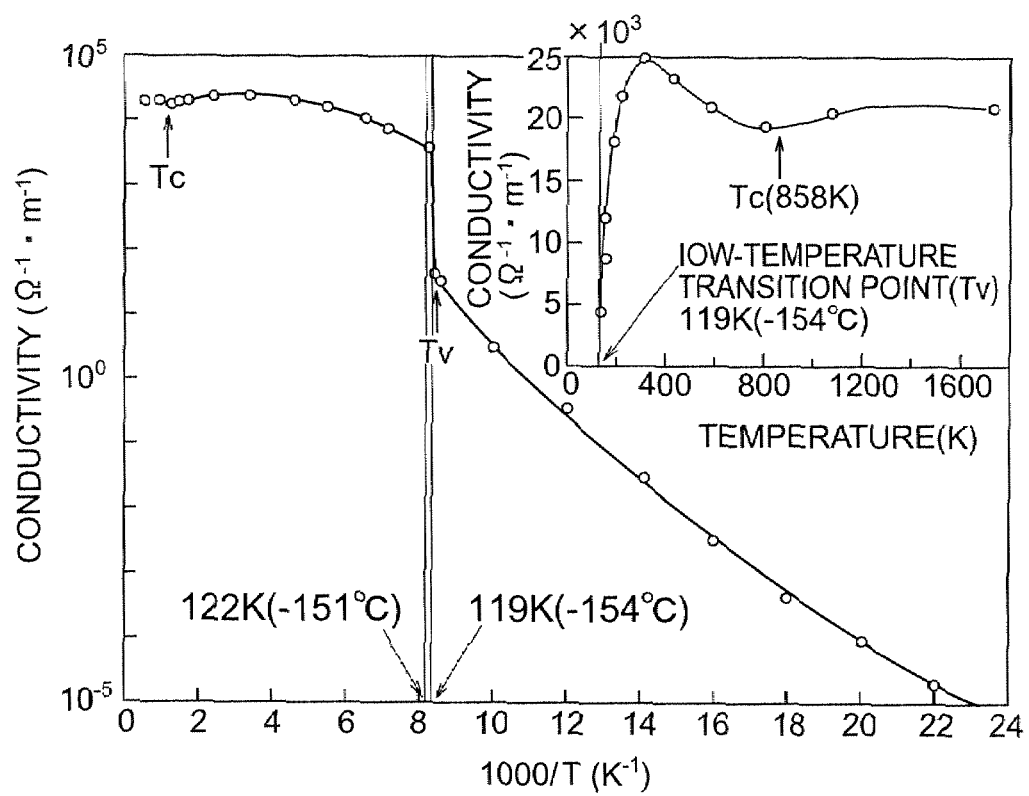
FIG. 18 shows a variation in resistivity of $Fe_3O_4$ with changes in temperature.

In each of the integrated circuits of the first and second embodiments and the modifications, a $V_2O_3$ material is used as the material of each switching portion 6. However, it is also possible to employ $Fe_3O_4$. In this case, $(Fe_{0.95}Re_{0.05})_3O_4$ (Re being added through ion implantation) or the like is used for the electrodes 6a and 6b of each switching portion 6. The entire integrated circuit may be cooled to 120 K by a cold head or the like, and the temperature change by the Peltier element can be ±10° C. FIG. 18 shows a phase diagram of $Fe_3O_4$ (P. A. Miles, W. B. Westphai, and A. von Hippel, Reviews of Modern Physics, 29, 279, (1957)).

As can be seen from FIG. 18, the resistance of $Fe_3O_4$ becomes 100 times higher or lower with a temperature change of ±10° C. from 120 K. Although not shown, a thermal hysteresis is considered to exist, with the resistance variation being taken into account. With the addition of V or Cr or Ni to $Fe_3O_4$, the temperature at the boundary between the low-resistance state and the high-resistance state can be changed. Since there is only a 100-fold difference in electric resistivity between the low-resistance state and the high-resistance state, the integrated circuit of this modification can be effectively applied as a memory.

(Modification 12)

Figure 19:
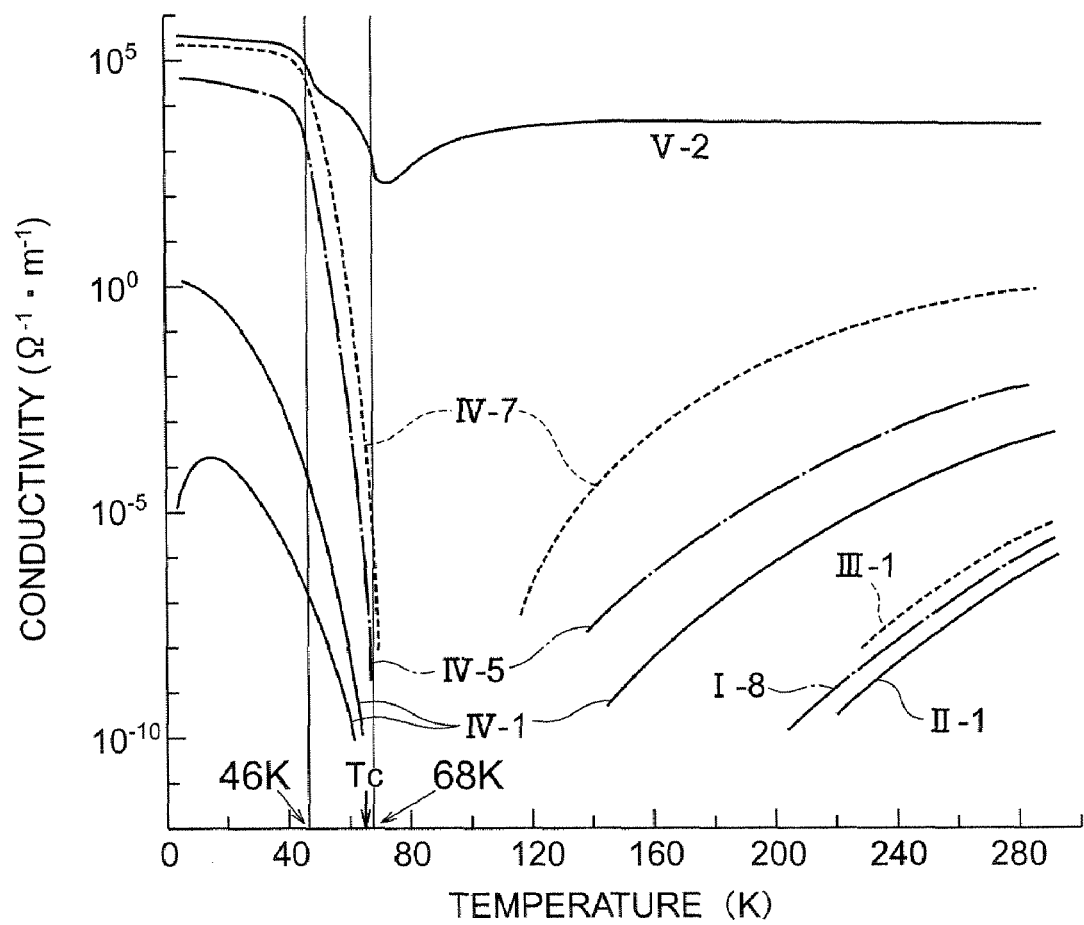
FIG. 19 shows a variation in electric conductivity of $EuO_{1-x}$ with changes in temperature.

In each of the integrated circuits of the first and second embodiments and the modifications, a $V_2O_3$ material is used as the material of each switching portion 6. However, it is also possible to employ $EuO_{1-x}$ (in the case of the range: $0.0005 \leq x \leq 0.004$). In this case, $(Eu_{0.95}Re_{0.05})O_{1-x}$ (in the case of the range: $0.0005 \leq x \leq 0.004$) or the like is used for the electrodes 6a and 6b of each switching portion 6 (Re being added through ion implantation). The entire integrated circuit may be cooled to 60 K by a cold head or the like, and the temperature change by the Peltier element can be made ±20° C. FIG. 19 shows a phase diagram of EuO (M. W. Shafer, J. B. Torrance, T. Penny, J. Phys. Chem. Solid 33, 2251, (1972)). The composition is determined through IR (Infra Red) measurement, and includes IR measurement errors. In FIG. 19, II-1 indicates an insulator if EuO, with 1.5% of Eu being missing. I-8 indicates an insulator of EuO, with 10% of $Eu_3O_4$ being contained. III-1 indicates EuO, with 0.2% or less of Eu being missing within the range of the IR measurement limit. IV-1 indicates EuO, with 0.05% or less of O being missing within the range of the IR measurement limit, which can be used in this modification. IV-5 and IV-7 indicate EuO, with 0.35% of O being missing within the range of the IR measurement limit, which can be used in this modification. IV-7 is more preferable. V-2 indicates a metal material of EuO, with 0.5% of O being missing.

As can be seen from FIG. 19, the resistance of $EuO_{1-x}$ becomes $10^{12}$ times higher or lower with a temperature change of 10 K from 70 K. Although not shown, a thermal hysteresis is considered to exist, with the resistance variation being taken into account. Accordingly, each switching element can be used as a non-volatile element. With the addition of various rare-earth metals to $EuO_{1-x}$, the temperature at the boundary between the low-resistance state and the high-resistance state can be changed. Since there is a $10^{12}$-fold difference in electric resistivity between the low-resistance state and the high-resistance state, the integrated circuit of this modification can be used not only as a memory but also as a logic circuit. Since a substance has a smaller heat capacity at a lower temperature, usage at a low operating temperature is advantageous in high-speed operations of the device.

(Modification 13)

Figure 20:
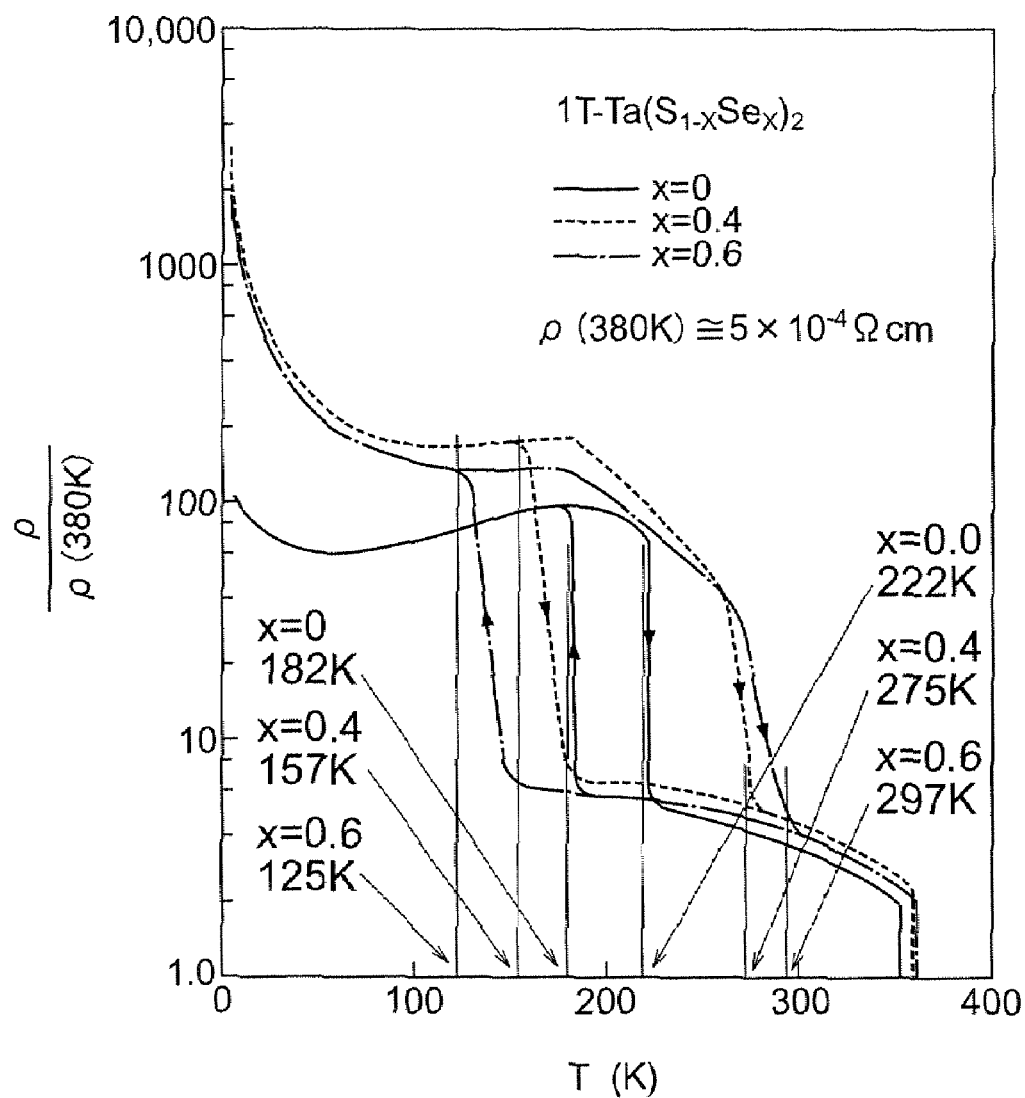
FIG. 20 shows a variation in resistivity of $1T\text{-}Ta(S_{1-x}Se_x)_2$ with changes in temperature.
Figure 21:
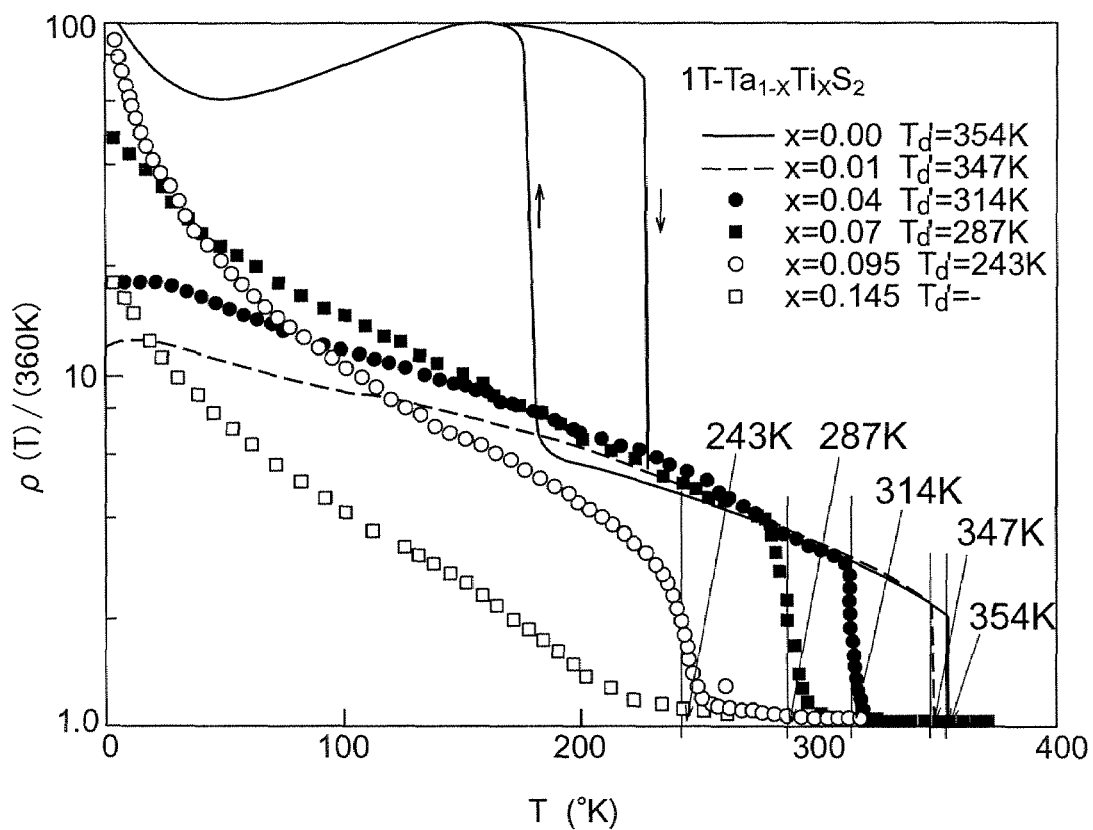
FIG. 21 shows a variation in resistivity of $1T\text{-}Ta_{1-x}Ti_xSe_2$ with changes in temperature.

In each of the integrated circuits of the first and second embodiments and the modifications, a $V_2O_3$ material is used as the material of each switching portion 6. However, it is also possible to employ $1T\text{-}Ta(S_{1-x}Se_x)_2$ ($0 \leq x \leq 0.6$). Since this material is high in anisotropy, it is necessary to use an epitaxial film or a highly-orientated film. FIG. 20 shows a phase diagram of $1T\text{-}Ta(S_{1-x}Se_x)_2$ ($0 \leq x \leq 0.6$) (F. J. Di Salvo, J. A. Wilson, B. G. Bagley, and J. V. Waszczak, Phys. Rev. B12, 2220, (1975)). As can be seen from FIG. 20, the temperature at the boundary between the low-resistance state and the high-resistance state in $1T\text{-}Ta(S_{1-x}Se_x)_2$ ($0 \leq x \leq 0.6$) is as low as 200 K. Accordingly, the integrated circuit in accordance with this modification is an integrated circuit that includes switching elements that operate in the neighborhood of 200 K. The width of hysteresis temperature can be characteristically varied by changing the composition ratio of sulfur to selenium. FIG. 21 shows the resistivity relative to the temperature in a case where Ti is added to 1T-TaSSe (F. J. Di Salvo, J. A. Wilson, B. G. Bagley, and J. V. Waszczak, Phys. Rev. B12, 2220, (1975)). As can be seen from FIG. 21, with the addition of 4% Ti to $1T\text{-}Ta(S_{1-x}Se_x)_2$, the temperature at the boundary between the low-resistance state and the high-resistance state can be set in the neighborhood of 293 K. Accordingly, Ti may be added in this modification. Also, with the addition of a material other htan Ti, the temperature at the boundary between the low-resistance state and the high-resistance state can be changed. Since there is only a 30-fold difference in electric resistivity without the addition of Ti, and only a 10-fold difference in electric resistivity with the addition of Ti, between the low-resistance state and the high-resistance state, the integrated circuit of this modification can be effectively applied as a memory.

(Modification 14)

Figure 22:
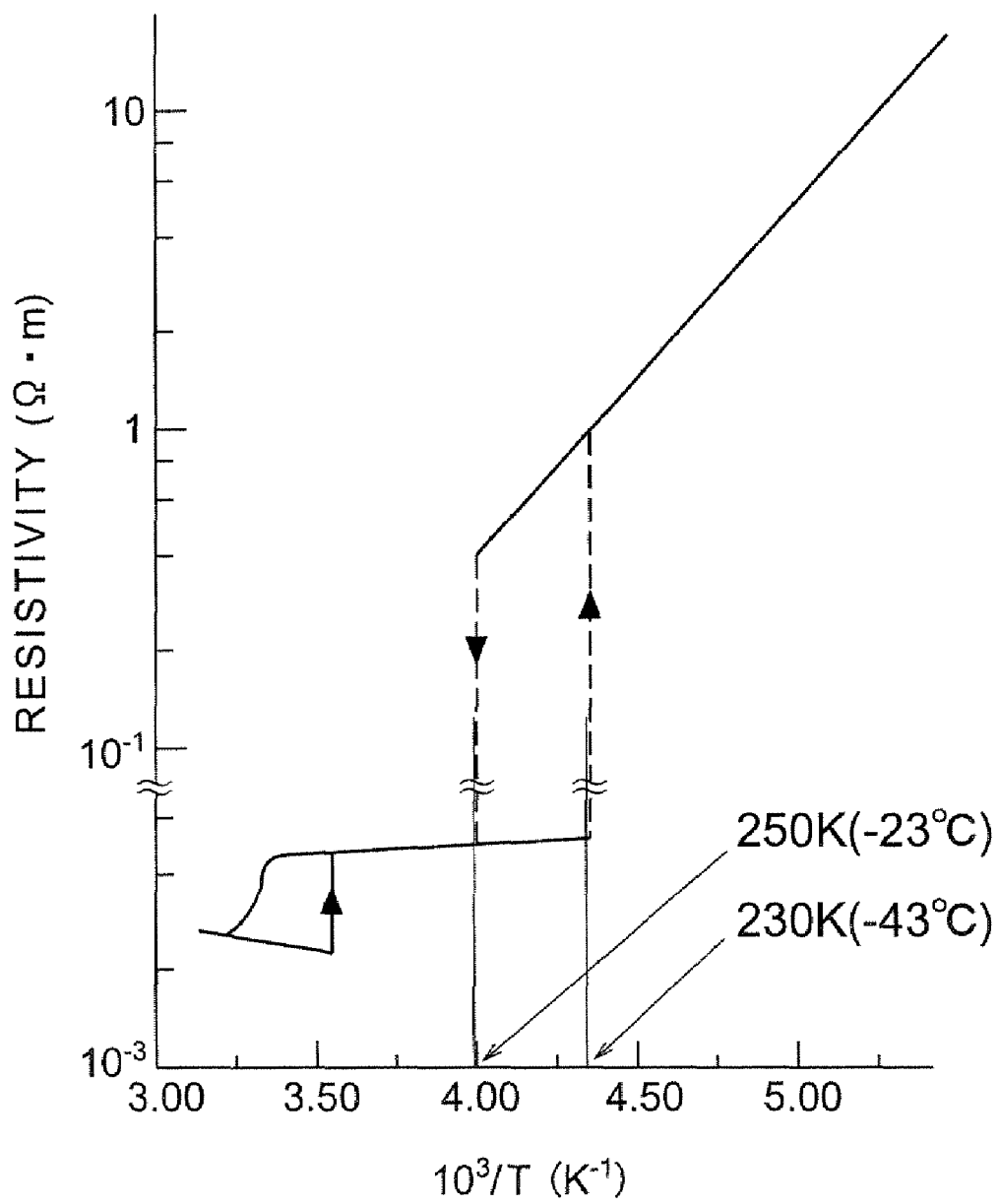
FIG. 22 shows a variation in resistivity of $WO_{3.0}$ with changes in temperature.

In each of the integrated circuits of the first and second embodiments and the modifications, a $V_2O_3$ material is used as the material of each switching portion 6. However, it is also possible to employ $WO_{3.0}$. In this case, $(W_{0.95}Re_{0.05})O_{3.0}$ (Re being added through ion implantation) or the like is used for the electrodes 6a and 6b of each switching portion 6. The entire integrated circuit may be cooled to 240 K by a cold head or the like, and the temperature change by the Peltier element can be made ±20 K. FIG. 22 shows the variation in resistivity of $WO_{3.0}$ relative to temperature (L. D. Muhlestein and G. C. Danielson, Phys. Rev. 158, 825, (1967)).

As can be seen from FIG. 22, the resistance of $WO_{3.0}$ becomes 10 times higher or lower with a temperature change of ±10° C. from 240 K. Although not shown, a thermal hysteresis is considered to exist, with the resistance variation being taken into account. Accordingly, each switching element can be used as a non-volatile element. With the addition of Cr, Mo, Na, or K to $WO_{3.0}$, the temperature at the boundary between the low-resistance state and the high-resistance state can be changed. Since there is only a 10-fold difference in electric resistivity between the low-resistance state and the high-resistance state, the integrated circuit of this modification can be effectively applied as a memory.

(Modification 15)

In each of the integrated circuits of the first and second embodiments and the modifications, a $V_2O_3$ material is used as the material of each switching portion 6. However, it is also possible to employ $CuIr_2(S_{1-x}Se_x)_4$ ($0 \leq x \leq 0.1$). In this case, $CuIr_2(S_{0.95-x}Se_xTe_{0.05})_4$ ($0 \leq x \leq 0.1$) or the like is used for the electrodes 6a and 6b of each switching portion 6 (Te being added through ion implantation). The entire integrated circuit may be cooled to (225−200×x)K (x being the value in the above composition) by a cold head or the like, and the temperature change by the Peltier element can be made ±20 K. FIG. 23 shows the resistivity of $CuIr_2(S_{1-x}Se_x)_4$ materials relative to temperature (S. Nagata, N. Matsumoto, Y. Kato, T. Furubayashi, T. Matsumoto, J. P. Sanchez, and R Vulliet, Phys. Rev. B58, 6844, (1998)).

As can be seen from FIG. 23, the resistance of the material with the composition of $CuIr_2(S_{0.95-x}Se_xTe_{0.05})_4$ ($0 \leq x \leq 0.1$) becomes 100 times higher or lower with a temperature change of ±10 K from (225−200×x)K. Since a thermal hysteresis exists, each switching element can be used as a non-volatile element. With the addition of an element to $CuIr_2(S_{0.95-x}Se_xTe_{0.05})_4$ ($0 \leq x \leq 0.1$), the temperature at the boundary between the low-resistance state and the high-resistance state can be changed. Since there is only a 1000-fold difference in electric resistivity between the low-resistance state and the high-resistance state, the integrated circuit of this modification can be effectively applied as a memory.

(Modification 16)

Figure 24:
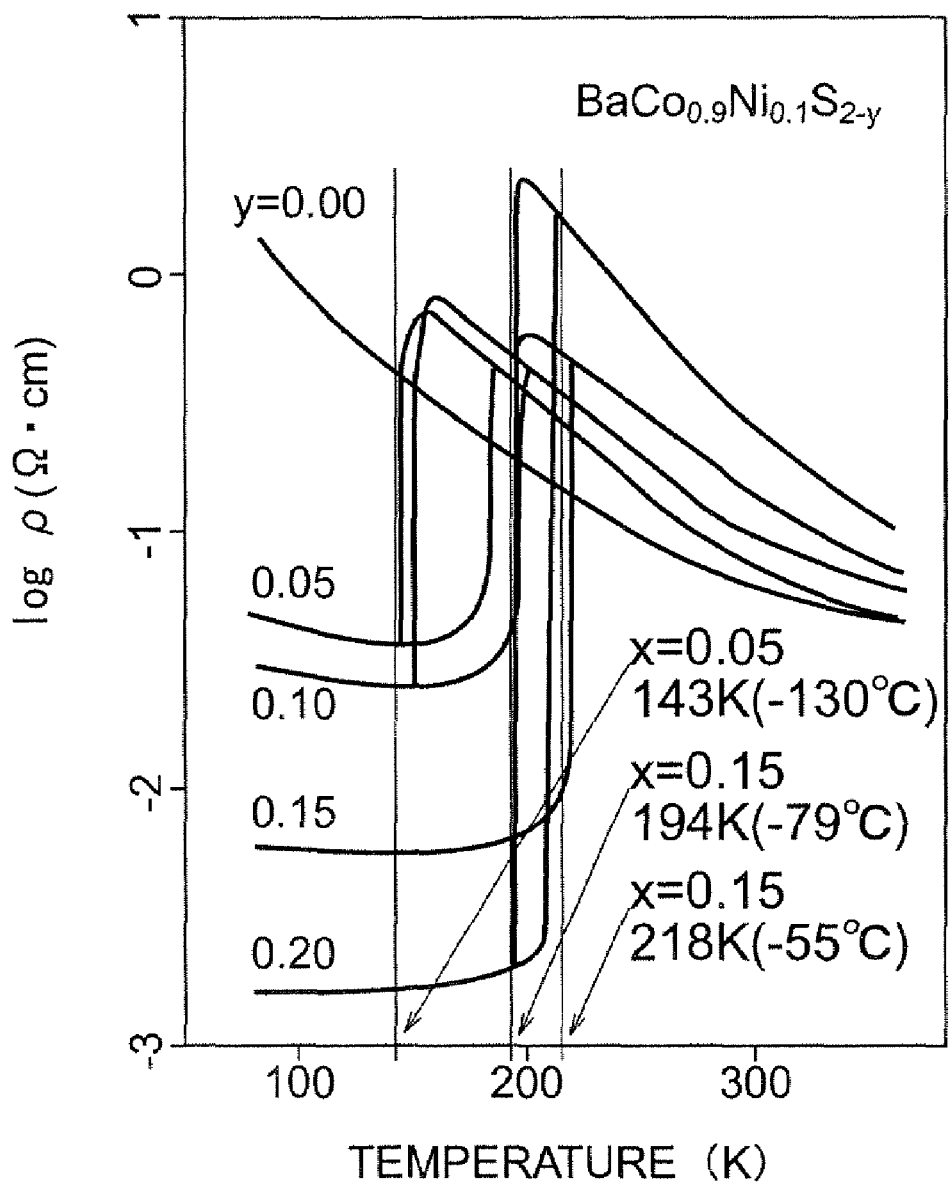
FIG. 24 shows a variation in resistivity of $BaCo_{0.9}Ni_{0.1}S_{2-x}$ with changes in temperature.

In each of the integrated circuits of the first and second embodiments and the modifications, a $V_2O_3$ material is used as the material of each switching portion 6. However, it is also possible to employ $BaCo_{0.8}Ni_{0.2}S_{2-x}$ (x=0.15). In this case, $BaCo_{0.8}Ni_{0.2}S_{2-x}$ (x=0.15) or the like is used for the electrodes 6a and 6b of each switching portion 6 (the addition of Ni being increased through ion implantation). The entire integrated circuit may be cooled to 200 K by a cold head or the like, and the temperature change by the Peltier element can be made ±20° C. FIG. 24 shows the resistivity of $BaC_{0.9}Ni_{0.1}S_{2-x}$ ($0.05 \leq x \leq 0.20$) relative to temperature (L. S. Martinson, J. W. Schweitzer, and N. C. Baenziger, Phys. Rev. Lett. 71, 125, (1993)).

As can be seen from FIG. 24, the resistance of $BaCo_{0.9}Ni_{0.1}S_{2-x}$ (x=0.15) becomes 1000 times higher or lower with a temperature change of ±10 K from 200 K. Since a thermal hysteresis of ±10 K exists, each switching element can be used as a non-volatile element.

Other than the above, there is a resistance-state switching point in the composition range of $BaCo_{0.9}Ni_{0.1}S_{2-x}$ ($0.05 \leq x \leq 0.20$). Accordingly, by suitably adjusting the addition amount x of S, the operating temperature can be changed. With the addition of another element to $BaCo_{0.9}Ni_{0.1}S_{2-x}$ ($0.05 \leq y \leq 0.20$), the temperature at the boundary between the low-resistance state and the high-resistance state can be changed. Since there is only a 1000-fold difference in electric resistivity between the low-resistance state and the high-resistance state of $BaCo_{0.9}Ni_{0.1}S_{2-x}$ ($0.05 \leq x \leq 0.20$), the integrated circuit of this modification can be effectively applied as a memory.

(Modification 17)

Figure 25:
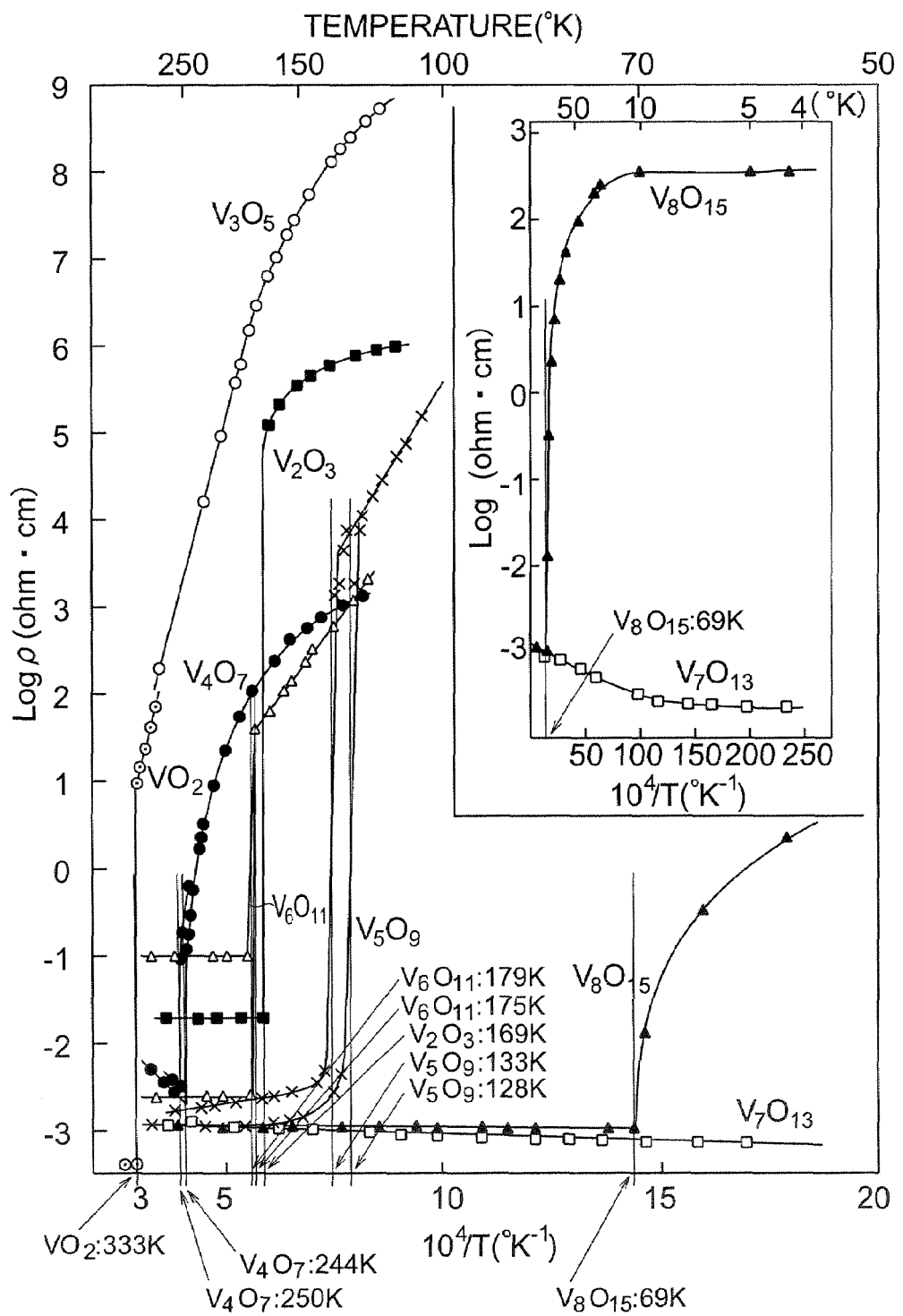
FIG. 25 shows a variation in electric conductivity of $V_nO_{2n-1}$, $VO_2$, and $V_nO_{2n+1}$ with changes in temperature.

In each of the integrated circuits of the first and second embodiments and the modifications, a $V_2O_3$ material is used as the material of each switching portion 6. However, it is also possible to employ $V_nO_{2n-1}$ (n=3, 4, 5, 6, 8), $VO_2$, or $V_nO_{22n+1}$ (n=2, 6). In this case, $V_{n-0.1}Ti_{0.1}O_{2n-1}$ (n=3, 4, 5, 6, 8) or the like is used for the electrodes 6a and 6b of each switching portion 6. FIG. 25 shows the variation in electric conductivity of $V_nO_{2n-1}$ and $VO_2$ relative to temperature (S. Kachi, K. Kosuge, and H. Okinaka, Journal of Solid State Chemistry, 6, 258, (1973)). As can be seen from FIG. 25, in a case of $V_nO_{2n-1}$ (n=4), the variation in resistance is approximately 100 times, with the temperature at the boundary between the low-resistance state and the high-resistance state ranging from 244 K to 250 K. In a case of $V_nO_{2n-1}$ (n=5), the variation in resistance is approximately $10^4$ times, with the temperature at the boundary between the low-resistance state and the high-resistance state ranging from 128 K to 135 K. In a case of $V_nO_{2n-1}$ (n=6), the variation in resistance is approximately 200 times, with the temperature at the boundary between the low-resistance state and the high-resistance state ranging from 175 K to 179 K. In a case of $V_nO_{2n-1}$ (n=8), the variation in resistance is approximately 10 times, with the temperature at the boundary between the low-resistance state and the high-resistance state being in the neighborhood of 69 K. In a case of $VO_2$, the variation in resistance is approximately $10^6$ times, with the temperature at the boundary between the low-resistance state and the high-resistance state being in the neighborhood of 333 K. This modification is an integrated circuit including switching elements that operate in those temperature ranges. Although not shown in FIG. 25, in a case of $V_nO_{2n-1}$ (n=3), the temperature at the boundary between the low-resistance state and the high-resistance state is known to be approximately 430 K. In a case of $V_nO_{2n+1}$ (n=6), the boundary temperature is known to be approximately 190 K, which is not shown in FIG. 25 either. It is preferable to use the entire element over a cold head or in an environment provided with a suitable temperature control mechanism.

Although the thermal hysteresis is not described in detail, the thermal hysteresis with respect to $V_4O_7$ is seen in FIG. 25. As in the cases of $V_2O_3$ and other materials, the thermal hysteresis is considered to exist in each of the cases of $V_nO_{2n-1}$ (n=3, 5, 6, 8), $VO_2$, and $V_nO_{2n+1}$ (n=2, 6). Accordingly, each switching element can be used as a non-volatile element.

With the addition of another element such as Cr or Ti to $V_nO_{2n-1}$, $VO_2$, or $V_nO_{2n+1}$ the temperature at the boundary between the low-resistance state and the high-resistance state can be changed.

(Modification 18)

Figure 26:
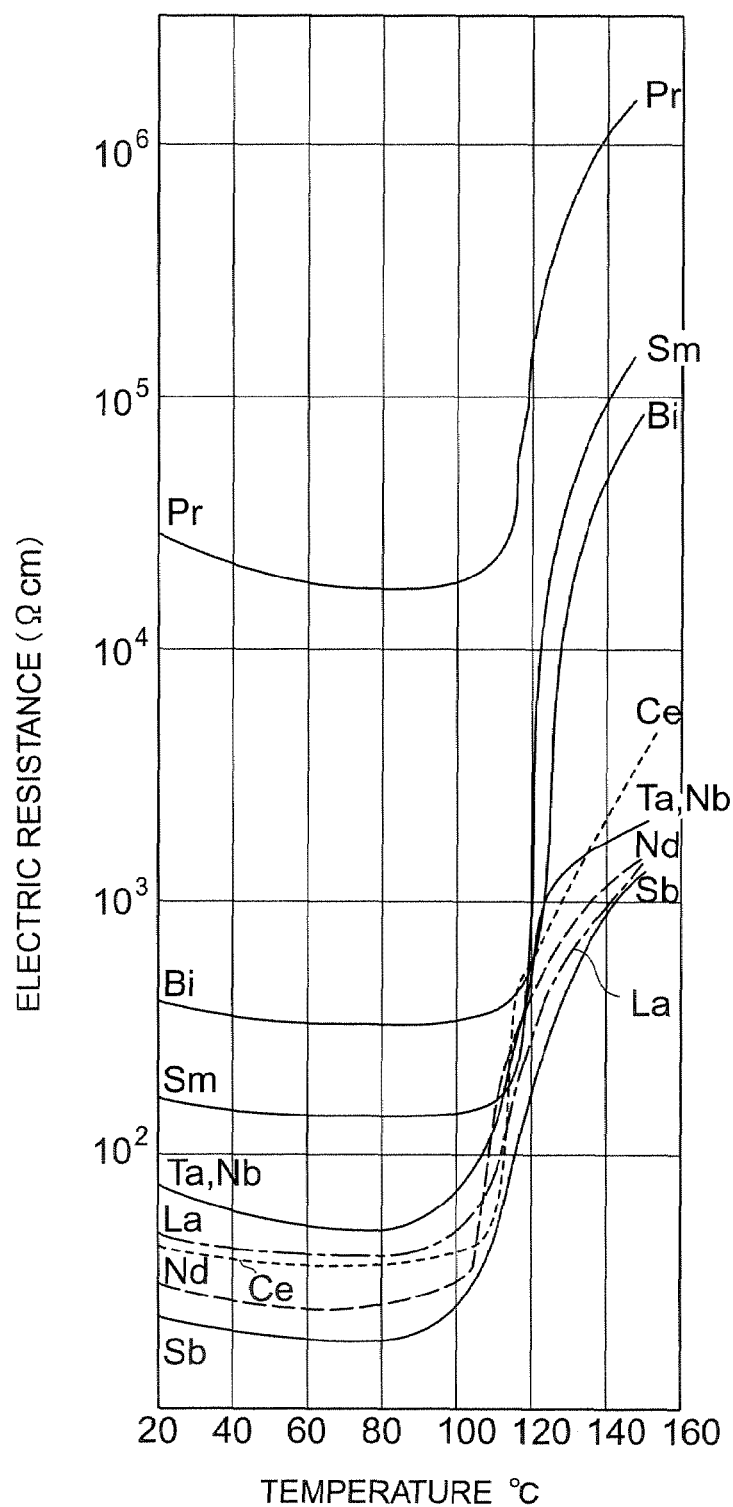
FIG. 26 shows a variation in resistivity of $Ba_{1-x}Me_xTiO_3$ with changes in temperature.
Figure 27:
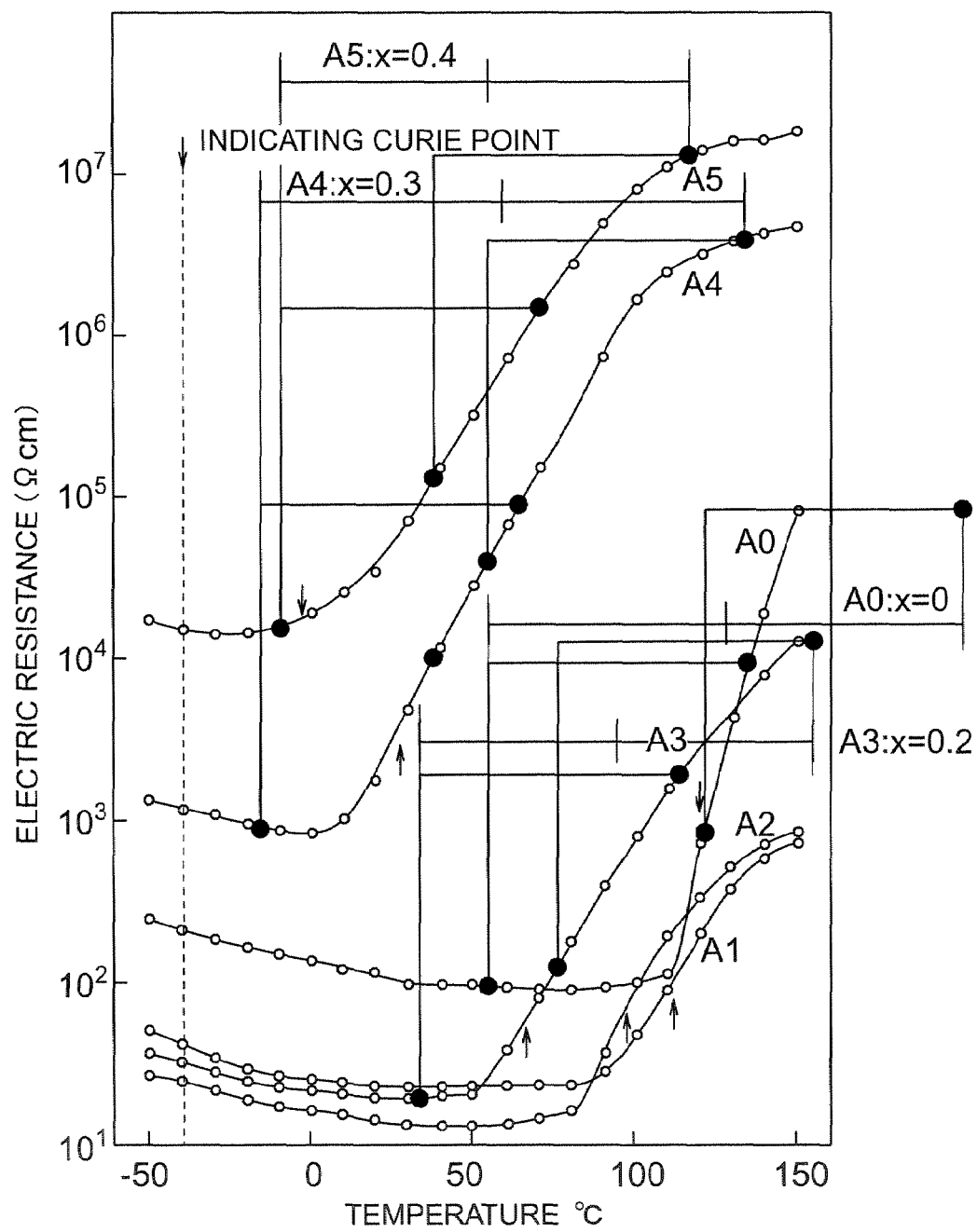
FIG. 27 shows a variation in resistivity of $Ba_{0.999-x}Sr_xCe_{0.001}TiO_3$ with changes in temperature.

In each of the integrated circuits of the first and second embodiments and the modifications, a $V_2O_3$ material is used as the material of each switching portion 6. However, it is also possible to employ a grain boundary conductor having electric conductivity varying rapidly with changes in temperature. As an example of such a grain boundary conductor, $Ba_{0.999-x}Sr_xCe_{0.001}TiO_3$ ($0.3 \leq x \leq 0.4$) is used. FIG. 27 shows a variation in resistivity of $Ba_{0.999-x}Sr_xCe_{0.001}TiO_3$ ($0.3 \leq x \leq 0.4$) relative to changes in temperature (Osamu Saburi, Journal of The American Ceramic Society, 44, 54, (1961)). As can be seen from FIG. 27, $Ba_{0.999-x}Sr_xCe_{0.001}TiO_3$ ($0.3 \leq x \leq 0.4$) can be used at room temperature. Other than $Ba_{0.999-x}Sr_xCe_{0.001}TiO_3$ ($0.3 \leq x \leq 0.4$), materials formed by adding an element other than Ce to $Ba_{1-x}Sr_xTiO_3$ materials, such as $Ba_{1-y-x}Sr_xMe_yTiO_3$ (Me being an element other than Ce, $0 \leq y \leq 0.01$), are known (see FIG. 26 (Osamu Saburi, Journal of the Physical Society of Japan, 14, 1159, (1959)). With such materials, a 10-fold or larger temperature change can also be achieved. The use of Ce in place of Me and y=0.001 have two advantageous aspects: a wide variation in resistance and the small absolute value of the resistance in the low-resistance state. Therefore, in this modification, the example using Ce is described as the optimum example. With $Ba_{1-y-x}Sr_xMe_yTiO_3$ (Me being an element other than Ce, $0 \leq y \leq 0.01$), the fundamental operation principles are the same as those in the example having the addition of Ce, and $Ba_{1-y-x}Sr_xMe_yTiO_3$ (Me being an element other than Ce, $0 \leq y \leq 0.01$) can be used as the material for each switching portion 6 in any of the integrated circuits of the first and second embodiments and the modifications.

Various perovskite materials, such as $YCrO_3$, $YTiO_3$, and $YMnO_3$, are also known as grain boundary conductors that have resistivity varying rapidly with changes in temperature. Other than such perovskite materials, there are grain boundary conductors that have electric conductivity (the inverse of the resistivity) rapidly varying with changes in temperature. By adding a suitable material to each of those materials, the characteristics can be controlled. Those materials can be used in any of the embodiments of the present invention and the modifications. Although not shown in FIG. 27, a thermal hysteresis is considered to exist, with the resistance variation mechanism being taken into account. Accordingly, the integrated circuit of this modification can be used as a non-volatile memory.

(Modification 19)

In each of the integrated circuits of the first and second embodiments and the modifications, a $V_2O_3$ material is used as the material of each switching portion 6. However, it is also possible to employ a superconductor. Since the transition temperature of $HgBa_2Ca_{n-1}Cu_nO_{2n+2+y}$ (n=2), which is a mercury cuprate having the highest transition temperature among the superconductors known to this date, is 133 K, the switching portion 6 made of a superconductor known today operates at a low temperature in the integrated circuit. If a material that has a higher superconductive transition temperature is discovered in the future, the material can be used for the switching portion 6.

When a superconductor is used, a superconducting gap is formed in the neighborhood of the Fermi surface. Therefore, it is necessary to apply a voltage of the size equivalent to the superconducting gap energy (normally 0.1 V or less) to the switching element. Examples of superconductors that can be used include cuprate superconductors of YBCO, Bi, Tl, LSCO, and Nd, boride superconductors, alloy superconductors such as $MgB_2$, $Nb_3Sn$, and $Nb_3Al$, organic superconductors such as $A_3C_{60}$ (A being at least one of Li, Na, K, Rb, and Cs), and single-material superconductors such as Pb and Nb. Having a large difference in electric resistivity between the low-resistance state and the high-resistance state, the switching element in accordance with this modification can be used in a logic circuit.

(Modification 20)

In each of the integrated circuits of the first and second embodiments and the modifications, a $V_2O_3$ material is used as the material of each switching portion 6. However, it is also possible to employ an organic conductor that has electric conductivity rapidly varying with temperature. For example, a BEDT-TTF material, a $(TMTSF)_2X$ material (X being monovalent anion such as $PF_6^-$ or $ClO_4^-$), a TTF-TCNQ material, or a $(DMe-DCNQI)_2Cu$ material, can be in both the low-resistance state and the high-resistance state by virtue of the mechanism of CDW (Charge Density Wave) or superconduction, and switch between the two states with changes in temperature. At the present, the temperature at the boundary between the low-resistance state and the high-resistance state is normally lower than the second temperature environment, but this is not essential on principle. If a material that has a lower temperature at the boundary between the low-resistance state and the high-resistance state is discovered in the future, the material can be used for each switching portion 6. The switching between the low-resistance state and the high-resistance state with changes in temperature often depends on CVW transitions or superconducting transitions in organic conductors. Often having a large difference in electric resistivity between the low-resistance state and the high-resistance state, the switching element in accordance with this modification can be used not only in a memory circuit but also in a logic circuit. If the electric conductivity varies due to CDW transitions, the variation in electric conductivity is caused by the crystal orientation. In such a case, a single-crystal material should be used for the switching portion, and attention should be paid to the single-crystal orientation.

(Modification 21)

In each of the integrated circuits of the first and second embodiments and the modifications, a $V_2O_3$ material is used as the material of each switching portion 6. However, it is also possible to employ such a material that causes CDW transitions and has electric conductivity rapidly varying with temperature. CDW transition materials that can be put into practical use include the above described organic conductors or 1T-TaTisSe materials, but there should be many yet to be discovered. If a CDW transition material that has a 10-fold or more difference in resistance between the low-resistance state and the high-resistance state is discovered in the future, the material can also be used as the material for the switching portion 6. However, a CDW transition material is often a low-dimensional material that easily causes nesting on the Fermi surface. In such a case, it is necessary to use an epitaxial film or a highly-orientated film, as in the case of Modification 20.

Often having a large difference in electric resistivity between the low-resistance state and the high-resistance state, the switching element in accordance with this modification can be used not only in a memory circuit but also in a logic circuit.

(Modification 22)

In each of the integrated circuits of the first and second embodiments and the modifications, a $V_2O_3$ material is used as the material of each switching portion 6. However, it is also possible to employ a Mott transition material that causes Mott transitions and has electric conductivity rapidly varying with temperature. Mott transition materials that can be put into practical use include the above described $V_2O_3$ materials, but there should be many yet to be discovered. If a Mott transition material that has a 10-fold or more difference in resistance between the low-resistance state and the high-resistance state is discovered in the future, the material can also be used as the material for the switching portion 6. Often having a large difference in electric resistivity between the low-resistance state and the high-resistance state, the switching element in accordance with this modification can be used not only in a memory circuit but also in a logic circuit.

(Modification 23)

In the first embodiment, the composition, $(V_{0.9285}Cr_{0.0115})_2O_3$, which has the boundary temperature between the low-resistance state and the high-resistance state in the neighborhood of room temperature, is used as the material for the switching portion 6. The composition, $(V_{0.9385}Cr_{0.0115}Ti_{0.05})_2O_3$, which is considered to be in the same material group as the above electric switching material but is in a metallic state over a wide temperature range in the neighborhood of room temperature, is used as the material for the electrodes 6a and 6b of the switching portion 6. This arrangement in which the switching portion 6 and the electrodes 6a and 6b are formed with materials of the same group can be used together with the materials shown in Modifications 9 through 18. For example, the electric resistance can be lowered by adding 5 atomic % or less of Nb, La, Sn, or Ce to $Ba_{0.999-x}Sr_xCe_{0.001}TiO_3$ ($0.3 \leq x \leq 0.4$), which is mentioned in Modification 18, through ion implantation or the like. In this manner, the material can be used for the electrodes 6a and 6b.

In a case where the switching portion 6 is operated as described in Modifications 3, 5, 6, and 8, the composition of the switching portion 6 is changed so as to change the operating temperature of the integrated circuit. Likewise, the electrodes 6a and 6b can be in a metallic state at an operating temperature of the integrated circuit adjusted by the same composition control as above.

The material of the electrodes 6a and 6b of the switching portion 6 is not necessarily a material of the same group as the material of the switching portion 6, but may be a metal oxide such as $BaTiNbO_3$, $RuO_2$, $SrRuO_3$, or $ReO_3$, an alloy material such as TiN, ZrN, HfN, $FeS_2$, or $CuS_2$, or a single metal material such as Al, Cu, Ru, Ir, or Pt.

In each of the embodiments of the present invention and the modifications, the necessary requirement for the electrodes 6a and 6b of the switching portion 6 is high electric conductivity, and a metal material other than those mentioned in the embodiments and Modifications may be employed.

(Modification 24)

As the material for the electrodes 10 and 12 of the Peltier element 13 used in the integrated circuit in any of the first and second embodiments and the modifications, the same material as or a similar material to the material of the electrodes 6a and 6b of the switching portion 6 described in Modification 23 may be employed. Alternatively, a different electrode material from the material of the electrodes 6a and 6b of the switching portion 6 described in Modification 23 may be employed, or a metal material not mentioned in Modification 23 may be employed.

The process for forming the electrodes can be advantageously simplified, if the material of the electrodes 10 and 12 of the Peltier element 13 is the same as or similar to the material of the electrodes 6a and 6b of the switching portion 6. On the other hand, if different materials are employed, the optimum material can be selected for the properties of each object to be connected.

(Modification 25)

In some of the integrated circuits of the first and second embodiments and the modifications, AlN is used as the heat conducting/electric insulating film 8 that is made of a material with high heat conductivity and low electric conductivity and is provided between the switching portion 6 and the Peltier element 13. Examples of other materials with high heat conductivity and low electric conductivity include BN, diamond, $Si_3N_4$, and $Al_2O_3$, in addition of AlN. In each of the embodiments of the present invention and the modifications, the material with high heat conductivity and low electric conductivity to be used as the heat conducting/electric insulating film 8 should preferably have similar functions to those of the gate insulating film in a FET, and should preferably be thin to achieve higher heat efficiency. However, an increase in leakage current is undesirable. Although the material of the heat conducting/electric insulating film 8 should have high heat conductivity and less leakage current like the gate insulating film in a FET, it differs from the gate insulating film in that the priorities are given not only to the interface with the switching material and its vicinity. Accordingly, the material of the heat conducting/electric insulating film 8 is more advantageous, being less restrictive on scaling.

(Modification 26)

In some of the integrated circuits of the first and second embodiments and the modifications, $SiO_2$ is used for the interlayer insulating film 16. However, a material with a small impurity diffusion coefficient is preferred. For example, the $V_2O_3$ material described in the first embodiment is expected not to change its composition over a long period of time, as compositions with various ratios with respect to oxygen can be employed. In this aspect, each of the embodiments of the present invention and the modifications has fewer problems than an OUM memory that melts the material to form a crystalline state and an amorphous state and utilizes the difference in electric resistance between the two states. In each of the embodiments and the modifications of the present invention, much gentler operating principles are employed to utilize Mott transitions, CDW transitions, or superconduction transitions that are merely phase transitions in an electron system.

Meanwhile, if scaling becomes advanced in the interlayer insulating film, the induction current between wires becomes a problem, as in a FET. In the integrated circuit of each of the embodiments of the present invention and the modifications, however, a porous interlayer insulating film cannot readily be employed to lower the relative permittivity and reduce the induction current, for the above described reasons. Instead, high-temperature thermal treatment is not necessary in each of the embodiments of the present invention and the modifications. Accordingly, an organic material with low relative permittivity can be employed as the means to counter the problem.

Third Embodiment

A method for manufacturing an integrated circuit in accordance with a third embodiment of the present invention is now described. As in the first embodiment, the integrated circuit includes cells arranged in a matrix fashion, and each of the cells has a switching element. The manufacturing method in accordance with this embodiment differs from the manufacturing method in accordance with the first embodiment in that each switching element is produced without a high-temperature process.

Figure 28A:
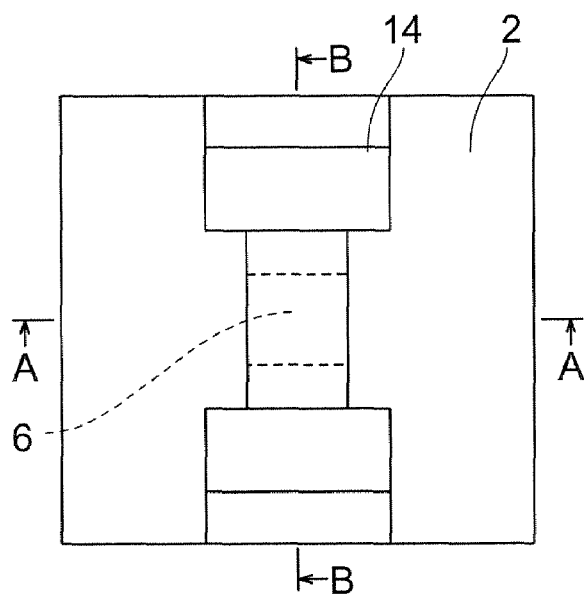
FIGS. 28A through 28C illustrate a procedure for manufacturing an integrated circuit in accordance with a third embodiment of the present invention.
Figure 28B:
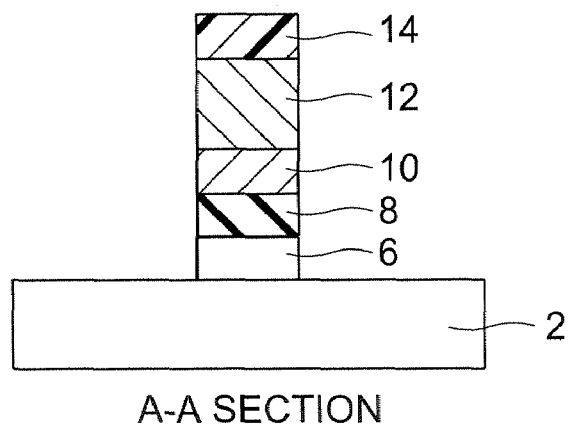
Figure 28C:
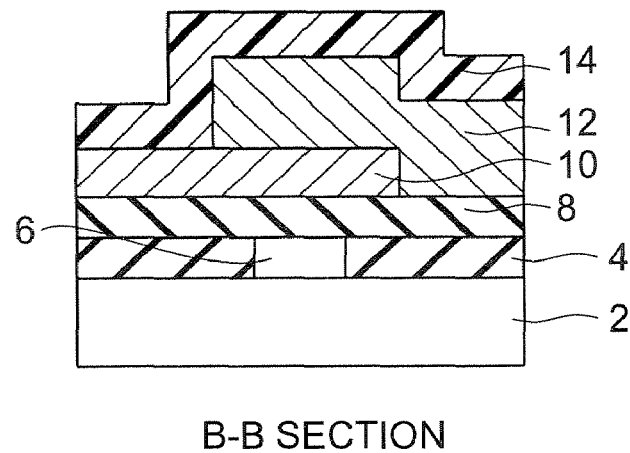

As shown in FIGS. 2A and 2B, a $(V_{0.9885}Cr_{0.0115})_2O_3$ film of 10 nm in thickness, for example, is formed as the material for a switching portion 6 on a single-crystal Si substrate 2 having a device isolating region 4 formed thereon. The film is then smoothened by CMP (see FIGS. 3A and 3B). An AlN film of 3 nm in thickness, for example, is then formed as a heat conducting/electric insulating film 8 on the $(V_{0.9885}Cr_{0.0115})_2O_3$ film 6 (see FIGS. 4A and 4B). An electrode film of 10 nm in thickness to be an n-type Peltier electrode 10 is formed on the AlN film 8. The electrode film is patterned to form the Peltier electrode 10 (see FIGS. 5A, 5B, and 5C). An electrode film of 5 nm in thickness to be a p-type Peltier electrode 12 is then formed to cover the Peltier electrode 10. The electrode film is patterned so as to form the Peltier electrode 12 (FIGS. 6A, 6B, and 6C). A mask pattern is then formed over the Peltier electrodes 10 and 12. Using this mask pattern 14, patterning is performed on the Peltier electrodes 10 and 12, the heat conducting/electric insulating film 8, the switching portion 6, and the device isolating region 4. Through the patterning, the surfaces of portions of the substrate 2 not covered with the mask pattern 14 are exposed, so that the side faces of the switching portion 6 are exposed (see FIGS. 28A, 28B, and 28C). FIG. 28A is a plan view of the structure of this embodiment. FIG. 28B is a cross-sectional view of the structure, taken along the line A-A of FIG. 28A. FIG. 28C is a cross-sectional view of the structure, taken along the line B-B of FIG. 28A.

Figure 29A:
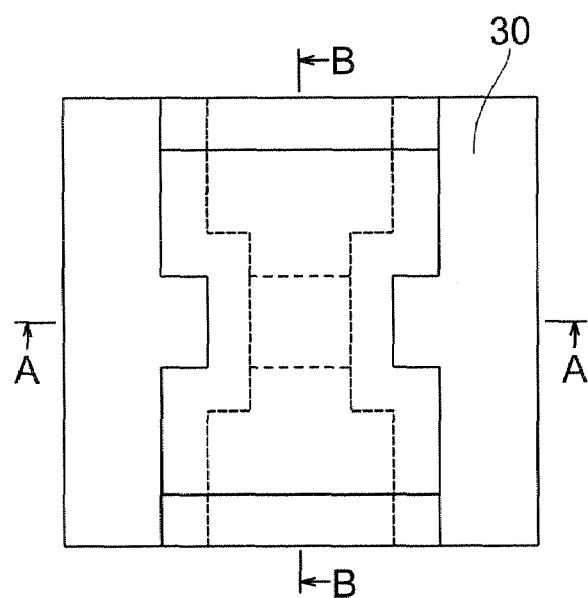
FIGS. 29A through 29C illustrate a procedure for manufacturing an integrated circuit in accordance with the third embodiment of the present invention.
Figure 29B:
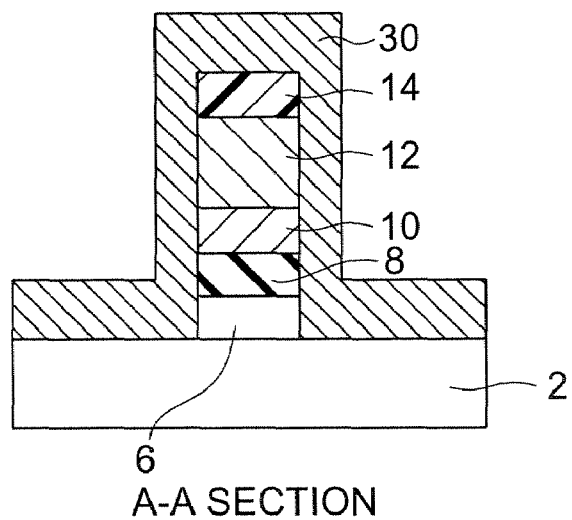
Figure 29C:
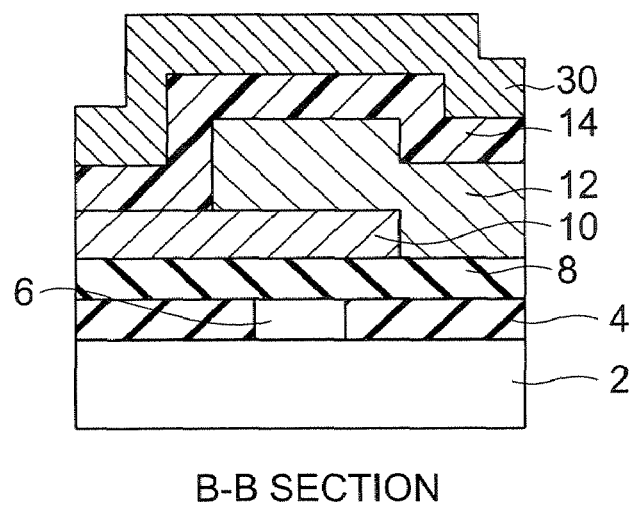

An electrode 30 made of $RuO_2$, for example, is formed and is connected to the exposed side faces of the switching portion 6 (see FIGS. 29A, 29B, and 29C). FIG. 29A is a plan view of the structure at this stage of manufacturing. FIG. 29B is a cross-sectional view of the structure, taken along the line A-A of FIG. 29A. FIG. 29C is a cross-sectional view of the structure, taken along the line B-B of FIG. 29A.

Figure 30A:
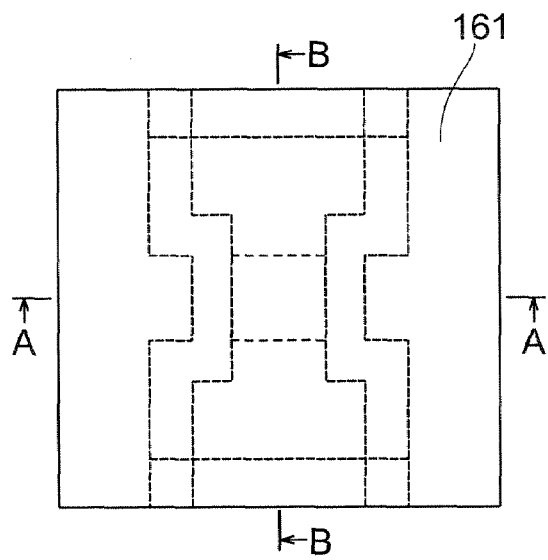
FIGS. 30A through 30C illustrate a procedure for manufacturing an integrated circuit in accordance with the third embodiment of the present invention.
Figure 30B:
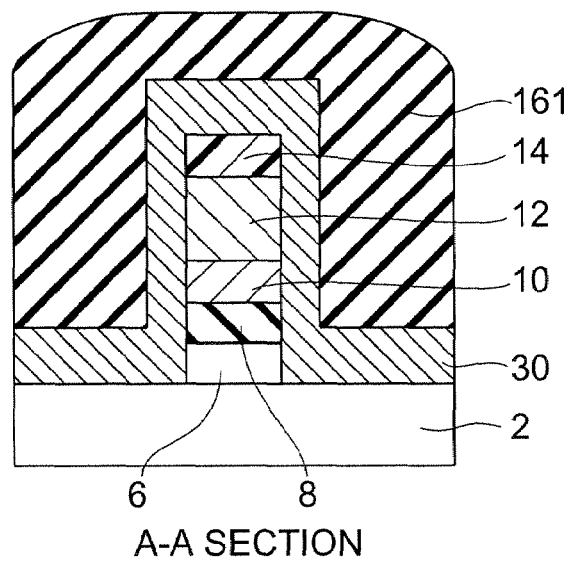
Figure 30C:
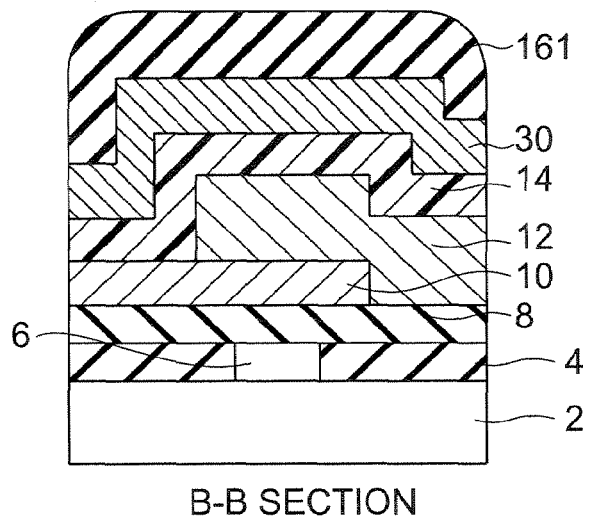
Figure 31A:
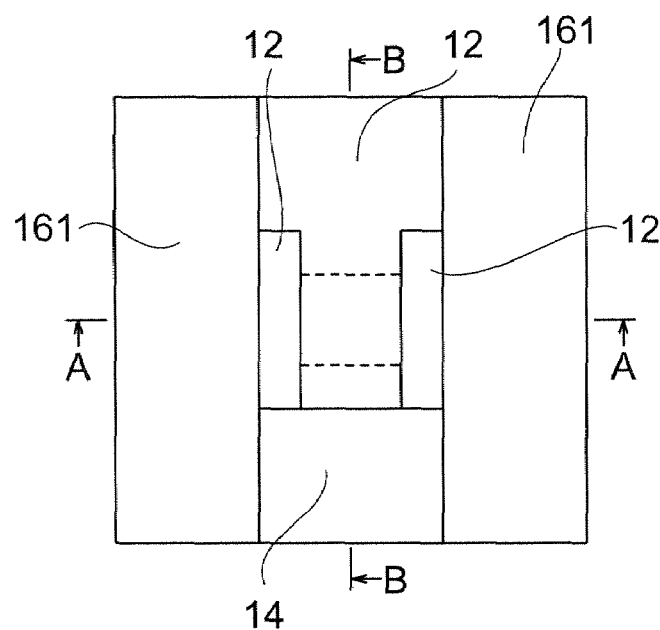
FIGS. 31A through 31C illustrate a procedure for manufacturing an integrated circuit in accordance with the third embodiment of the present invention.
Figure 31B:
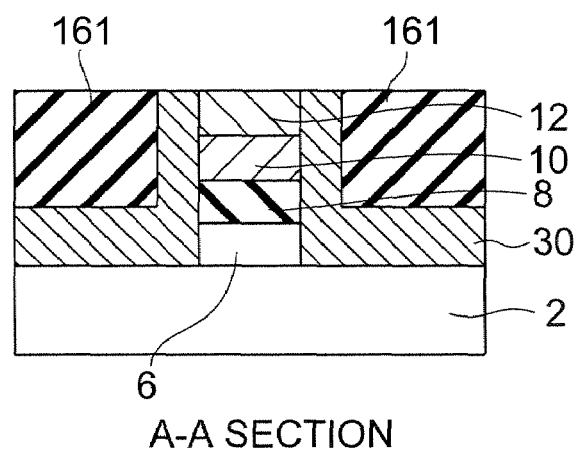
Figure 31C:
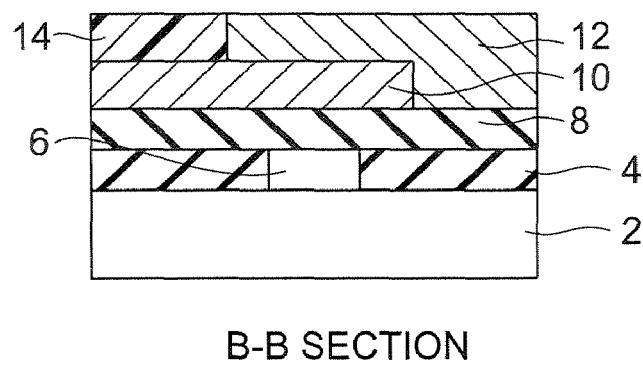

A smoothening film 161 is then formed on the entire surface of the substrate 2 (see FIGS. 30A, 30B, and 30C), and the smoothening film 161 is smoothened by CMP until the surface of the Peltier electrode 12 is exposed (see FIGS. 31A, 31B, and 31C). FIG. 30A is a plan view of the structure at this stage of manufacturing. FIG. 30B is a cross-sectional view of the structure, taken along the line A-A of FIG. 30A. FIG. 30C is a cross-sectional view of the structure, taken along the line B-B of FIG. 30A. FIG. 31A is a plan view of the structure at this stage of manufacturing. FIG. 31B is a cross-sectional view of the structure, taken along the line A-A of FIG. 31A. FIG. 31C is a cross-sectional view of the structure, taken along the line B-B of FIG. 31A. The smoothening is not essential, but it is preferred as the device structure becomes simpler.

Figure 32A:
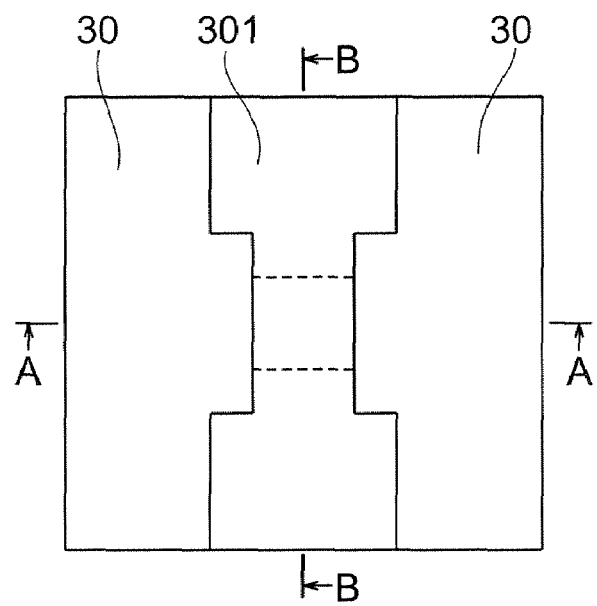
FIGS. 32A through 32C illustrate a procedure for manufacturing an integrated circuit in accordance with the third embodiment of the present invention.
Figure 32B:
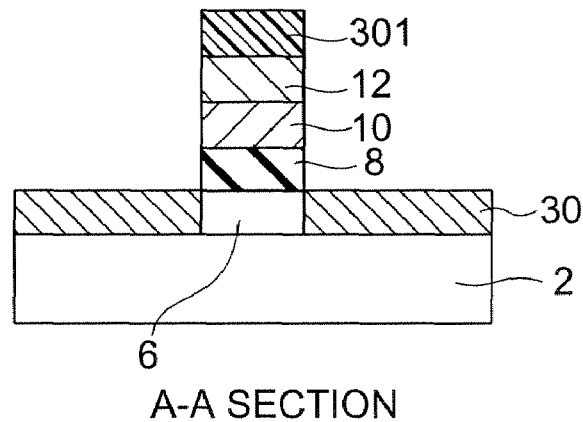
Figure 32C:
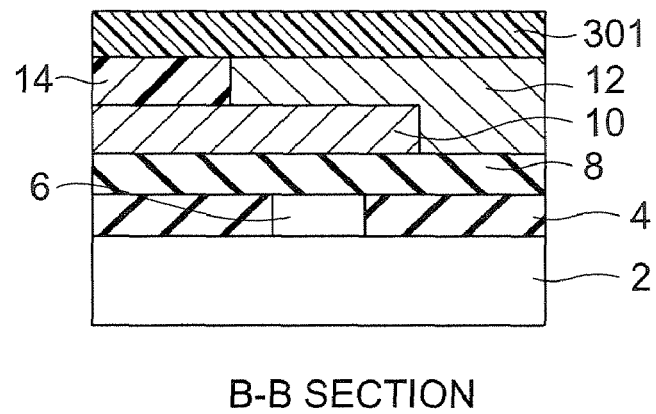

After a mask pattern 301 is formed, etching is performed on the electrode 30 and the smoothening film 161, using the mask pattern 301. Through the etching, the electrode 30 made of $RuO_2$ adhering to the peripheral region of the Peltier element is removed, so that the electrode 30 made of $RuO_2$ does not come into electric contact with the Peltier element (see FIGS. 32A, 32B, and 32C). The mask pattern 301 has a smaller area for the Peltier element than in that of the mask pattern 14, so that mask misalignment can be absorbed. FIG. 32A is a plan view of the structure at this stage of manufacturing. FIG. 32B is a cross-sectional view of the structure, taken along the line A-A of FIG. 32A. FIG. 32C is a cross-sectional view of the structure, taken along the line B-B of FIG. 32A.

Figure 33A:
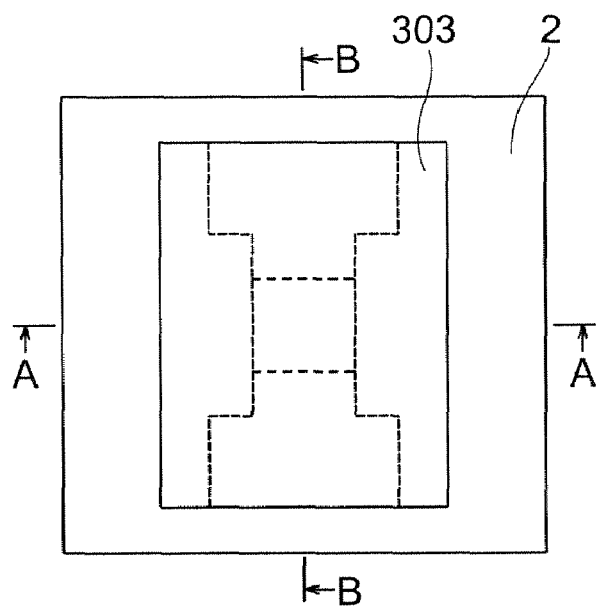
FIGS. 33A through 33C illustrate a procedure for manufacturing an integrated circuit in accordance with the third embodiment of the present invention.
Figure 33B:
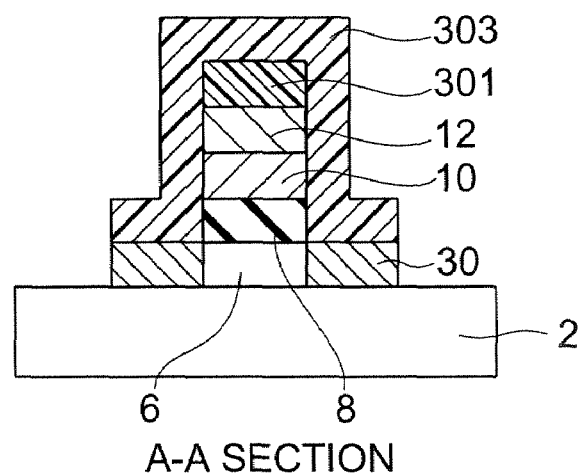
Figure 33C:
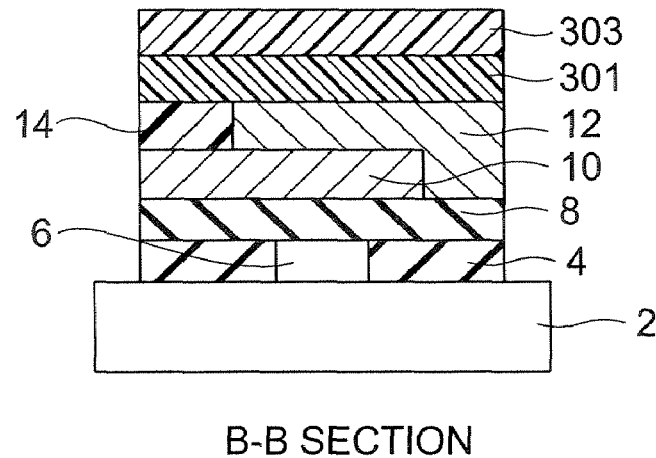

After a mask pattern 303 is formed, etching using the mask pattern 303 is performed on the electrode 30. Through the etching, the switching elements are separated from one another (see FIGS. 33A, 33B, and 33C). Before the mask pattern 303 is formed, the mask pattern 301 may be removed. FIGS. 33A, 33B, and 33C show an example case where the mask pattern 301 is not removed. FIG. 33A is a plan view of the structure at this stage of manufacturing. FIG. 33B is a cross-sectional view of the structure, taken along the line A-A of FIG. 33A. FIG. 33C is a cross-sectional view of the structure, taken along the line B-B of FIG. 33A.

Figure 34A:
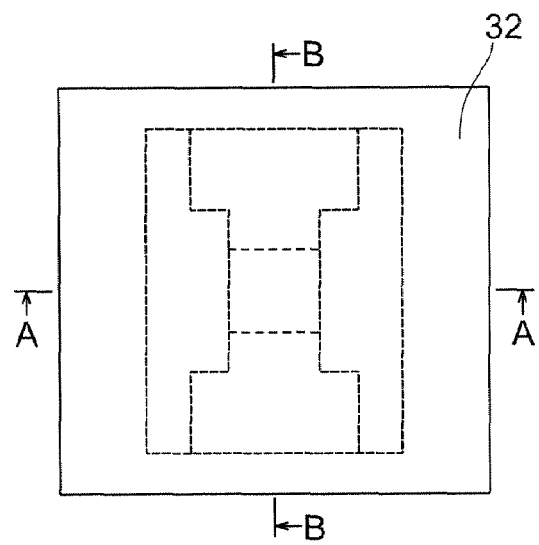
FIGS. 34A through 34C illustrate a procedure for manufacturing an integrated circuit in accordance with the third embodiment of the present invention.
Figure 34B:
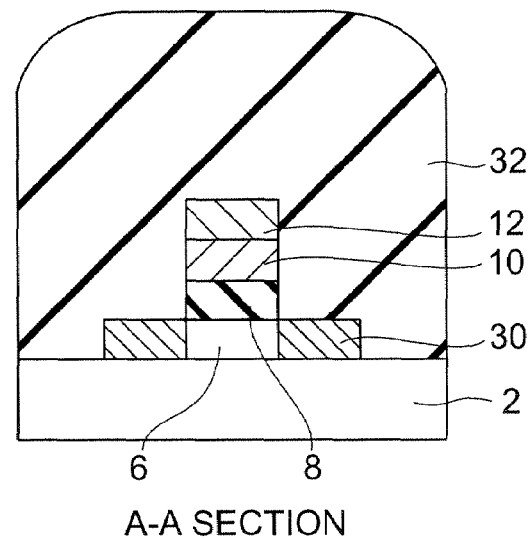
Figure 34C:
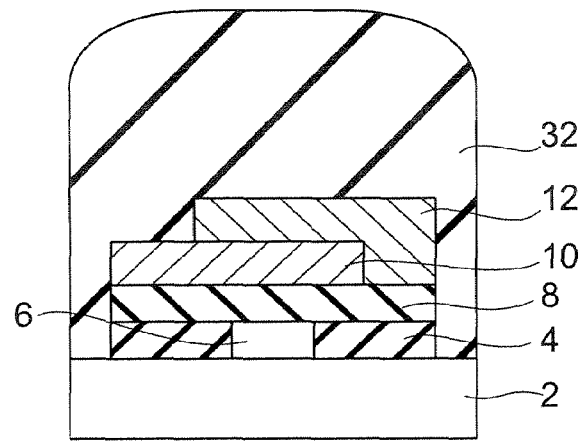

The mask pattern 14, the mask pattern 301, and the mask pattern 303 are then removed. This mask pattern removal is not essential, but becomes necessary if the etching damage adversely affects the performance of the element. After the mask patterns are removed, an interlayer insulating film (a protection film) 32 is formed on the entire surface of each element (see FIGS. 34A, 34B, and 34C). FIG. 34A is a plan view of the structure at this stage of manufacturing. FIG. 34B is a cross-sectional view of the structure, taken along the line A-A of FIG. 34A. FIG. 34C is a cross-sectional view of the structure, taken along the line B-B of FIG. 34A.

Figure 35A:
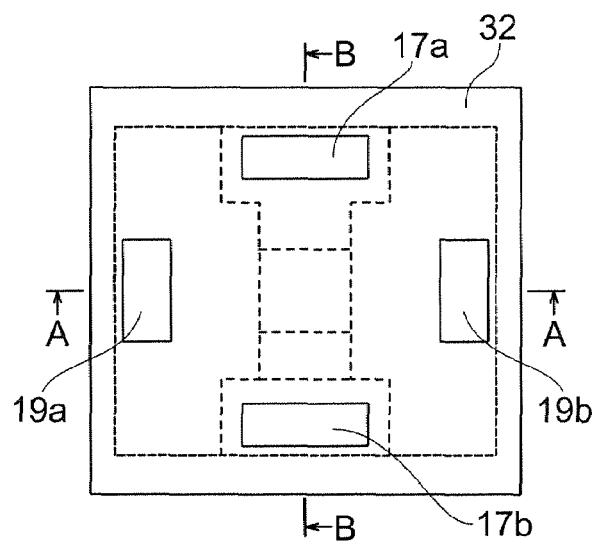
FIGS. 35A through 35C illustrate a procedure for manufacturing an integrated circuit in accordance with the third embodiment of the present invention.
Figure 35B:
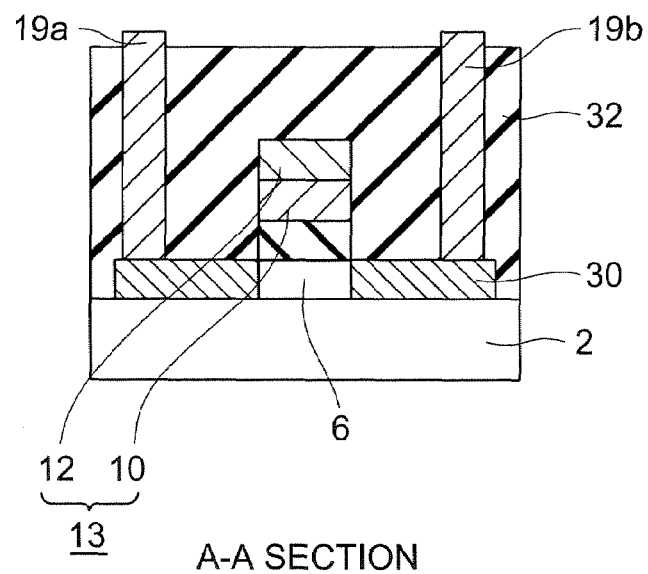
Figure 35C:
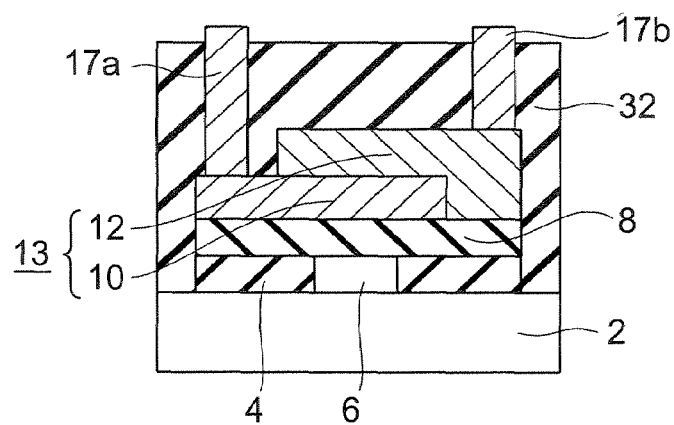

The interlayer insulating film (the protection film) 32 is then smoothen on the entire surface of the substrate 2 by CMP. The smoothening is not essential, but is preferable in a case where large irregularities on the device surface cause difficulties in the later wiring process. Contacts 17a and 17b to be connected to the Peltier electrodes 10 and 12 are then formed, and contact electrodes 19a and 19b to be connected to the electrode 30 are then formed, thereby completing the switching element (see FIGS. 35A, 35B, and 35C). FIG. 35A is a plan view of the structure at this stage of manufacturing. FIG. 35B is a cross-sectional view of the structure, taken along the line A-A of FIG. 35A. FIG. 35C is a cross-sectional view of the structure, taken along the line B-B of FIG. 35A.

By the manufacturing method of this embodiment, there is not a necessary process that requires high temperature. Accordingly, materials that become unstable when subjected to high-temperature heating treatment can be employed. Also, the switching element 6 and the electrode 30 in contact with the switching element 6 can be made of different materials from each other. Instead of the above described materials, those employed in Modifications 9 through 26 may also be employed.

Fourth Embodiment

Next, a method for manufacturing an integrated circuit in accordance with a fourth embodiment of the present invention is described. Like the integrated circuit in the first embodiment the integrated circuit to be manufactured by the manufacturing method of this embodiment includes cell arranged in a matrix fashion, and each of the cells has a switching element. Each switching element to be produced by the manufacturing method in accordance with this embodiment is designed to contain a Peltier element. In this embodiment, a structure in which one of the two electrodes connected to each switching element has the same potential among all the switching elements can be easily produced. However, it should be obvious to those skilled in the art to figure out the method for producing a structure in which one of the two electrodes connected to each switching element does not have the same potential among all the switching elements.

Figure 36A:
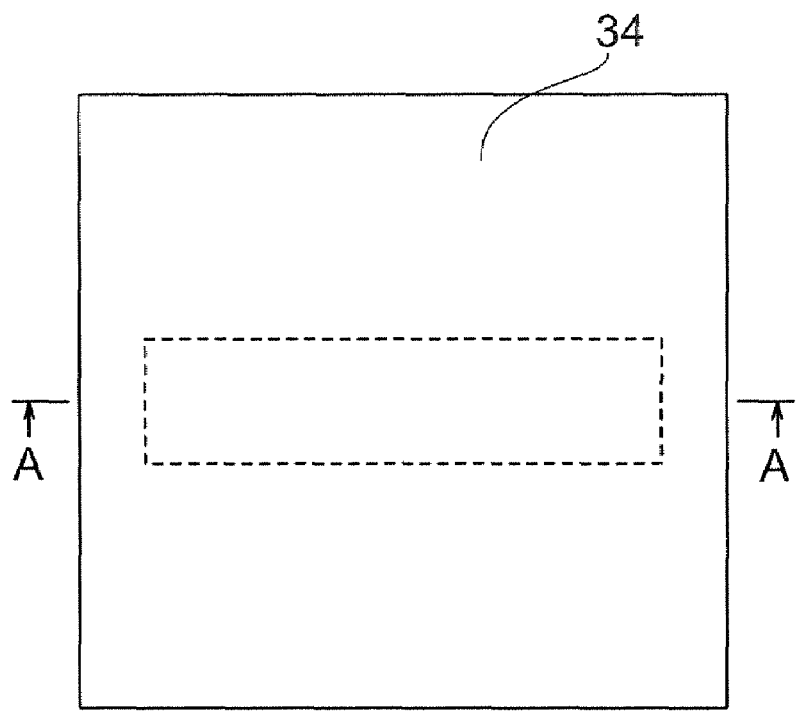
FIGS. 36A and 36B illustrate a procedure for manufacturing an integrated circuit in accordance with a fourth embodiment of the present invention.
Figure 36B:
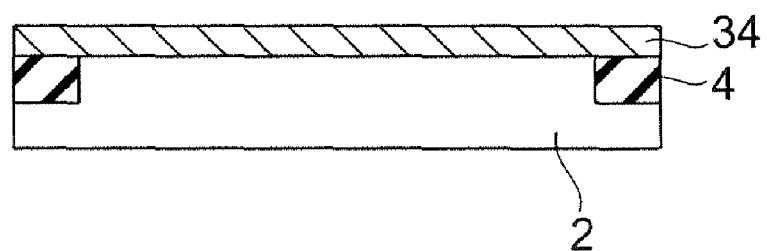

After a device isolating region 4 is formed on a substrate 2 by STI (Shallow Trench Insulation) or the like, a $(V_{0.9}Ti_{0.1})_2O_3$ film 34 of 5 nm in thickness is formed as a film to be a lower electrode of each switching element (see FIGS. 36A and 36B). FIG. 36A is a plan view of the structure at this stage of manufacturing. FIG. 36B is a cross-sectional view of the structure, taken along the line A-A of FIG. 36A. The device isolating region 4 in this embodiment serves to reduce thermal interference between the neighboring elements. The formation of such a device isolating region in the substrate is advantageous in other embodiments, but it is not essential as it adds to the production costs.

Figure 37A:
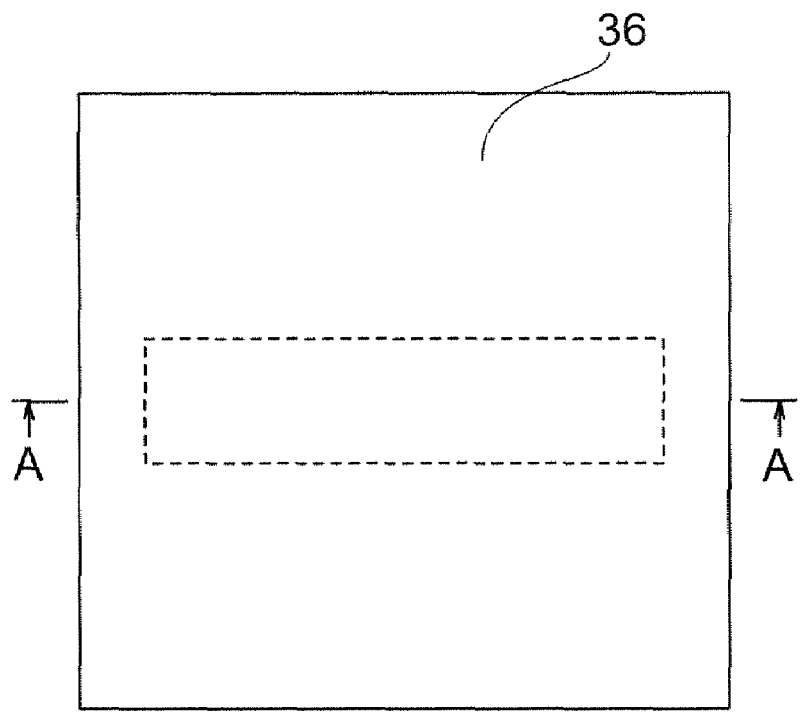
FIGS. 37A and 37B illustrate a procedure for manufacturing an integrated circuit in accordance with the fourth embodiment of the present invention.
Figure 37B:
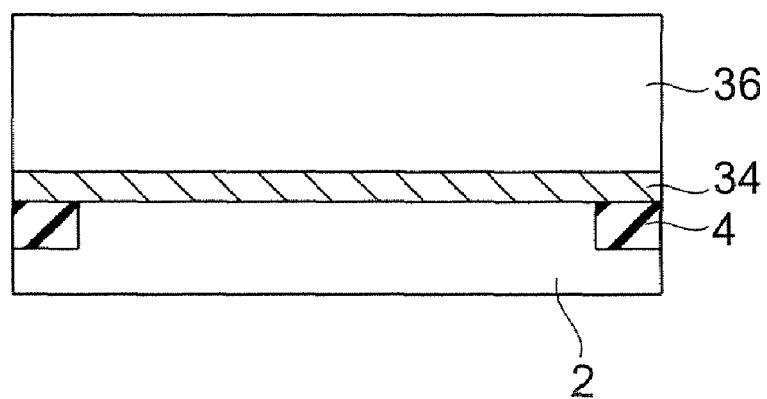

A $(V_{0.9865}Cr_{0.0135})_2O_3$ film 36 of 50 nm in thickness is then formed as a film to be the switching portion on the entire surface of the substrate 2 (see FIGS. 37A and 37B). FIG. 37A is a plan view of the structure at this stage of manufacturing. FIG. 37B is a cross-sectional view of the structure, taken along the line A-A of FIG. 37A.

Figure 38A:
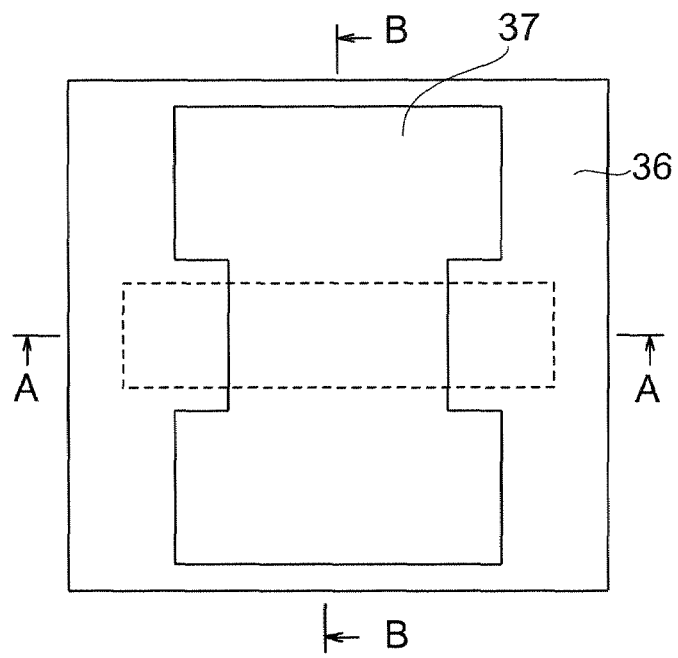
FIGS. 38A through 38C illustrate a procedure for manufacturing an integrated circuit in accordance with the fourth embodiment of the present invention.
Figure 38B:
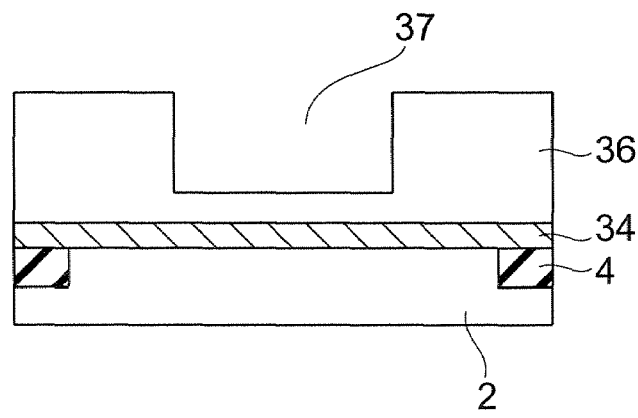
Figure 38C:
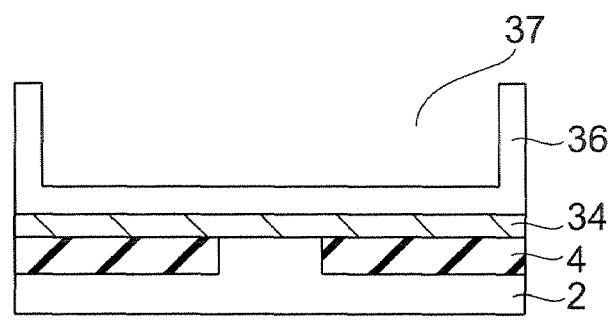

As shown in FIGS. 38A, 38B, and 38C, etching is then performed on the film 36 to be the switching portion, so as to form a concavity 37 of 40 nm in depth. FIG. 38A is a plan view of the structure at this stage of manufacturing. FIG. 38B is a cross-sectional view of the structure, taken along the line A-A of FIG. 38A. FIG. 38C is a cross-sectional view of the structure, taken along the line B-B of FIG. 38A.

Figure 39A:
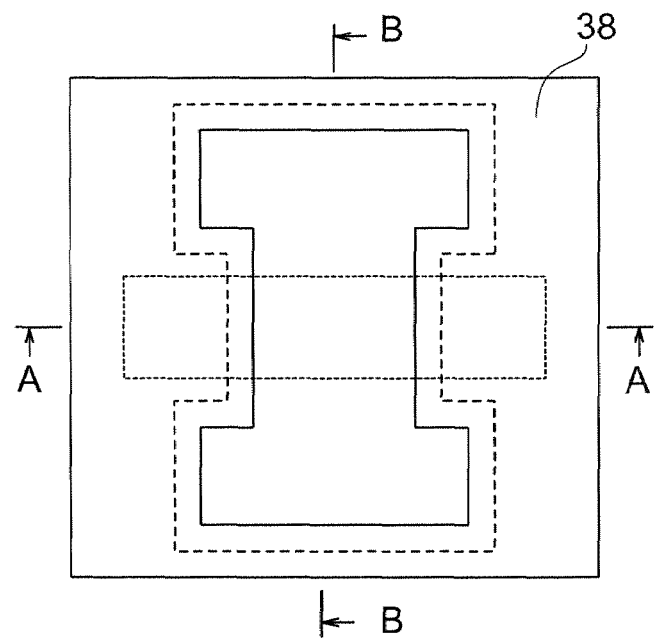
FIGS. 39A through 39C illustrate a procedure for manufacturing an integrated circuit in accordance with the fourth embodiment of the present invention.
Figure 39B:
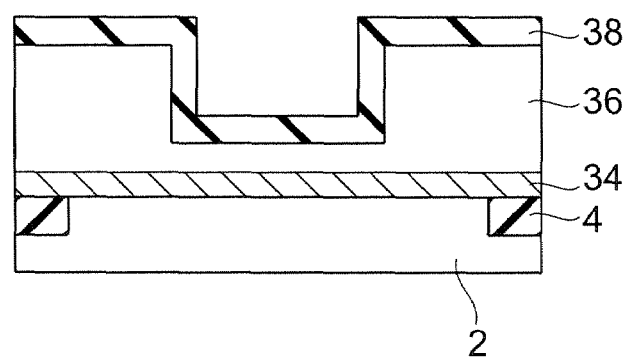
Figure 39C:
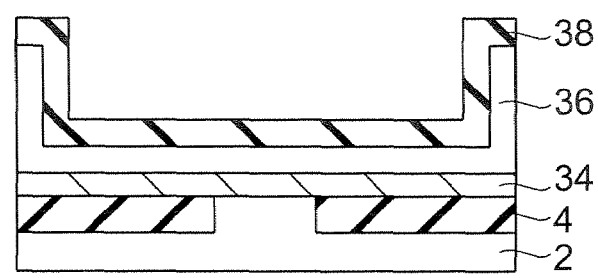
Figure 40A:
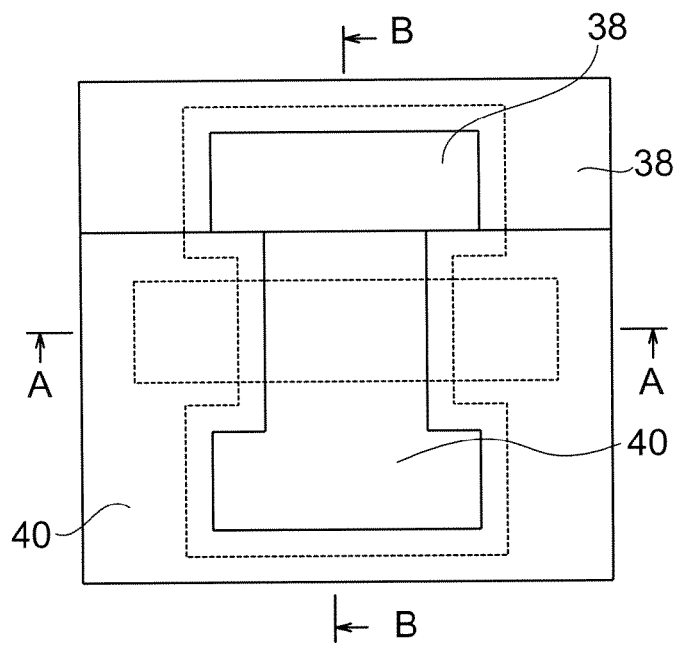
FIGS. 40A through 40C illustrate a procedure for manufacturing an integrated circuit in accordance with the fourth embodiment of the present invention.
Figure 40B:
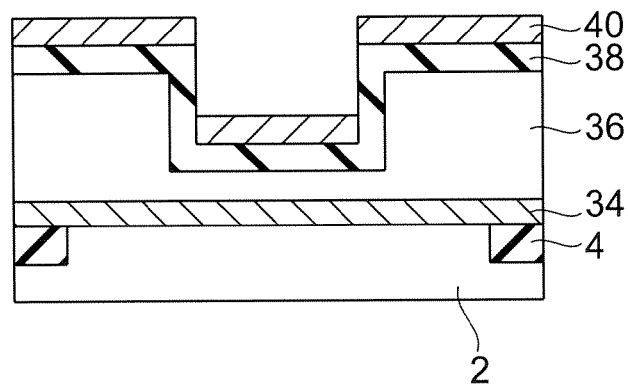
Figure 40C:
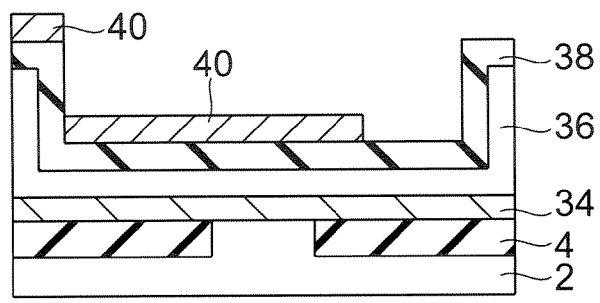

Next, an AIN film 38 of 5 nm in thickness is formed as a heat conducting/electric insulating film (see FIGS. 39A, 39B, and 39C). After an electrode film 40 to be the Peltier electrode of a first polarity is formed with a thickness of 10 nm, patterning is performed to form the Peltier electrode 40 (see FIGS. 40A, 40B, and 40C). The formation of the Peltier electrode 40 is carried out by such a film forming method as a collimate sputtering method, a low-gas-pressure sputtering method, a long throw sputtering method, a self sputtering method, a ultrahigh-magnetic-field magnetron sputtering method, or MBE for allowing a long distance between the source and the substrate. By any of those methods, film formation can be carried out so that the Peltier electrode 40 is hardly brought into contact with the side faces of the step portions shown in FIGS. 40A, 40B, and 40C. Even if a tiny portion of the Peltier electrode 40 adheres to the step portions, its influence on the functions of the device is very small. Therefore, any of the above film forming methods is advantageous in simplifying the process. In a case where a thick portion of the Peltier electrode 40 formed by a film forming method other than the above described ones sticks to the side faces of the step portions, a process for removing the portion of the Peltier electrode 40 from the side faces of the step portions can be added, which should be obvious to those skilled in the art. For example, in a case where the film of the electrode 30 is in contact with the side faces of the Peltier electrodes 10 and 12 at the time of forming the electrode 30 in contact with the switching portion 6 in the third embodiment, there is the step of removing the portion of the electrode 30 sticking to the side faces of the Peltier electrodes 10 and 12.

In a case where such a film forming method as to prevent the electrode 30 from sticking to the side faces of the step portions in the third embodiment, the manufacturing process can be simplified, which should be obvious those skilled in the art. However, unlike in this embodiment, even a tiny portion sticking to the side faces greatly affects the increase in leakage current in the third embodiment. Therefore, the process described in the third embodiment is more preferable.

Figure 41A:
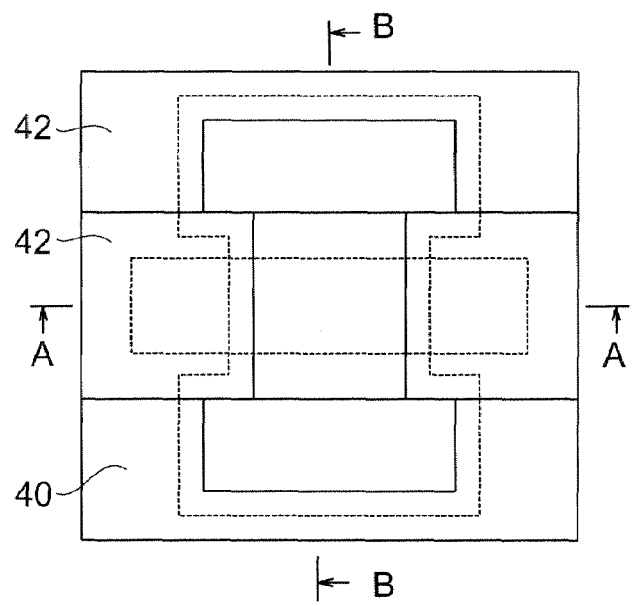
FIGS. 41A through 41C illustrate a procedure for manufacturing an integrated circuit in accordance with the fourth embodiment of the present invention.
Figure 41B:
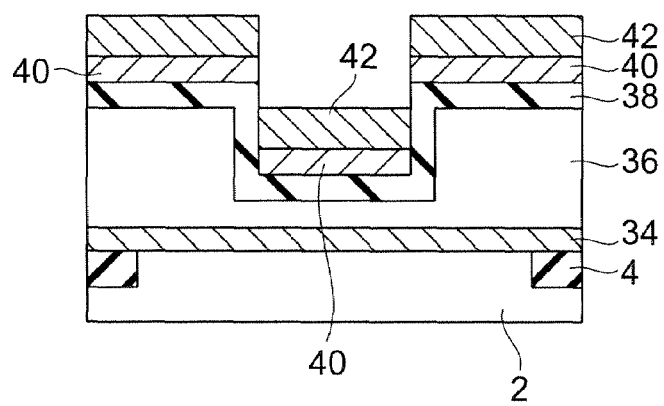
Figure 41C:
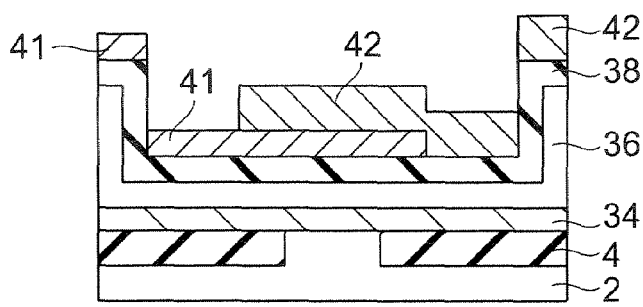

A film 42 to be the Peltier electrode of a second polarity is formed with a thickness of 10 nm by such a film forming method as to prevent the film 42 from sticking to the side faces of the step portions. Patterning is then performed so as to form the Peltier electrode 42 (see FIGS. 41A, 41B, and 41C).

Figure 42A:
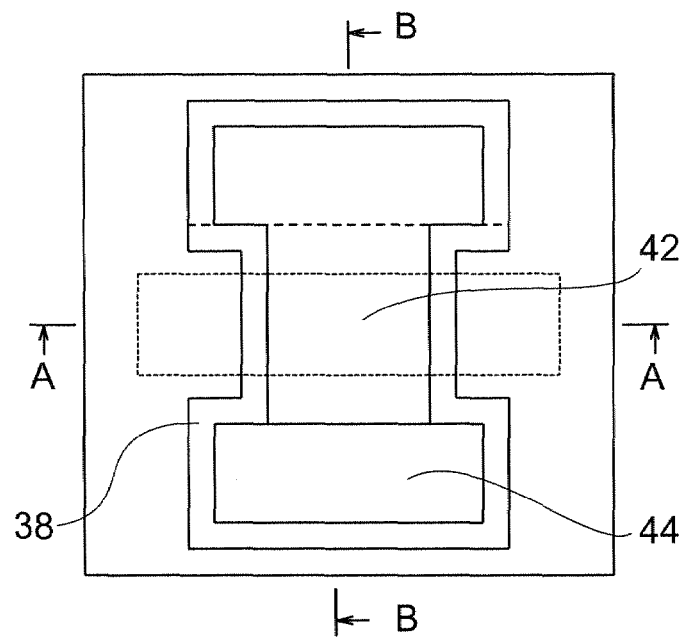
FIGS. 42A through 42C illustrate a procedure for manufacturing an integrated circuit in accordance with the fourth embodiment of the present invention.
Figure 42B:
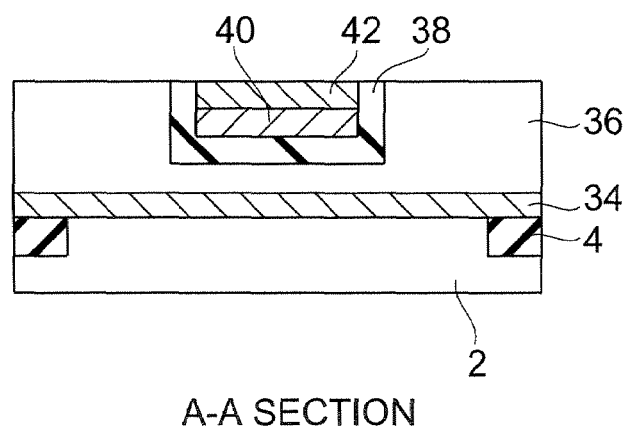
Figure 42C:
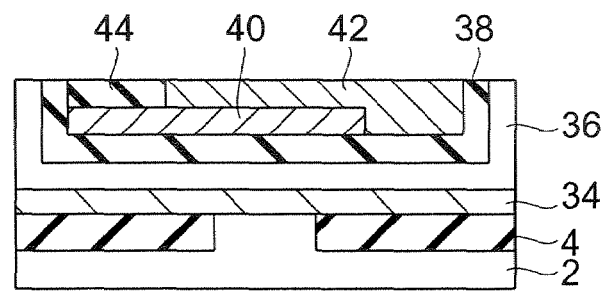
Figure 43A:
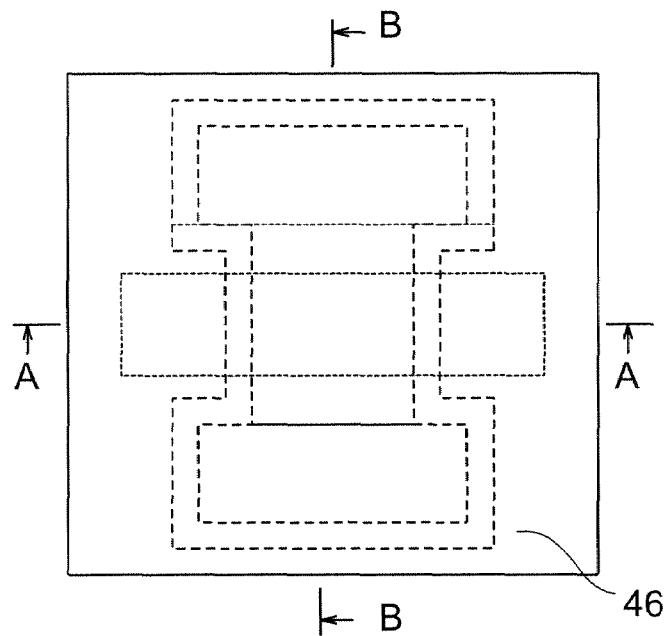
FIGS. 43A through 43C illustrate a procedure for manufacturing an integrated circuit in accordance with the fourth embodiment of the present invention.
Figure 43B:
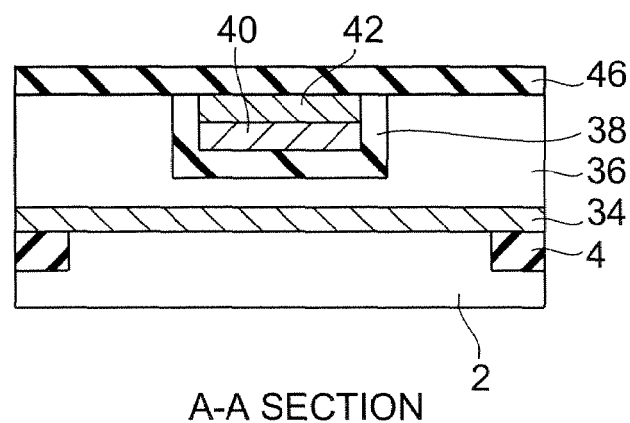
Figure 43C:
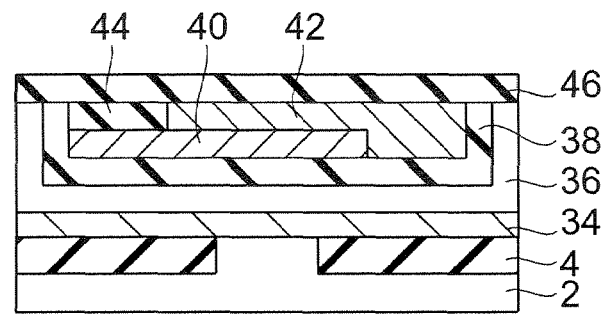
Figure 44A:
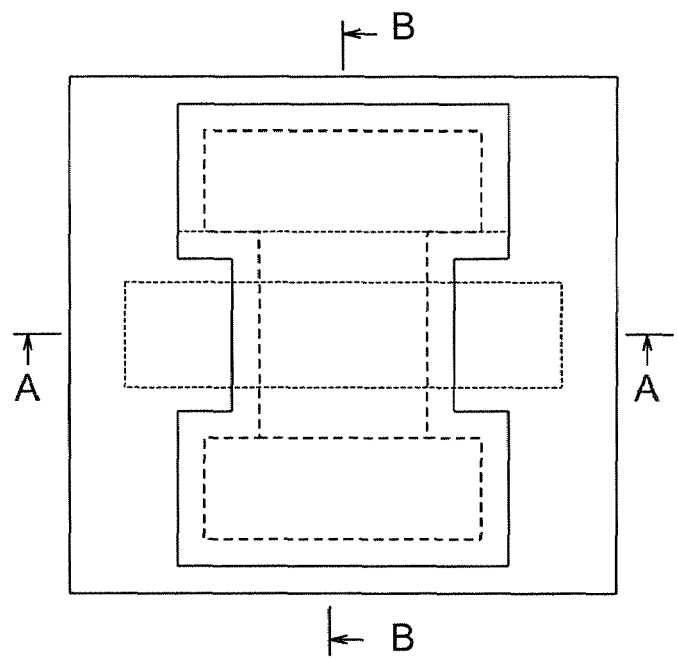
FIGS. 44A through 44C illustrate a procedure for manufacturing an integrated circuit in accordance with the fourth embodiment of the present invention.
Figure 44B:
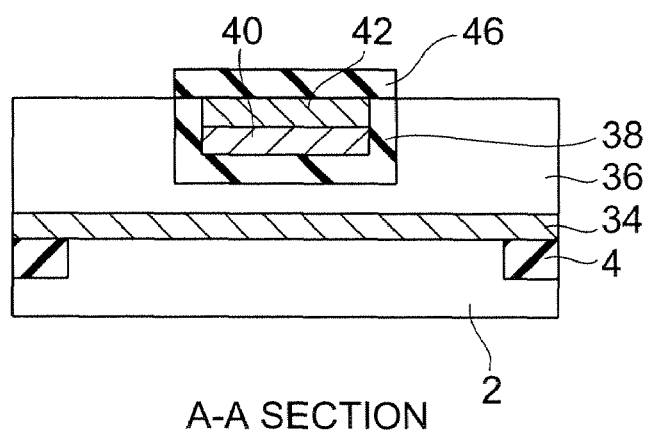
Figure 44C:
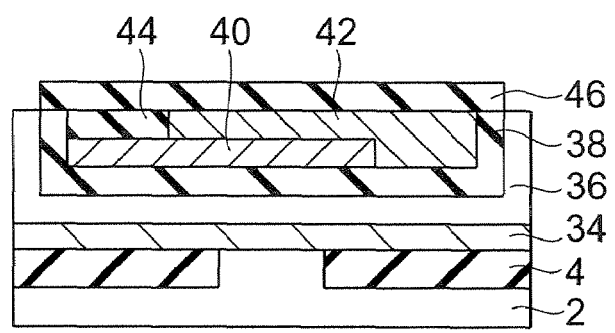

An AIN film 44 as a heat conducting/electric insulating film is formed to fill the concavity. Smoothening is then performed by CMP or the like, so as to expose the $(V_{0.9865}Cr_{0.0135})_2O_3$ film 36 (see FIGS. 42A, 42B, and 42C). An AIN film 46 of 5 nm in thickness is then formed as a heat conducting/electric insulating film on the entire surface of the substrate 2 (see FIGS. 43A, 43B, and 43C). Patterning is then performed on the AIN film 46, so as to expose the $(V_{0.9865}Cr_{0.0135})_2O_3$ film 36 (see FIGS. 44A, 44B, and 44C).

Figure 45A:
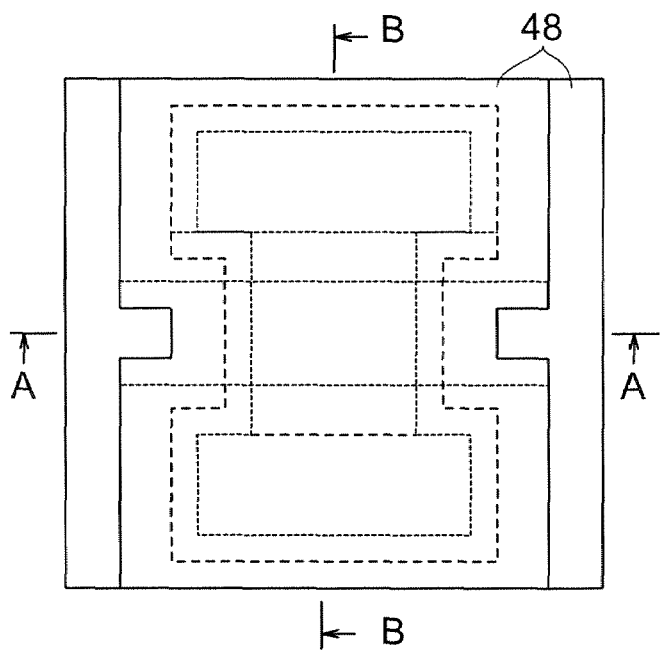
FIGS. 45A through 45C illustrate a procedure for manufacturing an integrated circuit in accordance with the fourth embodiment of the present invention.
Figure 45B:
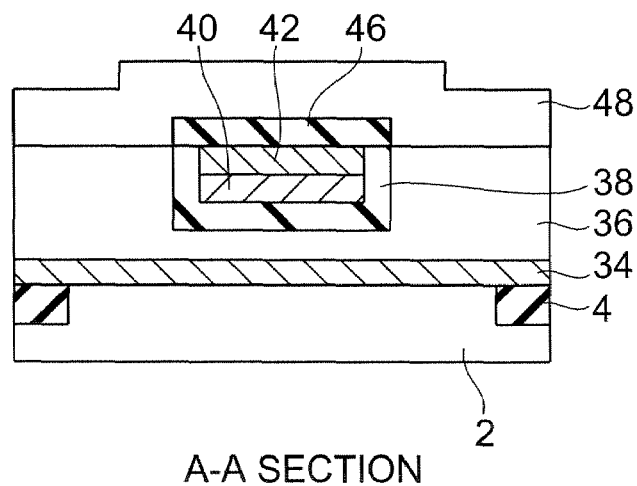
Figure 45C:
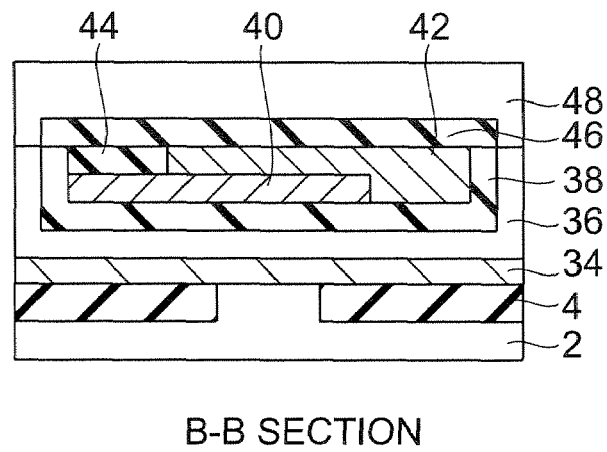
Figure 46A:
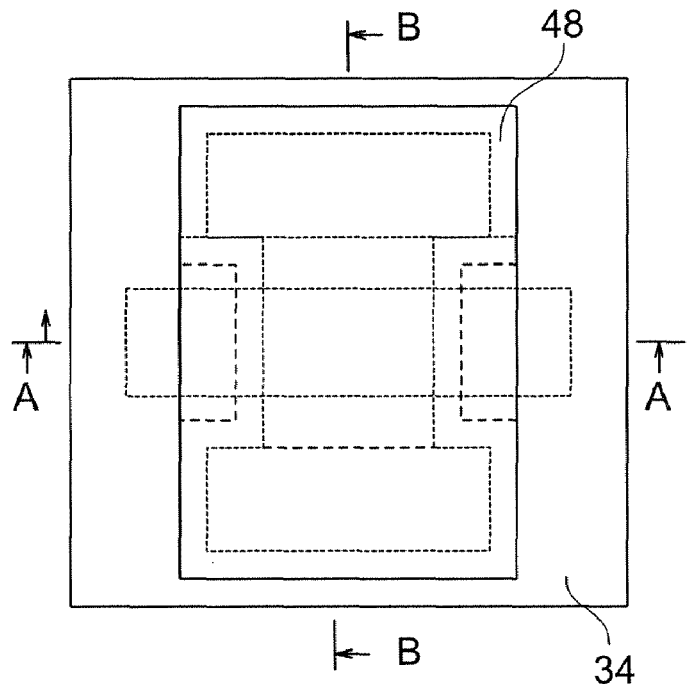
FIGS. 46A through 46C illustrate a procedure for manufacturing an integrated circuit in accordance with the fourth embodiment of the present invention.
Figure 46B:
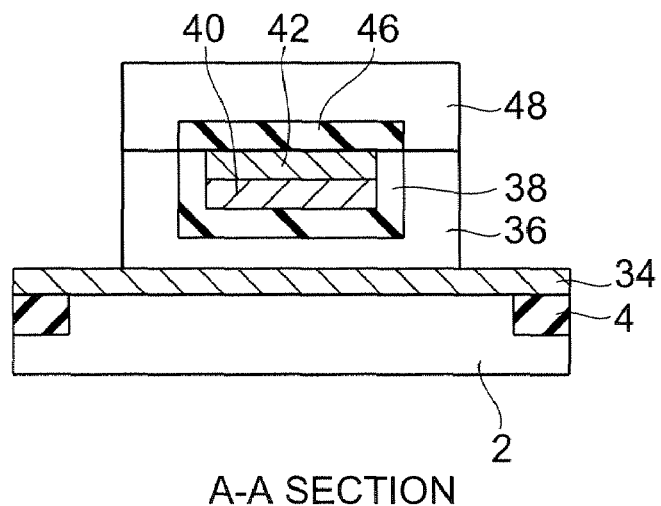
Figure 46C:
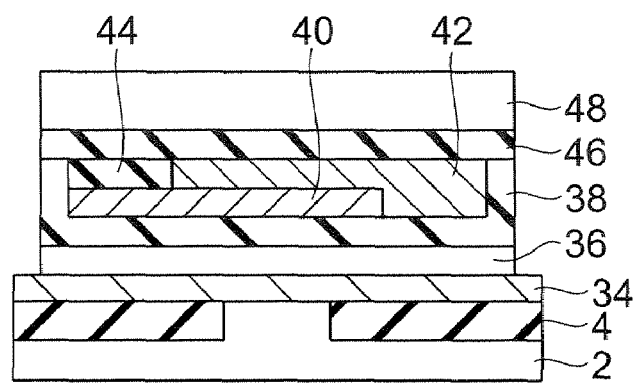
Figure 47A:
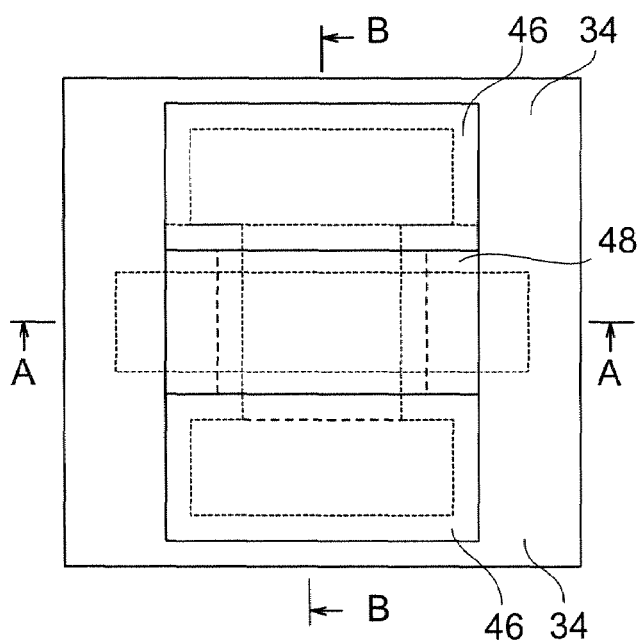
FIGS. 47A through 47C illustrate a procedure for manufacturing an integrated circuit in accordance with the fourth embodiment of the present invention.
Figure 47B:
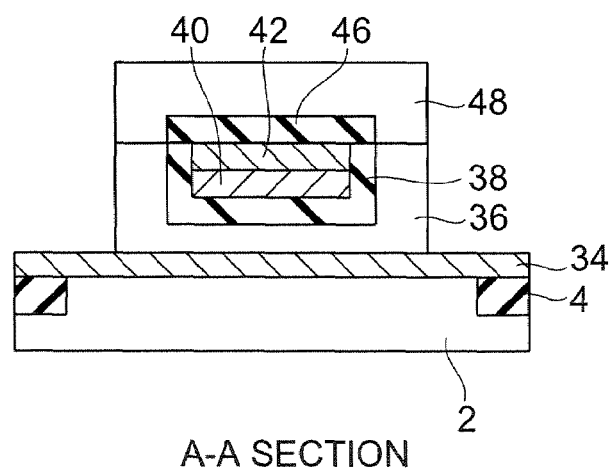
Figure 47C:
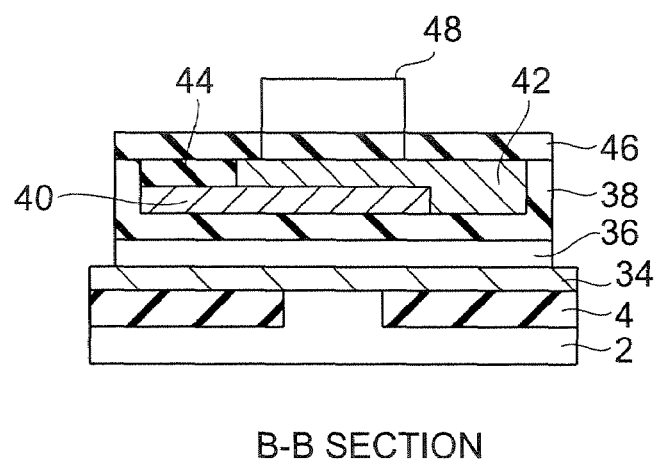

A $(V_{0.9865}Cr_{0.0135})_2O_3$ film 48 is then formed on the entire surface of the substrate (see FIGS. 45A, 45B, and 45C). Patterning is then performed on the $(V_{0.9865}Cr_{0.0135})_2O_3$ film 48 and the $(V_{0.9865}Cr_{0.0135})_2O_3$ film 36, so as to expose the $(V_{0.9}Ti_{0.1})_2O_3$ film 34 (see FIGS. 46A, 46B, and 46C). After that, patterning is again performed on the $(V_{0.9865}Cr_{0.0135})_2O_3$ film 48 (see FIGS. 47A, 47B, and 47C).

Figure 48A:
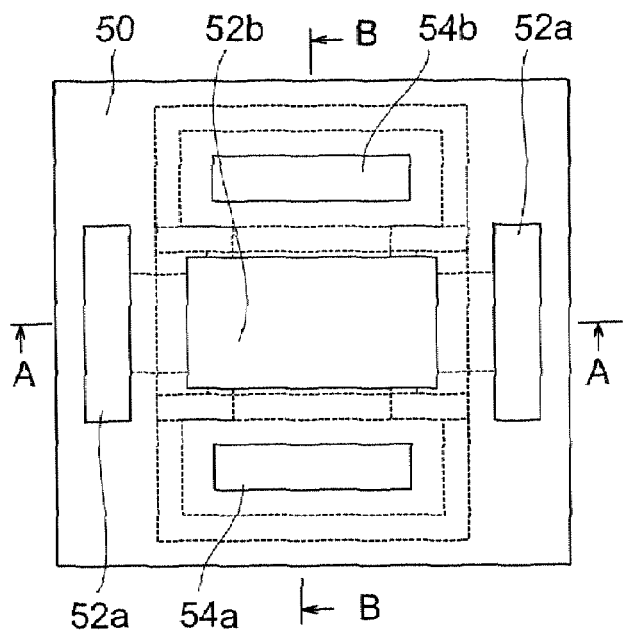
FIGS. 48A through 48C illustrate a procedure for manufacturing an integrated circuit in accordance with the fourth embodiment of the present invention.
Figure 48B:
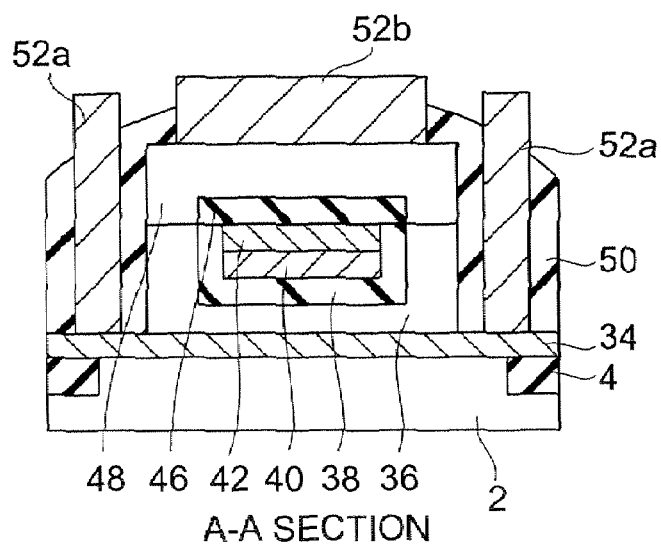
Figure 48C:
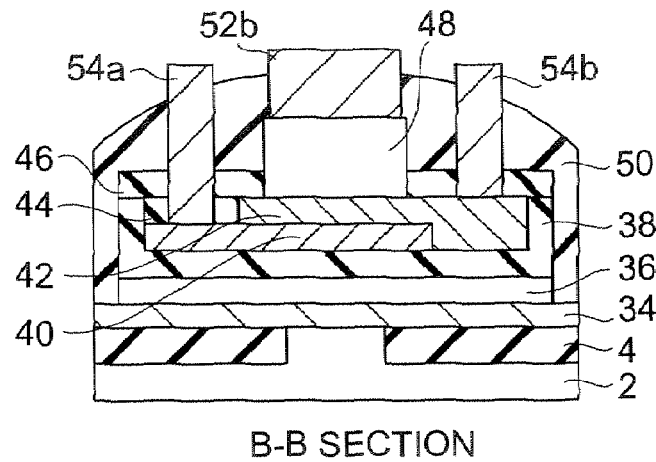

After an interlayer insulating film 50 is formed on the entire surface of the substrate, openings connecting to the $(V_{0.9}Ti_{0.1})_2O_3$ film 34, the $(V_{0.9865}Cr_{0.0135})_2O_3$ film 48, and the Peltier electrodes 40 and 42 are formed in the interlayer insulating film 50. Those openings are filled with a metal material, so as to form contacts 52a, 52b, 54a, and 54b (see FIGS. 48A, 48B, and 48C). Thus, the switching element is completed.

By the manufacturing method in accordance with this embodiment, switching elements can be epitaxially produced. Instead of the materials mentioned above, those employed in Modifications 9 through 26 may be used as the materials for the components.

Fifth Embodiment

Next, a method for manufacturing an integrated circuit in accordance with a fifth embodiment of the present invention is described. Like the integrated circuit of the first embodiment, the integrated circuit manufactured by the manufacturing method of this embodiment includes cells arranged in a matrix fashion, and each of the cells has a switching element. In the following, the procedures for manufacturing switching elements are described.

Figure 49A:
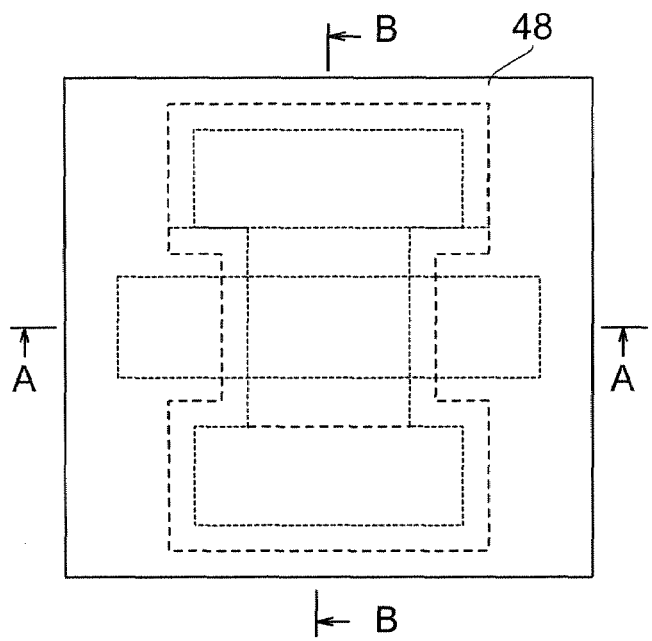
FIGS. 49A through 49C illustrate a procedure for manufacturing an integrated circuit in accordance with a fifth embodiment of the present invention.
Figure 49B:
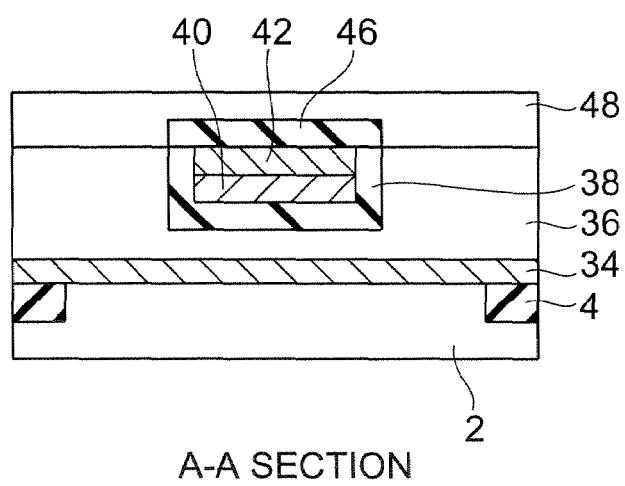
Figure 49C:
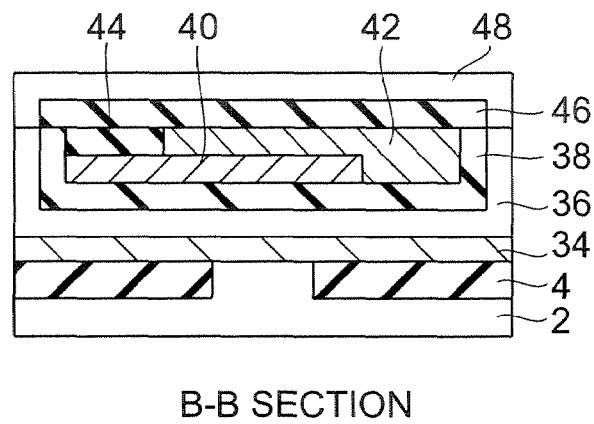

First, the same procedures as those of the fourth embodiment shown in FIGS. 36A through 45C are carried out. The $(V_{0.9865}Cr_{0.0135})_2O_3$ film 48 is then smoothened by CMP or the like (see FIGS. 49A, 49B, and 49C).

Figure 50A:
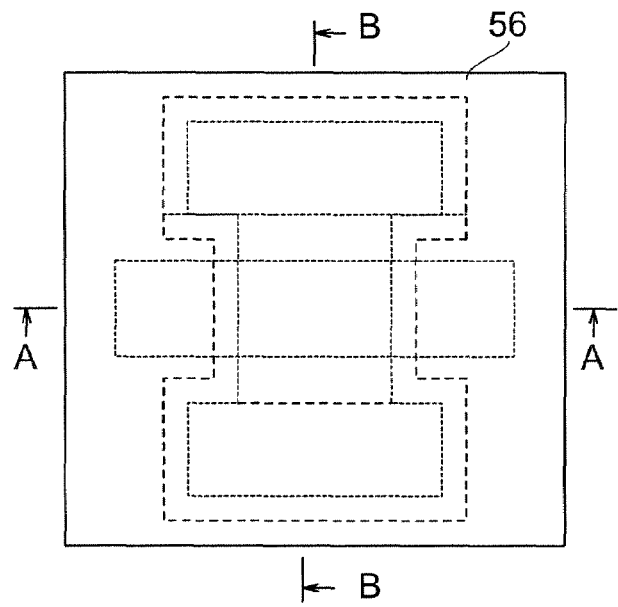
FIGS. 50A through 50C illustrate a procedure for manufacturing an integrated circuit in accordance with the fifth embodiment of the present invention.
Figure 50B:
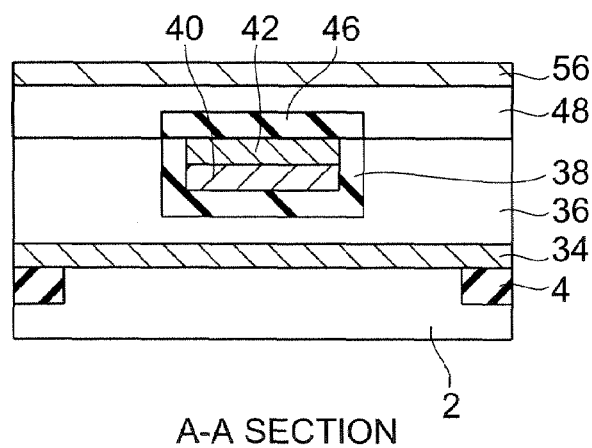
Figure 50C:
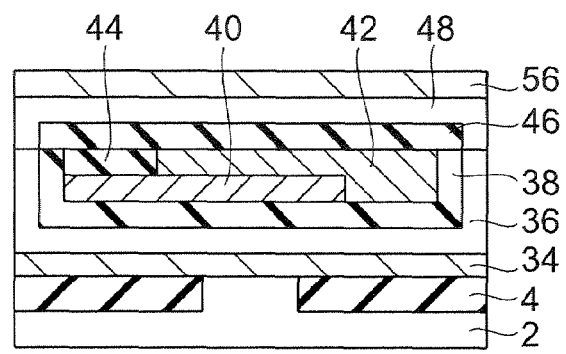
Figure 51A:
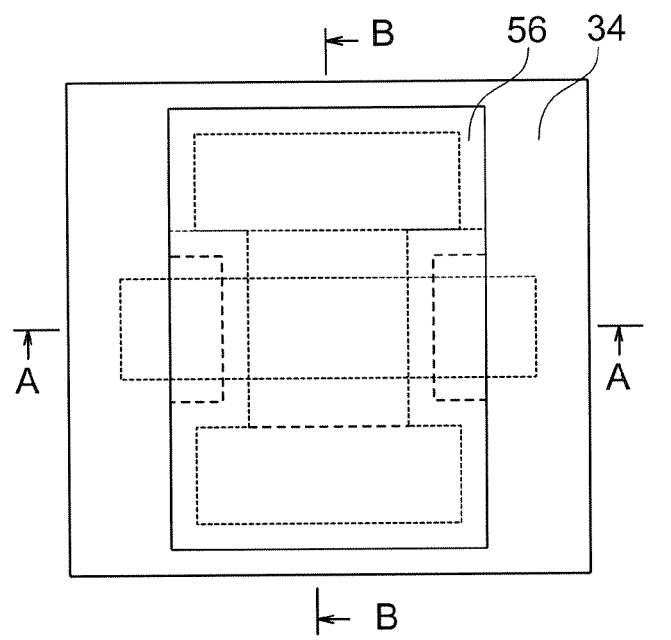
FIGS. 51A through 51C illustrate a procedure for manufacturing an integrated circuit in accordance with the fifth embodiment of the present invention.
Figure 51B:
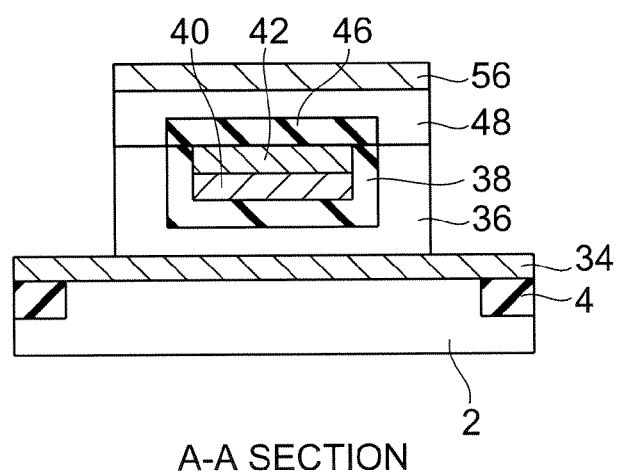
Figure 51C:
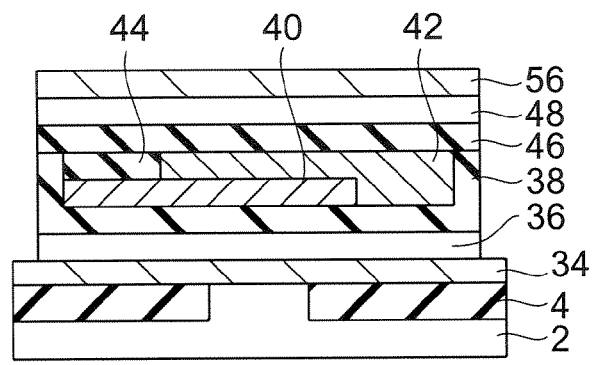

An electrode film 56 to be an upper electrode is then formed on the smoothened $(V_{0.9865}Cr_{0.0135})_2O_3$ film 48 (see FIGS. 50A, 50B, and 50C). Patterning is then performed on the electrode film 56, the $(V_{0.9865}Cr_{0.0135})_2O_3$ film 48, and the $(V_{0.9865}Cr_{0.0135})_2O_3$ film 36, so as to expose the lower electrode 34 (see FIGS. 51A, 51B, and 51C).

Figure 52A:
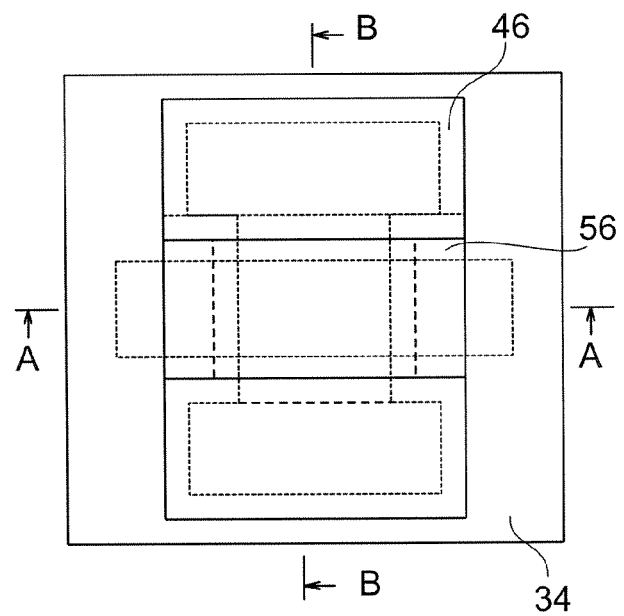
FIGS. 52A through 52C illustrate a procedure for manufacturing an integrated circuit in accordance with the fifth embodiment of the present invention.
Figure 52B:
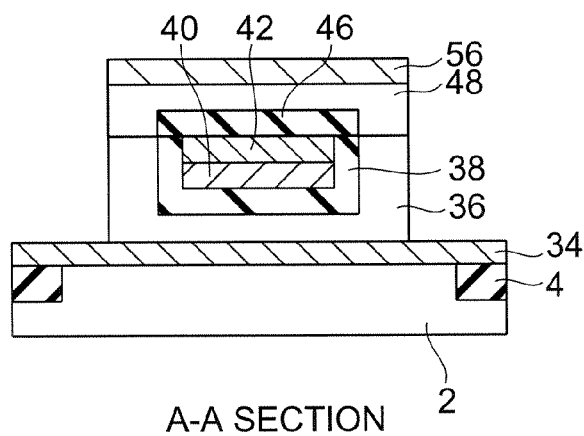
Figure 52C:
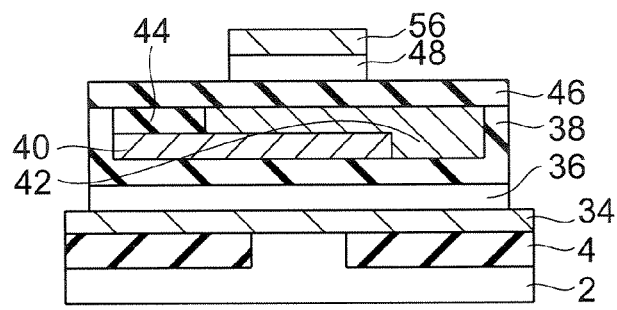

After that, patterning is again performed on the electrode film 56 and the $(V_{0.9865}Cr_{0.0135})_2O_3$ film 48, so as to expose the portions of the heat conducting/electric insulating film 46 that are to form the contacts with the Peltier electrodes (see FIGS. 52A, 52B, and 52C).

Figure 53A:
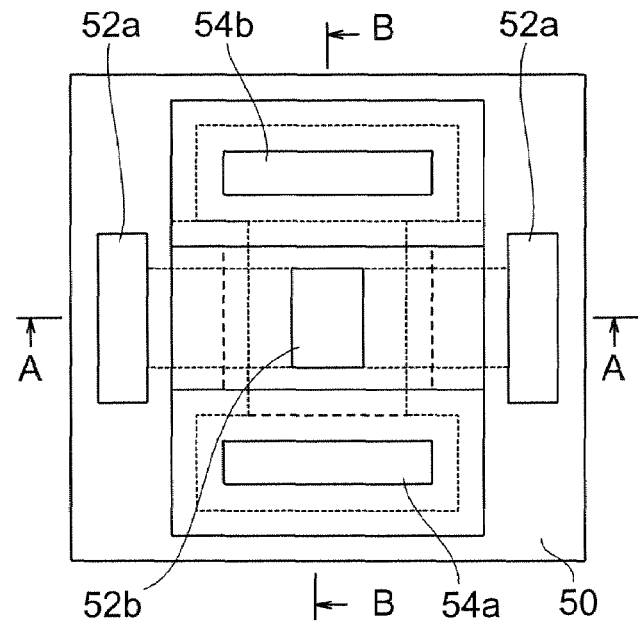
FIGS. 53A through 53C illustrate a procedure for manufacturing an integrated circuit in accordance with the fifth embodiment of the present invention.
Figure 53B:
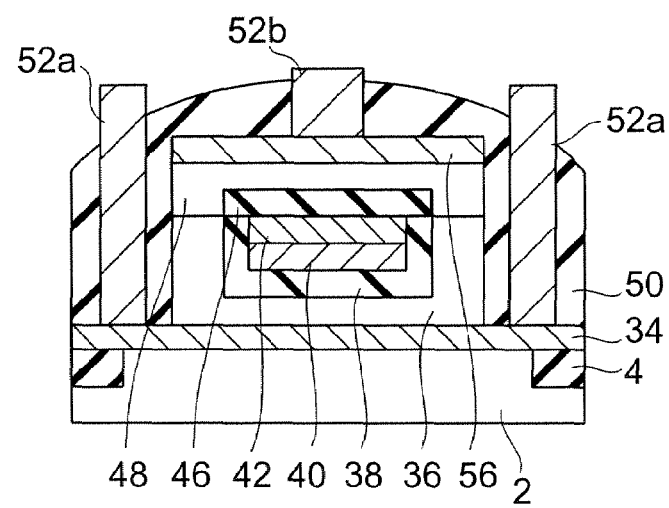
Figure 53C:
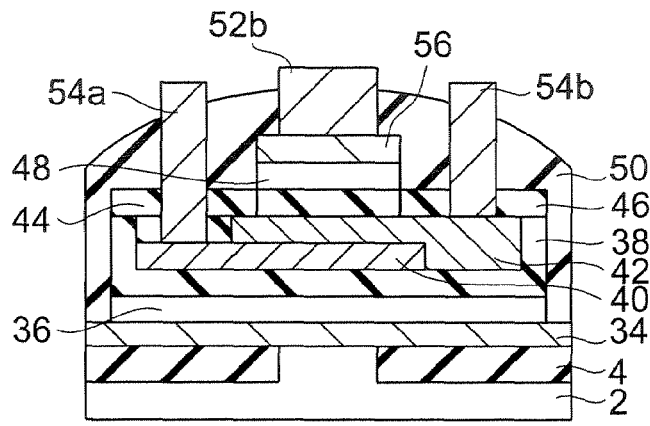

After an interlayer insulating film 50 is formed on the entire surface of the substrate, openings connecting to the $(V_{0.9}Ti_{0.1})_2O_3$ film 34, the upper electrode 48, and the Peltier electrodes 40 and 42 are formed in the interlayer insulating film 50. Those openings are filled with a metal material, so as to form contacts 52a, 52b, 54a, and 54b (see FIGS. 53A, 53B, and 53C). Thus, the switching element is completed.

The switching element manufactured by the manufacturing method of this embodiment differs from the switching element manufactured by the manufacturing method of the fourth embodiment in that the electrode 56 is provided between the film 48 to be the switching portion and the contact 52b.

As in the fourth embodiment, the device isolating region 4 in this embodiment is also formed by STI (Shallow Trench Insulation), but it may be formed by LOCOS (Local Oxidation of Silicon).

Instead of the materials mentioned above, those employed in Modifications 9 through 26 may be used as the materials for the respective components.

Sixth Embodiment

Next, a method for manufacturing an integrated circuit in accordance with a sixth embodiment of the present invention is described. Like the integrated circuit of the first embodiment, the integrated circuit manufactured by the manufacturing method of this embodiment includes cells arranged in a matrix fashion, and each of the cells has a switching element. In the following, the procedures for manufacturing switching elements are described.

Figure 54A:
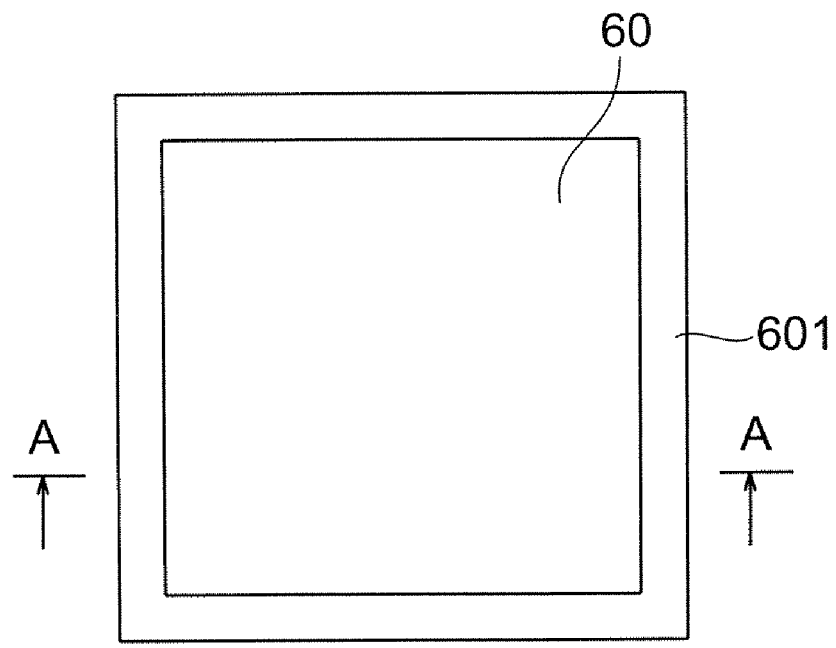
FIGS. 54A and 54B illustrate a procedure for manufacturing an integrated circuit in accordance with a sixth embodiment of the present invention.
Figure 54B:
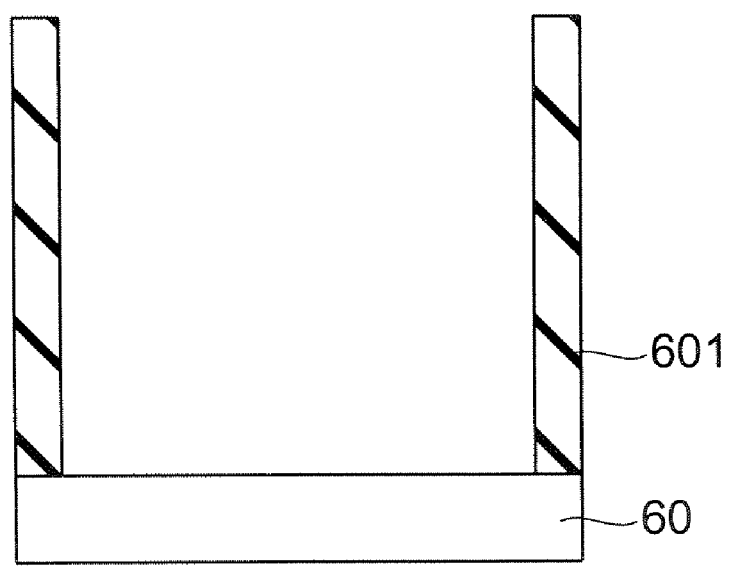

First, a device isolator 601 made of an insulative material is formed on a substrate 60, as shown in FIGS. 54A and 54B.

Figure 55A:
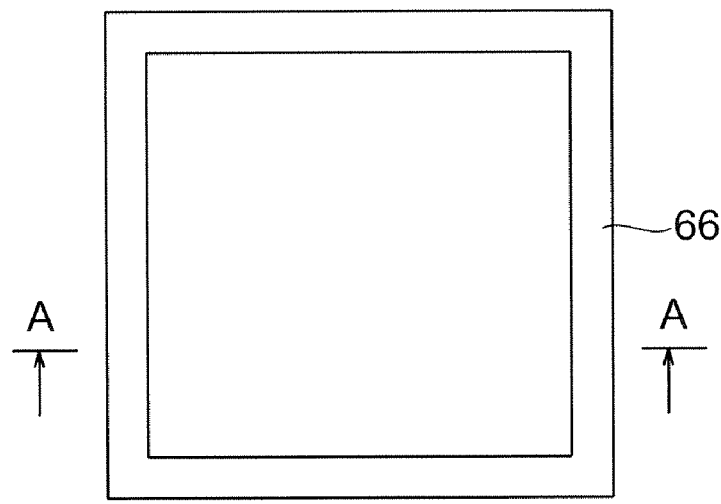
FIGS. 55A and 55B illustrate a procedure for manufacturing an integrated circuit in accordance with the sixth embodiment of the present invention.
Figure 55B:
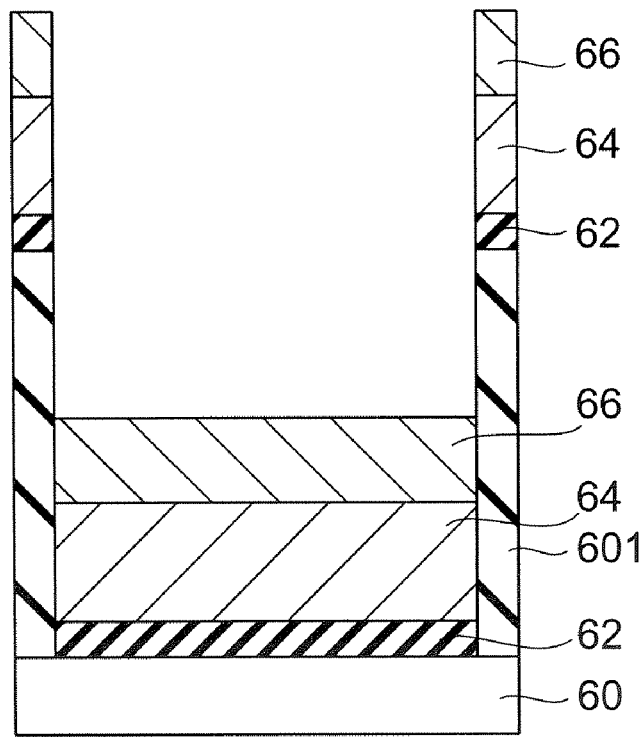

An insulating film 62 is then formed on the substrate 60, as shown in FIGS. 55A and 55B. Instead of the insulating film 62, an insulating substrate may be employed. If one of the above mentioned film forming methods with high directivity is used for forming the insulating film 62, the manufacturing process can be simplified. Therefore, the simplest process is described in this embodiment. Even by a film forming method with low directivity, an element having the same functions as those of this embodiment can be produced by carrying out an additional procedure, which should be obvious to those skilled in the art. A Peltier electrode 64 of a first polarity (n-type, for example) having a film thickness of 30 nm is then formed by a film forming method with high directivity. A Peltier electrode 66 of a second polarity (p-type, for example) having a film thickness of 20 nm is formed by a film forming method with high directivity.

Figure 56A:
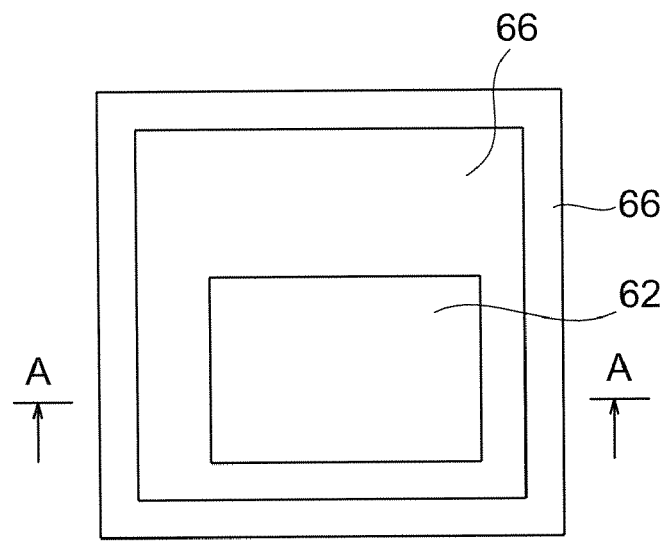
FIGS. 56A and 56B illustrate a procedure for manufacturing an integrated circuit in accordance with the sixth embodiment of the present invention.
Figure 56B:
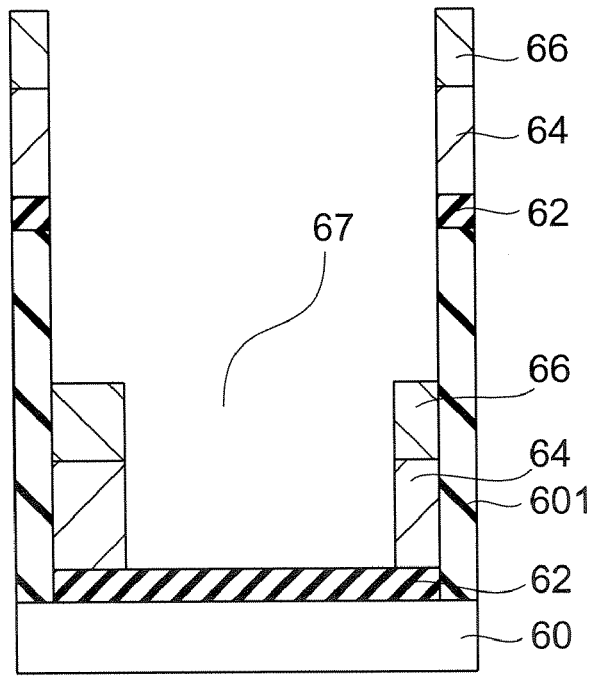
Figure 57A:
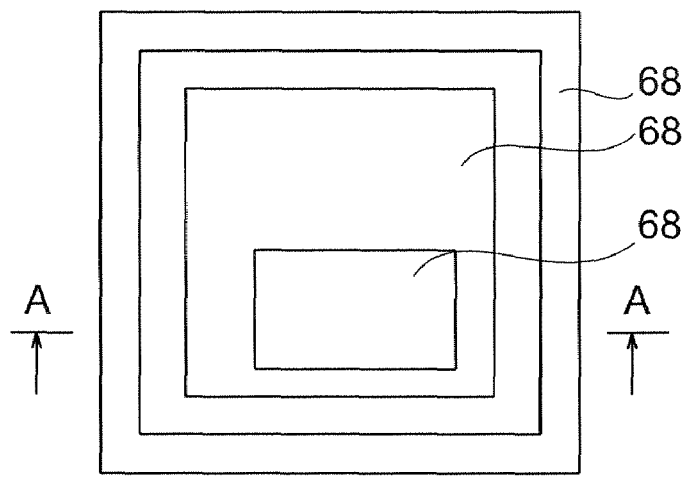
FIGS. 57A and 57B illustrate a procedure for manufacturing an integrated circuit in accordance with the sixth embodiment of the present invention.
Figure 57B:
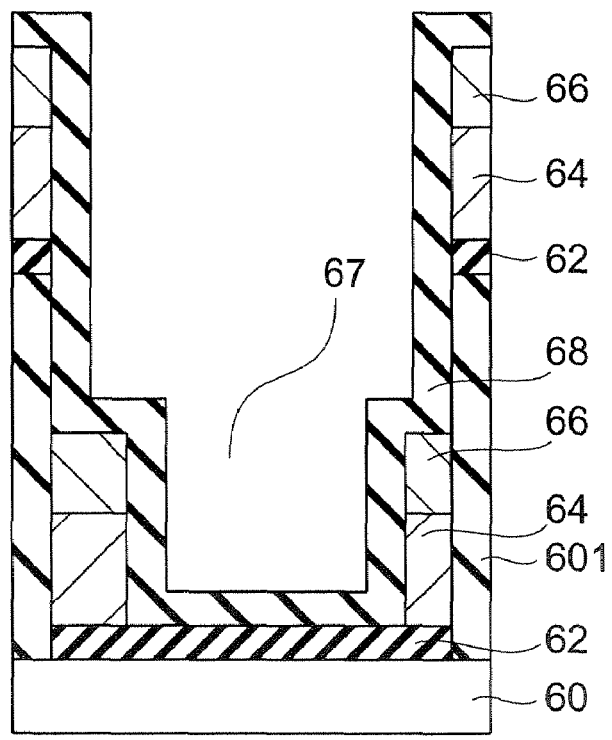

As shown in FIGS. 56A and 56B, etching is performed on the Peltier electrode 66 and the Peltier electrode 64, so as to form an opening 67 having its bottom face reaching the insulating film 62. A heat conducting/electric insulating film 68 is then formed so as to cover the bottom face and the side faces of the opening 67 (see FIGS. 57A and 57B). Here, the heat conducting/electric insulating film 68 is formed also on the surface of the Peltier electrode 66 outside the opening 67.

Figure 58A:
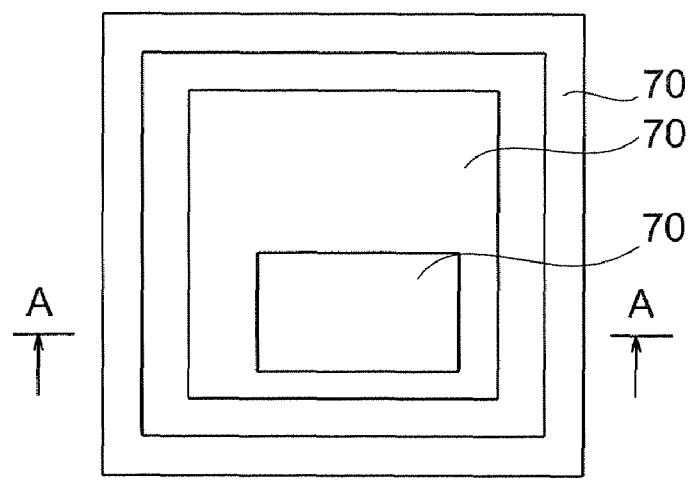
FIGS. 58A and 58B illustrate a procedure for manufacturing an integrated circuit in accordance with the sixth embodiment of the present invention.
Figure 58B:
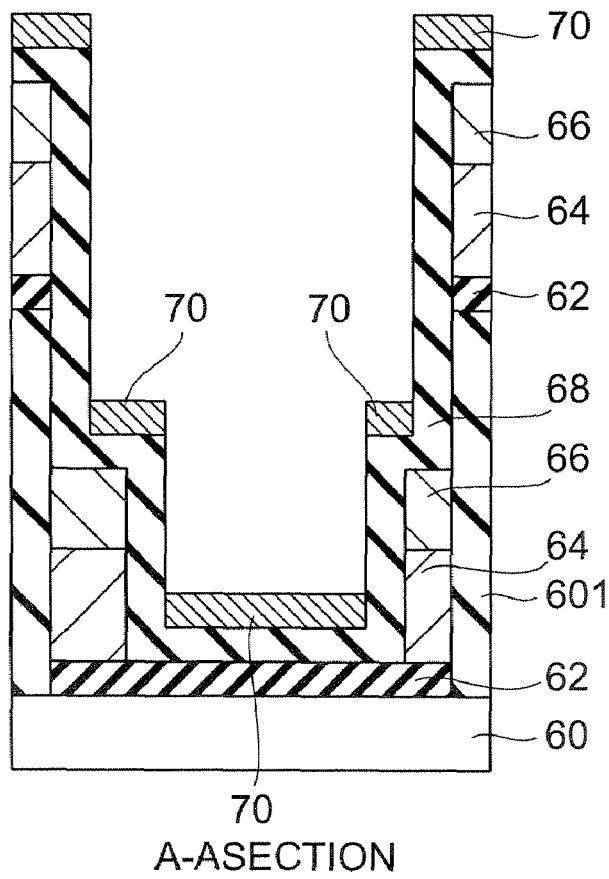
Figure 59A:
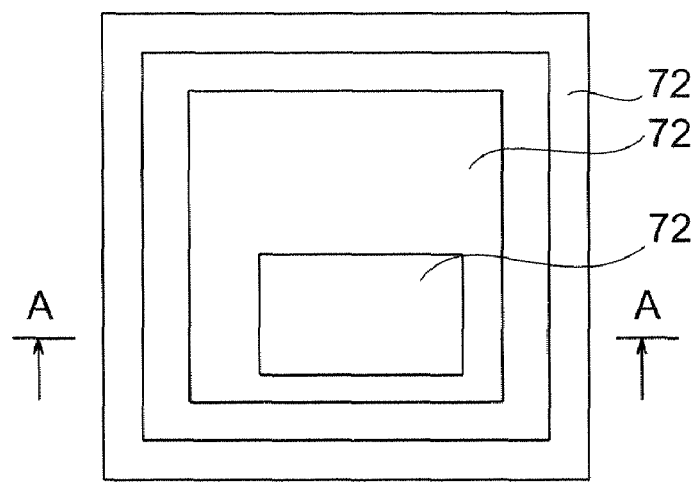
FIGS. 59A and 59B illustrate a procedure for manufacturing an integrated circuit in accordance with the sixth embodiment of the present invention.
Figure 59B:
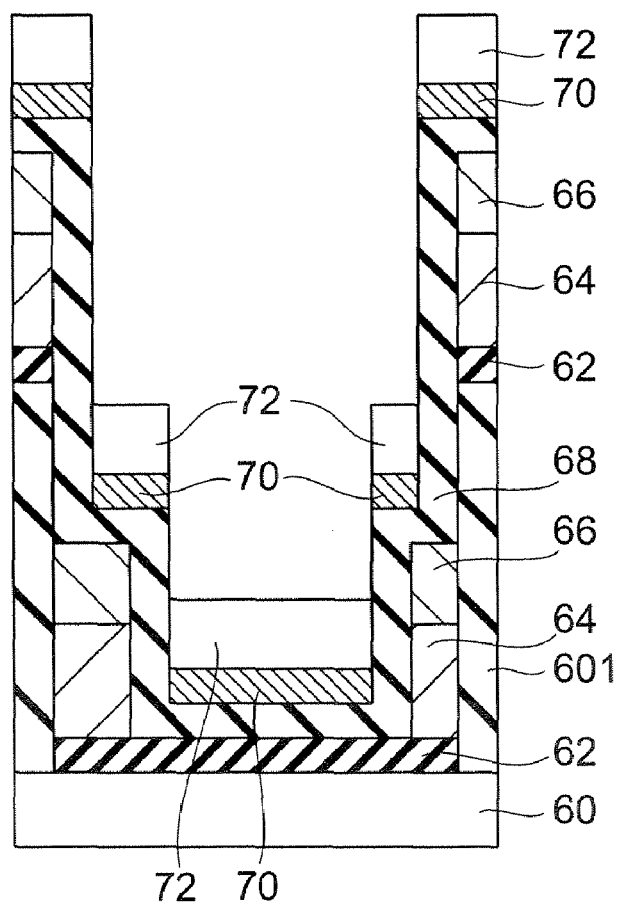

A first electrode film 70 of the switching portion is then formed so as to cover the portion of the heat conducting/electric insulating film 68 located on the bottom face of the opening 67, by a film forming method with high directivity (see FIGS. 58A and 58B). Here, the first electrode film 70 is formed also on the portion of the heat conducting/electric insulating film 68 formed on the surface of the Peltier electrode 66 outside the opening 67. A film 72 to be the switching portion is then formed so as to cover the portion of the first electrode film 70 located on the bottom face of the opening 67, by a film forming method with high directivity (see FIGS. 59A and 59B). Here, the film 72 is formed also on the portion of the first electrode film 70 outside the opening 67.

Figure 60A:
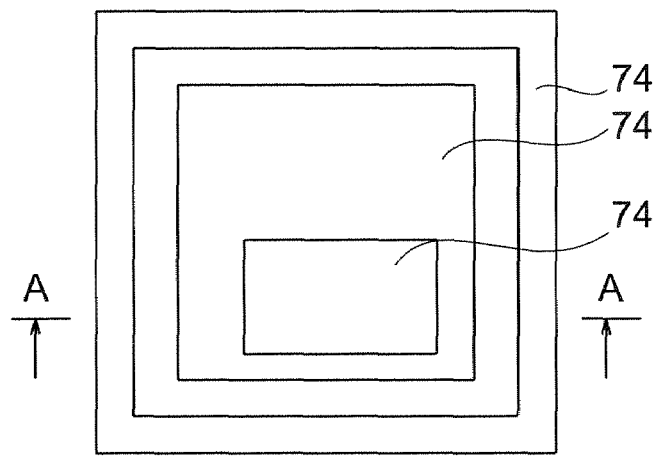
FIGS. 60A and 60B illustrate a procedure for manufacturing an integrated circuit in accordance with the sixth embodiment of the present invention.
Figure 60B:
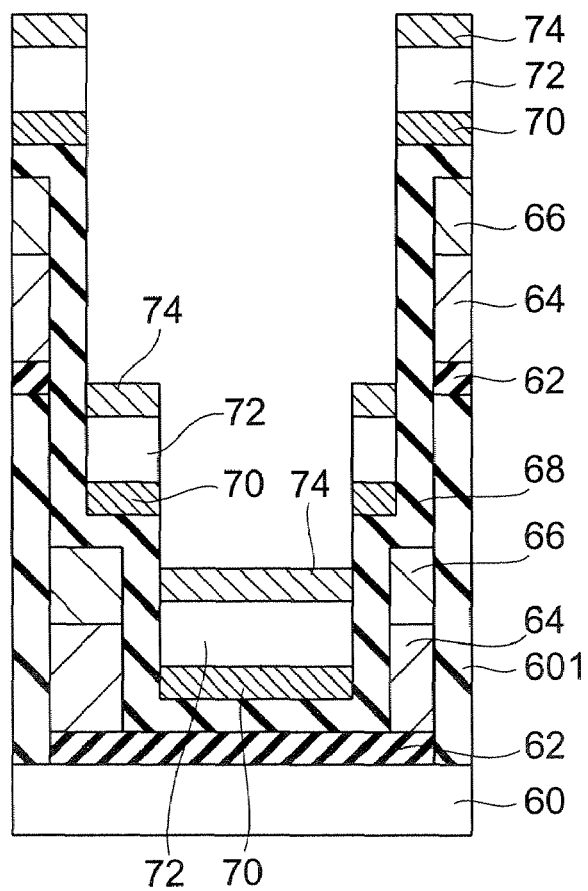
Figure 61A:
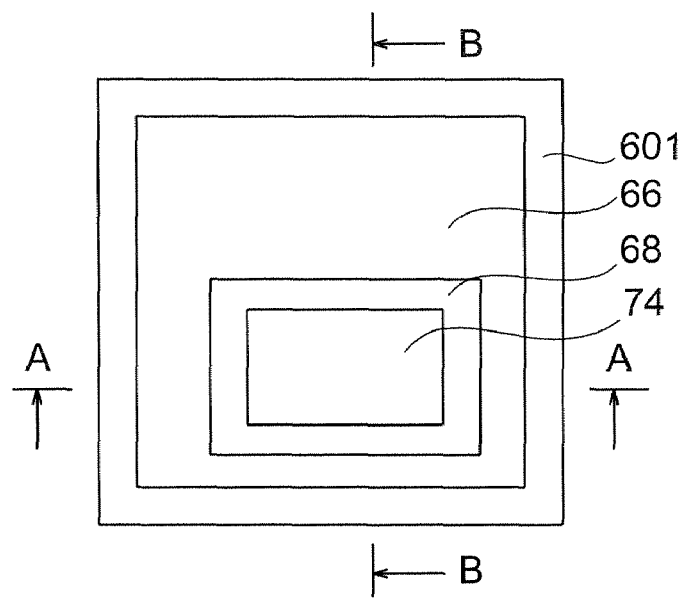
FIGS. 61A through 61C illustrate a procedure for manufacturing an integrated circuit in accordance with the sixth embodiment of the present invention.
Figure 61B:
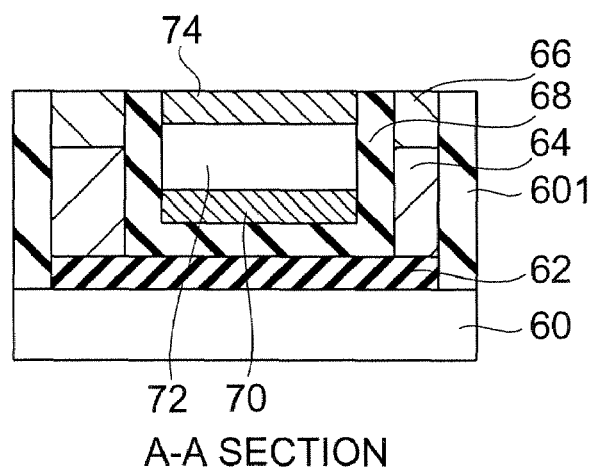
Figure 61C:
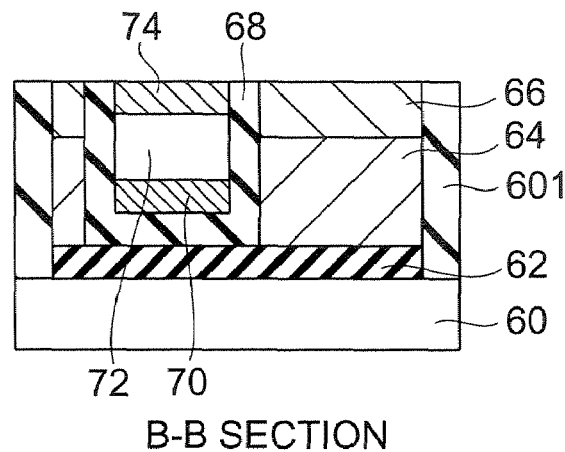

A second electrode film 74 of the switching portion is then formed on the portion of the film 72 located on the bottom face of the opening 67, by a film forming method with high directivity (see FIGS. 60A and 60B). Here, the second electrode film 74 is formed also on the portion of the film 72 outside the opening 67. Although a film forming method with high directivity is used to form the second electrode film 74 in FIGS. 60A and 60B, an additional process is not necessary even with a film forming method with low directivity. Smoothening is then performed by CMP or the like, so as to expose the surface of the Peltier electrode 66 (see FIGS. 61A, 61B, and 61C).

Figure 62A:
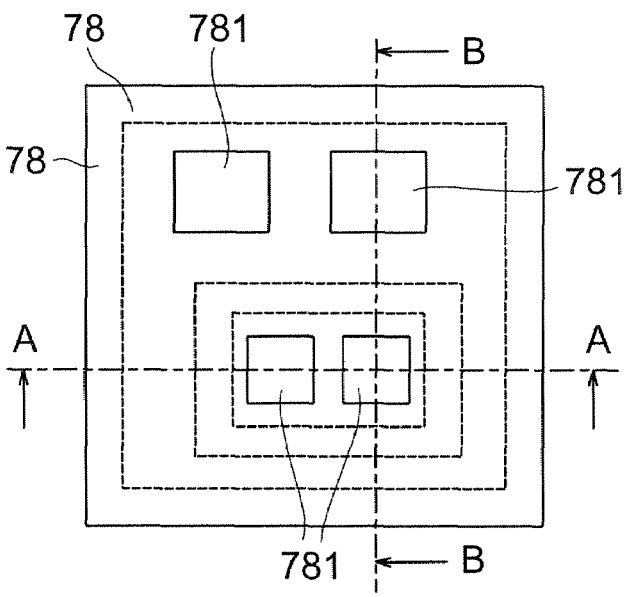
FIGS. 62A through 62C illustrate a procedure for manufacturing an integrated circuit in accordance with the sixth embodiment of the present invention.
Figure 62B:
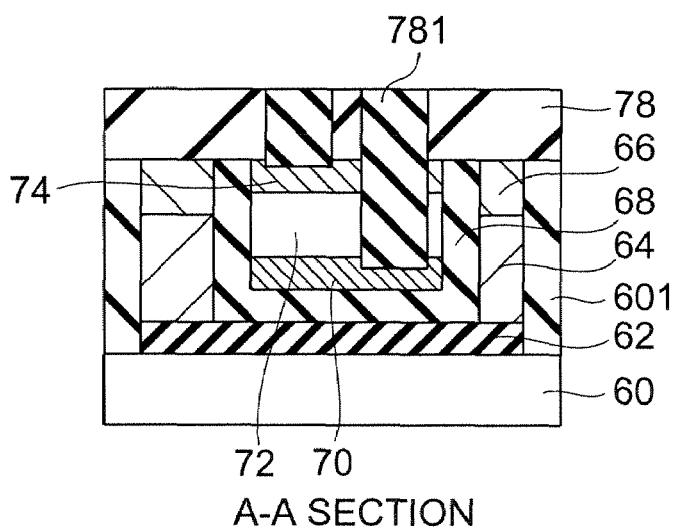
Figure 62C:
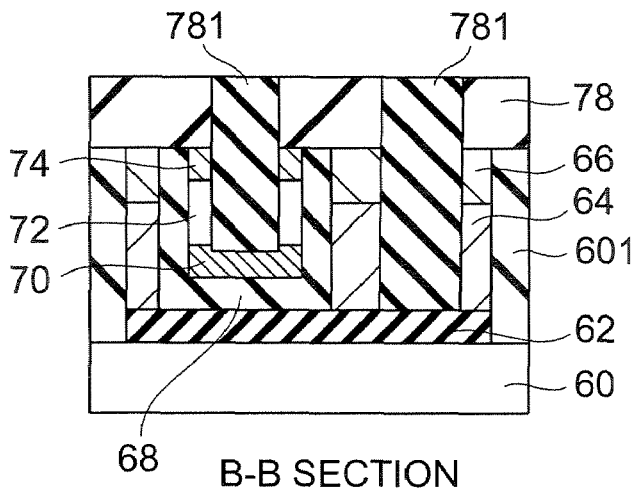

After an interlayer insulating film (a protection film) 78 is formed on the entire surface of the substrate, openings to the Peltier electrode 64, the Peltier electrode 66, the first electrode film 70 of the switching portion 72, and the second electrode film 74 of the switching portion 72 are formed. An interlayer insulating film 781 is then formed so as to fill the openings (see FIGS. 62A, 62B, and 62C).

Figure 63A:
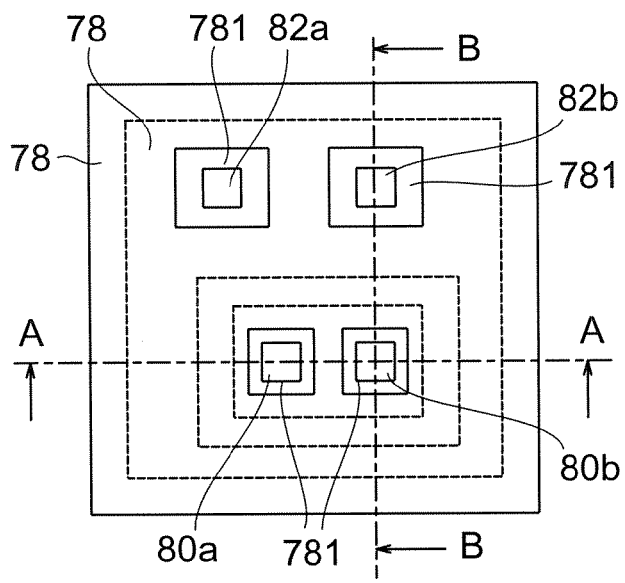
FIGS. 63A through 63C illustrate a procedure for manufacturing an integrated circuit in accordance with the sixth embodiment of the present invention.
Figure 63B:
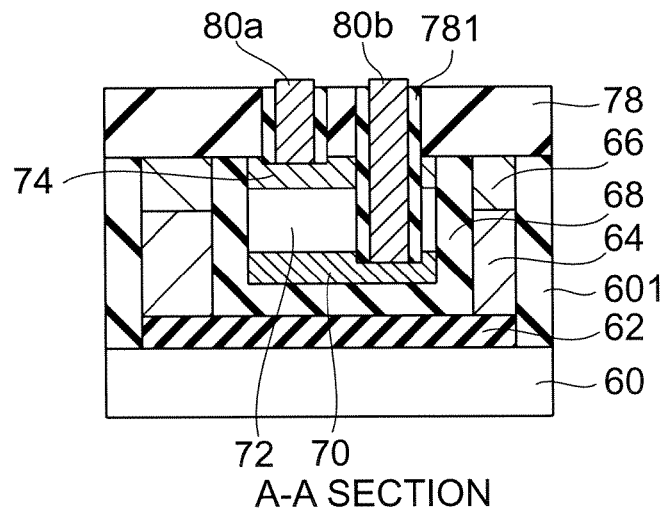
Figure 63C:
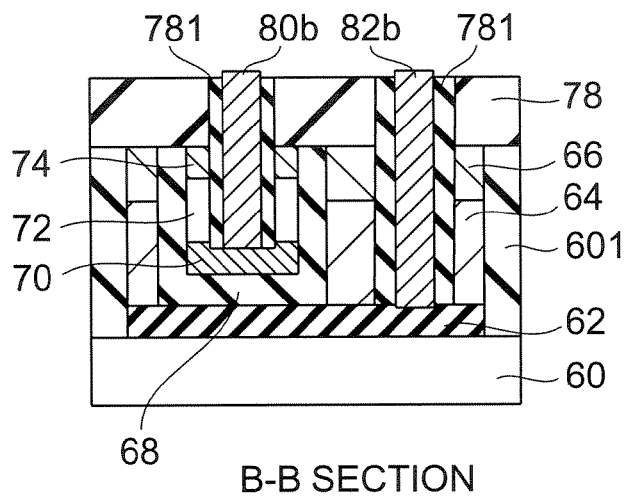

Openings connecting to the first electrode film 70, the second electrode film 74, the Peltier electrode 66, and the Peltier electrode 64 are then formed in the interlayer insulating film 781. Those openings are filled with a metal material, so as to form contacts 80a, 80b, 82a, and 82b (see FIGS. 63A, 63B, and 63C). Thus, the switching element is completed.

Instead of the materials mentioned above, those employed in Modifications 9 through 26 may be used as the materials for the respective components.

Seventh Embodiment

Next, a method for manufacturing an integrated circuit in accordance with a seventh embodiment of the present invention is described. The integrated circuit to be manufactured by the manufacturing method of this embodiment includes an oscillator circuit. In the following, the procedures for manufacturing the oscillator are described.

Figure 64A:
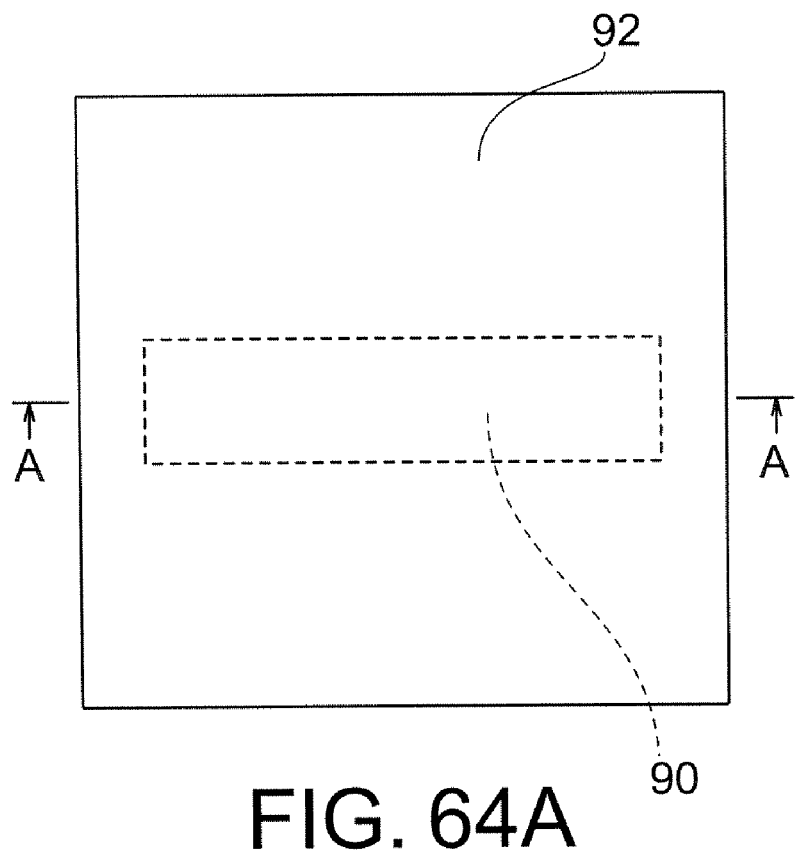
FIGS. 64A and 64B illustrate a procedure for manufacturing an integrated circuit in accordance with a seventh embodiment of the present invention.
Figure 64B:
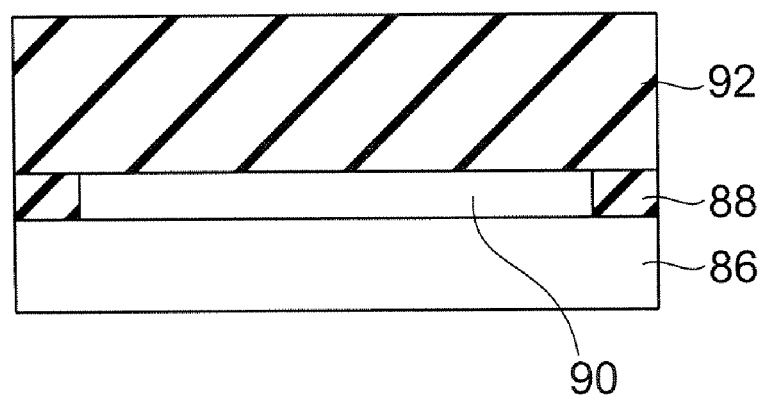
Figure 65A:
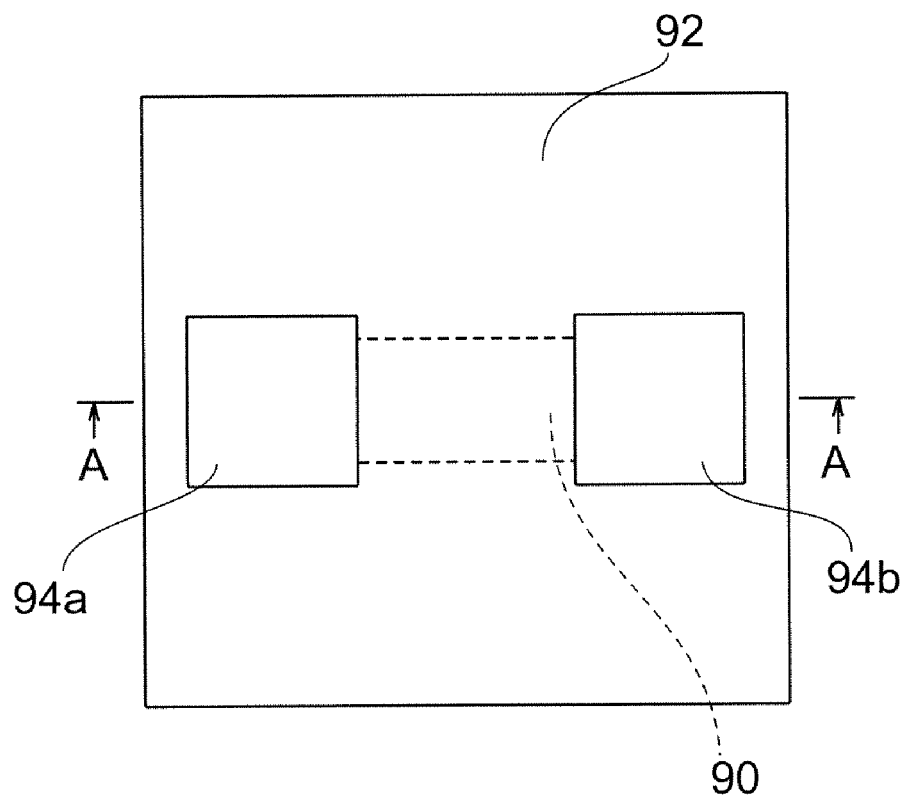
FIGS. 65A and 65B illustrate a procedure for manufacturing an integrated circuit in accordance with the seventh embodiment of the present invention.
Figure 65B:
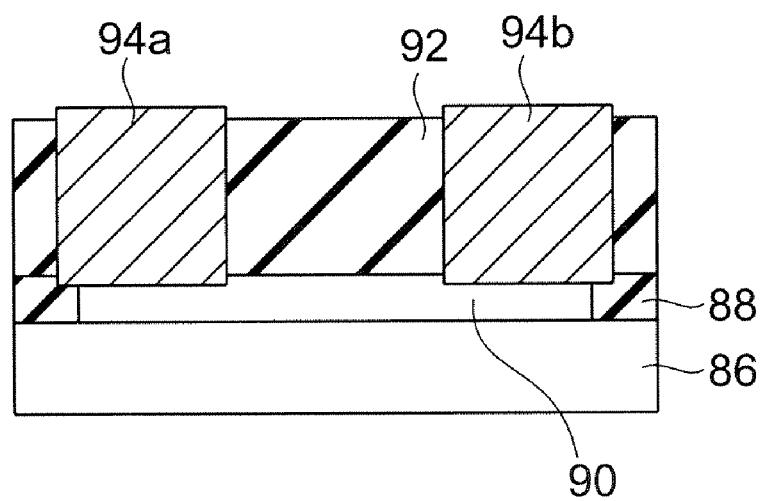

First, a device isolating region 88 is formed on a substrate 86, and an electric switching material film 90 made of $(V_{0.9905}Cr_{0.0095})_2O_3$ is formed, as shown in FIGS. 64A and 64B. An interlayer insulating film 92 is then formed on the entire surface of the substrate. Openings continuing to the electric switching material film 90 are then formed on the interlayer insulating film 92. Those openings are filled with a metal material, so as to form contacts 94a and 94b (see FIGS. 65A and 65B). The oscillator circuit is thus completed. As for the electric switching material, those employed in Modifications 9 through 26 may be used, other than the material mentioned above.

Eighth Embodiment

Figure 66:
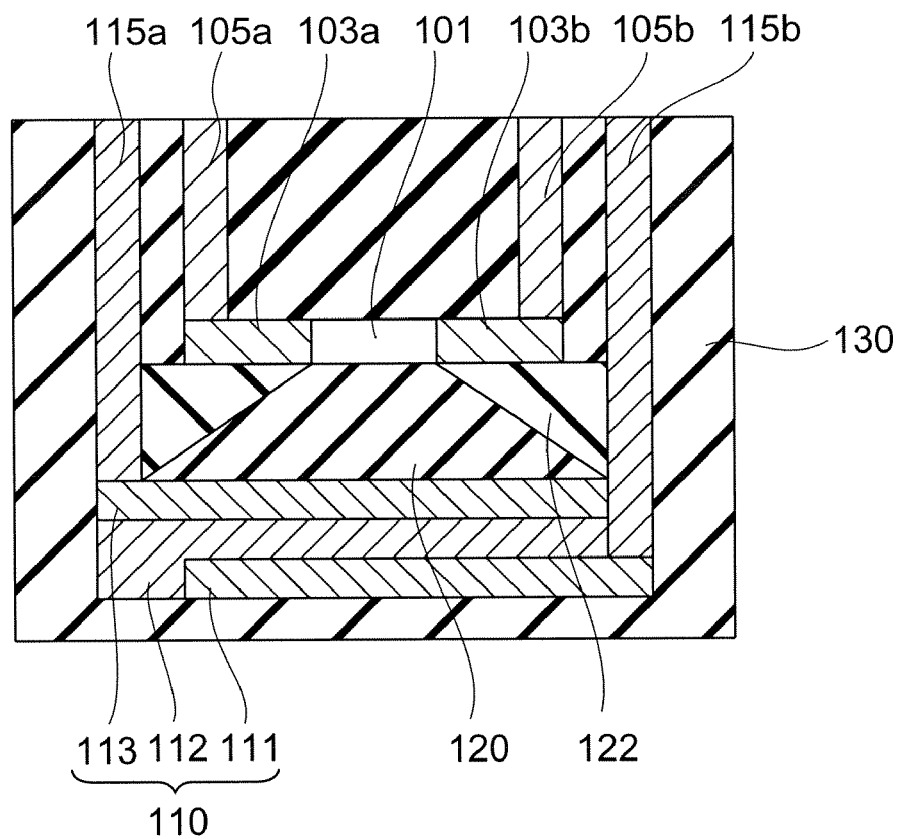
FIG. 66 illustrates an integrated circuit in accordance with an eighth embodiment of the present invention.

Next, an integrated circuit in accordance with an eighth embodiment of the present invention is described. The integrated circuit of this embodiment includes a switching portion. Pressure is applied to the switching portion, so as to perform switching operations. FIG. 66 illustrates the integrated circuit of this embodiment.

As can be seen from FIG. 9, switching can be caused by applying pressure to a switching portion with the composition of $(V_{0.991}Cr_{0.009})_2O_3$, for example. The integrated circuit of this embodiment utilizes this feature.

The integrated circuit of this embodiment includes a switching portion 101 with the composition of $(V_{0.991}Cr_{0.009})_2O_3$, for example. A piezoelectric element 110 is provided below the switching portion 101. This piezoelectric element 110 includes a piezoelectric body 112 made of AlN or PZT, and a lower electrode 111 and an upper electrode 113 sandwiching the piezoelectric body 112. The lower electrode 111 and the upper electrode 113 are electrically connected to the outside via contacts 115a and 115b made of $RuO_2$, for example. When voltage is applied to the lower electrode 111 and the upper electrode 113 via the contacts 115a and 115b, the piezoelectric element 110 is deformed to generate pressure.

A hard insulating film 120 made of c-BN or AlN, for example, is provided between the piezoelectric element 110 and the switching portion 110. This insulating film 120 has a cone-like shape, with its section becomes smaller toward the switching portion 110 from the piezoelectric element 110. The top face of the insulating film 120 is in contact with the bottom face of the switching portion 110, and has substantially the same area as the bottom face of the switching portion 110.

Electrodes 103a and 103b are provided in contact with the side faces of the switching portion 101. The electrodes 103a and 103b are electrically connected to the outside via contacts 105a and 105b. An insulating film 122 that is made of a soft material, such as BSTO with a composition having a structure phase transition temperature in the neighborhood of the temperature for operating the device, is formed between the insulating film 120 and the electrodes 103a and 103b. All the above described components are covered with a hard insulating film 130 that is made of c-BN or AlN, like the insulating film 120.

In the integrated circuit of this embodiment, pressure can be applied to the switching portion 101 from the piezoelectric element 110.

Since the maximum pressure to be generated in the piezoelectric body is only 0.035 GPa or so. Therefore, the insulating film 120 has a cone-shaped structure made of a hard material, as shown in FIG. 66, and pressure of approximately 0.3 GPa is generated at the top portion of the cone-shaped structure. The area ratio between the top end of the cone and the bottom face of the cone should be about 20, with a margin being allowed. As for the insulating film 122 outside the cone, BSTO with a composition to be softened in the first temperature environment with a temperature variation of 20° C. to 28° C. is employed, so as to minimize the scattering stress. In a case where PZT is used for the piezoelectric body 112, for example, the $e_{33}$ coefficient of the piezoelectric body is approximately 10 C/m². Accordingly, the voltage required for generating the pressure of 0.03 GPa is generated in PZT, and the pressure of 0.3 GPa in the switching portion 101, which is a $(V_{0.991}Cr_{0.009})_2O_3$ film, is calculated to be 0.04 V.

Figure 73:
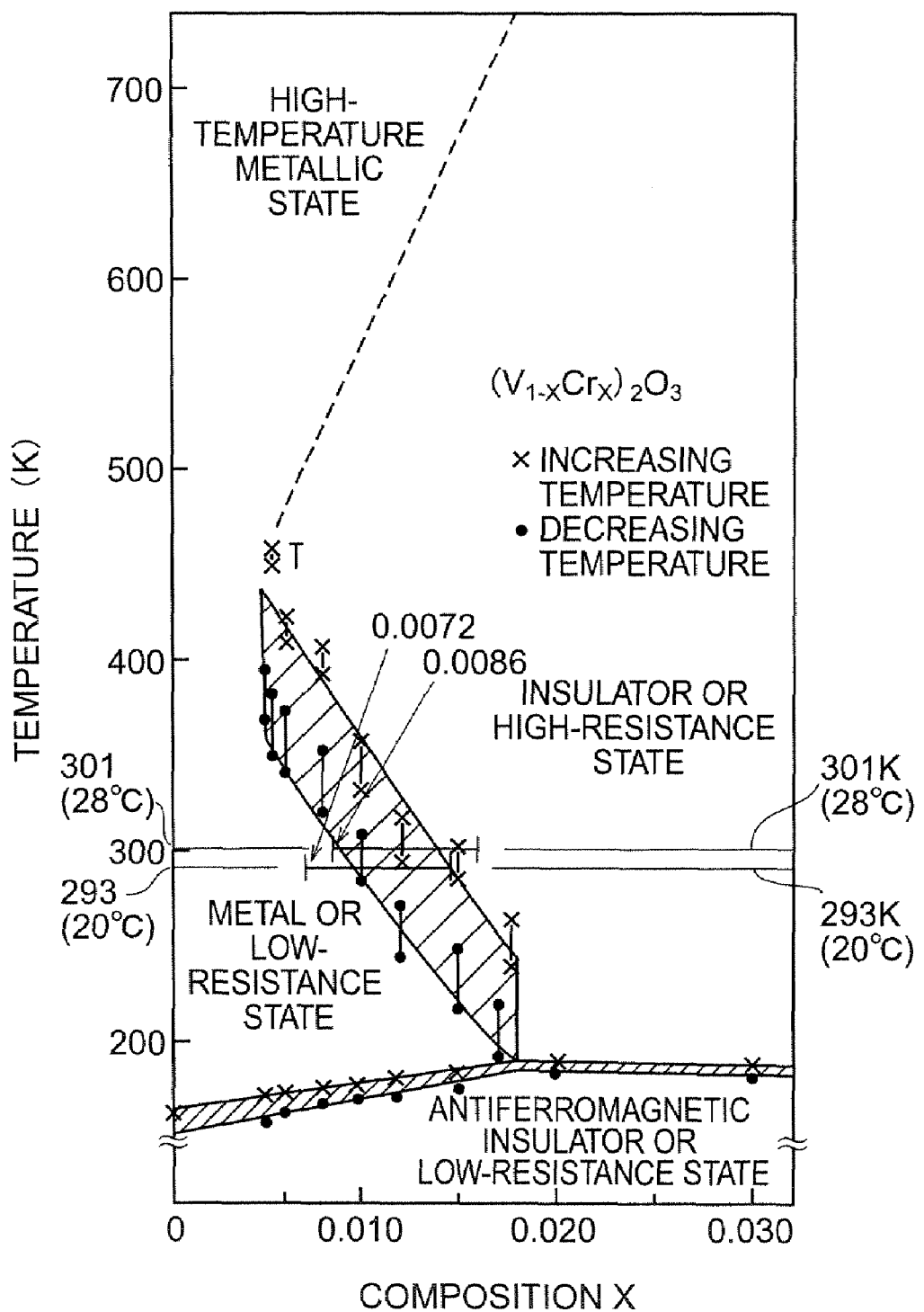
FIG. 73 shows the principle of pressure driven operation mode at controlled temperature (20° C.~28° C.) environment (first temperature environment) depending on the phase diagram in FIG. 14, corresponding to the composition x of $(V_{1-x}Cr_x)_2O_3$.

In a case where this element is used in the first temperature environment, the composition range should be $(V_{1-x}Cr_x)_2O_3$ ($0.0072 \leq x \leq 0.0086$), for example (see FIG. 73). Using the graph shown in FIG. 73 or the like, it is possible to determine the composition range in the second temperature environment with a temperature variation of 1° C. to 60° C., the composition range in the third temperature environment with a temperature variation of ±4° C. from a temperature less than 20° C., the composition range in the fourth temperature environment with a temperature variation of ±4° C. from a temperature higher than 28° C., and the composition range in the fifth temperature environment in which the time mean value of temperature T is a constant value in the range of 173 K ≤ T ≤ 403 K and the variation in temperature T (K) with time is ±30 K. Materials that cause changes in electric resistance with temperature may have various characteristics such as Mott transitions, CDW transitions, and superconducting transitions. Showing wide variations in electric resistance with changes in pressure, those materials can be employed in this embodiment.

Although the pressure variation ΔP is 0.3 GPa in this embodiment, any suitable value can be used, based on the graph shown in FIG. 73 or the electric resistance variations of various materials with changes in pressure. The lower limit is the hysteresis width due to changes in pressure. In a case of a $V_2O_3$ material, the lower limit is approximately 0.3 GPa. Although the upper limit does not exist, the size of the cone becomes larger so as to apply high pressure to the switching portion. Accordingly, it is preferable to select a value in the neighborhood of the lower limit of the pressure variation.

In a case where the structure for applying stress with the piezoelectric element of this embodiment is employed in one of the integrated circuits of the first through seventh embodiments and the modifications, the temperature for switching operations with changes in temperature can be shifted by the voltage to be applied to the piezoelectric body. With this arrangement, the switching operation temperature can be advantageously shifted within a small temperature range, without a change in the composition of the switching portion. Also with this arrangement, the element can be advantageously used in an outdoor environment with a wide temperature variation. Other than this embodiment, there should be structures for applying stress through a piezoelectric mechanism to the integrated circuit of one of the first through seventh embodiments and the modifications. The essential components in those structures include the piezoelectric mechanism, the stress increasing mechanism that has a smaller area in contact with the switching portion than the area in contact with the piezoelectric mechanism, the hermetical structure (excluding the conducting wires) that holds the stress to be applied to the switching portion, and the conducting lines to the piezoelectric mechanism and the switching portion.

Figure 67:
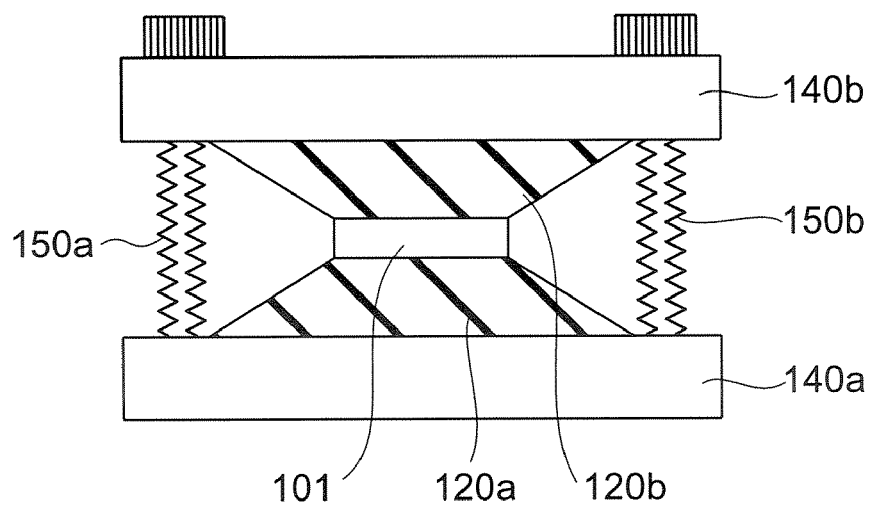
FIG. 67 illustrates an example of the mechanism for applying stress to the switching portion.

In any one of the integrated circuit of the first through seventh embodiments and the modifications, the structure shown in FIG. 67 may be employed, for example. In this structure, the switching portion 101 is interposed between cone-shaped hard insulating films 120a and 120b made of c-BN or AlN, for example. The insulating films 120a and 120b are clamped with hard metal plates 140a and 140b such as stainless plates, and stress is applied with screws 150a and 150b. The screws 150a and 150b may be turned manually or by electromotive force. Having such a structure, an integrated circuit designed for warm climates can be used in cold climates, with the operating temperature being shifted simply by turning the screws to change the stress to be applied.

As described so far, each of the embodiments of the present invention can provide non-volatile switching elements each having a novel structure that enables high-speed operations and high integration, and an integrated circuit that includes the non-volatile switching elements.

In each of the above embodiments, the material for the witching portion 6 that causes a 10-fold or more change in electric conductivity with a temperature change of $\pm 80°$ C. from the first temperature environment having a temperature variation of $20°$ C. to $28°$ C., may be $(V_{1-x}Cr_x)_2O_3$ ($0.0093 \leq x \leq 0.0150$), $Ba_{0.999-x}Sr_xCe_{0.001}TiO_3$ ($0.3 \leq x \leq 0.4$), $CuIr_2S_4$, $WO_{3.0}$, or $BaCo_{0.9}Ni_{0.1}S_{2-x}$ ($x=0.15$).

Here, the material for the electrodes 6a and 6b of the switching portion 6 that are in a metallic state in the temperature range of $\pm 80°$ C. may be a composition of the above described Mott insulator that is in a metallic state at the above temperature, such as $(V_{1-x-y}Cr_xTi_y)_2O_3$ ($0.0097 \leq x \leq 0.0140$, $0.04 \leq y \leq 0.06$), or a composition of the above described CDW insulator that is in a metallic state at the above temperature, such as $CuIr_2(S_{1-x}Se_x)_4$ ($0 \leq x \leq 1$), or a metal oxide such as $BaTiNbO_3$, $RuO_2$, $SrRuO_3$, or $ReO_3$, an alloy material such as TiN, ZrN, or HfN, or a single metal material such as Al, Cu, Ru, Ir, or Pt.

Likewise, the material for the contacts of the Peltier element 13 that are in a metallic state in the temperature range of $\pm 80°$ C. from the first temperature environment having a temperature variation of $20°$ C. to $28°$ C. may be a composition of the above described Mott insulator that is in a metallic state at the above temperature, such as $(V_{1-x-y}Cr_xTi_y)_2O_3$ ($0.0097 \leq x \leq 0.0140$, $0.04 \leq y \leq 0.06$) or $CuIr_2(S_{1-x}Se_x)_4$ ($0 \leq x \leq 1$), or a composition of the above described CDW insulator that is in a metallic state at the above temperature, such as $1T\text{-}TaS_2$, or a metal oxide such as $BaTiNbO_3$, $RuO_2$, $SrRuO_3$, or $ReO_3$, an alloy material such as TiN, ZrN, or HfN, or a single metal material such as Al, Cu, Ru, Ir, or Pt.

In each of the above embodiments, the material for the switching portion 6 that causes a 10-fold or more change in electric conductivity with a temperature change from room temperature, is a material having a thermal hysteresis, such as $(V_{1-x}Cr_x)_2O_3$ ($0.0097 \leq x \leq 0.0140$), which is a Mott insulator, or $Ba_{0.999-x}Sr_xCe_{0.001}TiO_3$ ($0.3 \leq x \leq 0.4$), which changes the surface band at the grain boundary.

In each of the above embodiments, the material for the switching portion 6 that causes a 10-fold or more change in electric conductivity with a temperature change width optimally set for switching in accordance with the mean operating temperature (the temperature time-averaged only in the time zone without changes in the switching states of the cells) set in the third temperature environment having a temperature variation of $\pm 4°$ C. from a temperature less than $20°$ C., may be $(V_{1-x}Cr_x)_2O_3$ ($0 \leq x \leq 0.018$), $(V_{1-x}Ti_x)_2O_3$ ($0 \leq x \leq 0.052$), $Ni(S_{1-x}Se_x)_2$ ($0.26 \leq x \leq 0.275$), $CuIr_2(S_{1-x}Se_x)_4$ ($0 \leq x \leq 0.1$), $Ti_2O_3$, $Fe_3O_4$, $EuO_{1-x}$ ($0.0005 \leq x \leq 0.004$), $WO_{3.0}$, $BaCo_{0.9}Ni_{0.1}S_{2-x}$ ($0.05 \leq x \leq 0.20$), $Ba_{0.999-x}Sr_xCe_{0.001}TiO_3$ ($0.3 \leq x \leq 0.4$), a BEDT-TTF material, a $(TMTSF)_2X$ material (X being monovalent anion such as $PF_6^-$ or $ClO_4^-$), a TTF-TCNQ material, a $(DMe\text{-}DCNQI)_2Cu$ material, a cuprate superconductor of Bi, Tl, YBCO, LSCO, or NdCe, an alloy superconductor such as $MgB_2$, $Nb_3Sn$, or $Nb_3Al$, an organic superconductor such as $A_3C_{60}$ (A being at least one of Li, Na, K, Rb, and Cs), or a single-material superconductor such as Pb or Nb.

In each of the above embodiments, the material for the switching portion 6 that causes a 10-fold or more change in electric conductivity with a temperature change width optimally set for switching in accordance with the mean operating temperature set in the fourth temperature environment having a temperature variation of $\pm 4°$ C. from a temperature higher than $28°$ C., may be $(V_{1-x}Cr_x)_2O_3$ ($0.0048 \leq x \leq 0.097$) or $Ba_{0.999-x}Sr_xCe_{0.001}TiO_3$ ($x=0$, or $0.3 \leq x \leq 0.4$).

In a case where the mean operating temperature is set in the third temperature environment or the fourth temperature environment having a temperature variation of $\pm 4°$ C. from a temperature less than $20°$ C., the material for the electrodes 6a and 6b of the switching portion 6 should be in a metallic state within the range of (set operating temperature (switching$\pm$temperature width$\div 2$)). Such a material may be a composition of the above described Mott insulator that is in a metallic state at the above temperature, such as $(V_{1-x-y}Cr_xTi_y)_2O_3$ ($0.0097 \leq x \leq 0.0140$, $0.04 \leq y \leq 0.06$) or NiSe, or a composition of the above described CDW insulator that is in a metallic state at the above temperature, such as $1T\text{-}TaS_2$ or $CuIr_2S_4$, or a metal oxide such as $BaTiNbO_3$, $RuO_2$, $SrRuO_3$, or $ReO_3$, an alloy material such as TiN, ZrN, or HfN, or a single metal material such as Al, Cu, Ru, Ir, or Pt, or an organic conductor, or superconductor.

In each of the above embodiments, the material for the switching portion 6 that is in the low-resistance state in the first temperature environment having a temperature variation of $20°$ C. to $28°$ C., but causes a 10-fold or more change in electric conductivity with a temperature change of $+80°$ C., may be $(V_{1-x}Cr_x)_2O_3$ ($0.0093 \leq x \leq 0.0097$) or $Ba_{1-x}Sr_xTiO_3$ ($x=0.3$).

The material for the switching portion 6 that is in the low-resistance state in the first temperature environment and causes a 10-fold or more change in electric conductivity with a temperature change of $-80°$ C., may be $CuIr_2S_4$ or the like.

The material for the switching portion 6 that is in the low-resistance state in the first temperature environment and causes a 10-fold or more change in electric conductivity with a temperature change of $-80°$ C., may be $(V_{1-x}Cr_x)_2O_3$ ($0.0140 < x \leq 0.0150$), $WO_{3.0}$, or $BaCo_{0.9}Ni_{0.1}S_{2-x}$ ($x=0.15$).

In all the above embodiments, $(V_{1-x}Cr_x)_2O_3$ ($0.0110 \leq x \leq 0.0119$) is the most desirable among the materials known to this date as the materials for the switching portion. If a material that causes a change in electric resistance with temperature in the vicinity of room temperature and has smaller inner stress due to a change in volume is discovered in the future, it is even more preferable to use the material as a switching material. If the change in electric resistance caused by a temperature change of $10°$ C. is of 6 or more digits, the integrated circuit can form a logic circuit.

Even if the change in electric resistance caused by a temperature change of 10° C. is of less than 6 digits, the integrated circuit can be used as a non-volatile memory or the like, as long as the thermal hysteresis is approximately 20° C.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile switching element comprising:
    a switching film formed on a substrate, made of a material causing a 10 times or greater change in electric resistance with a temperature change within a range of ±80 K from a predetermined temperature;
    a Peltier element causing the switching film to have the temperature change;
    a heat conducting and electric insulating film provided between the switching film and the Peltier element, to conduct heat from the Peltier element; and
    a pair of electrodes connected to the switching film.

2. The non-volatile switching element according to claim 1, wherein the switching film contains a material selected from the group consisting of $(V_{1-x}Cr_x)_2O_3$ wherein $0.0097 \leq x \leq 0.0140$ and $(Ba_{0.999-x}Sr_x)Ce_{0.001}TiO_3$ wherein $0.3 \leq x \leq 0.4$.

3. The non-volatile switching element according to claim 1, wherein the switching film contains a material selected from the group consisting of $(V_{1-x}Cr_x)_2O_3$ wherein $0.0110 \leq x \leq 0.0119$ and $(Ba_{0.999-x}Sr_x)Ce_{0.001}TiO_3$ wherein $0.3 \leq x \leq 0.4$.

4. The non-volatile switching element according to claim 1, wherein the switching film contains a material selected from the group consisting of $(V_{1-x}Cr_x)_2O_3$ wherein $0 \leq x \leq 0.018$, $(V_{1-x}Ti_x)_2O_3$ wherein $0 \leq x \leq 0.052$, $Ni(S_{1-x}Se_x)_2$ wherein $0.26 \leq x \leq 0.275$, NiS, $CuIr_2(S_{1-x}Se_x)_4$ wherein $0 \leq x \leq 0.1$, $Ti_2O_3$, $Fe_3O_4$, $EuO_{1-x}$ wherein $0.0005 \leq x \leq 0.004$, $WO_{3.0}$, $BaCo_{0.9}Ni_{0.1}S_{2-x}$ wherein $0.05 \leq x \leq 0.20$, and $Ba_{0.999-x}Sr_xCe_{0.001}TiO_3$ wherein $0.3 \leq x \leq 0.4$.

5. The non-volatile switching element according to claim 1, wherein the switching film contains a material selected from the group consisting of $(V_{1-x}Cr_x)_2O_3$ wherein $0.0048 \leq x \leq 0.0097$ and $Ba_{0.999-x}Sr_xCe_{0.001}TiO_3$ wherein $x=0$, or $0.3 \leq x \leq 0.4$.

6. The non-volatile switching element according to claim 1, wherein the switching film contains a material having the composition of $(V_{1-x}Cr_x)_2O_3$ wherein $-0.00007222 \times T + 0.03344 - 0.0004 \leq x \leq -0.00007222 \times T + 0.03344 + 0.0004$ and where T is an absolute temperature of from 173 K to 403 K.

7. The non-volatile switching element according to claim 1, wherein the switching element is a normally-on element, and the switching film contains $(V_{1-x}Cr_x)_2O_3$ wherein $0.0093 \leq x \leq 0.0097$.

8. The non-volatile switching element according to claim 1, wherein the switching element is a normally-off element, and the switching film contains a material selected from the group consisting of $(V_{1-x}Cr_x)_2O_3$ wherein $0.0140 \leq x \leq 0.0150$, $CuIr_2(S_{1-x}Se_x)_4$ wherein $0 \leq x \leq 0.05$, and $WO_{3.0}$.

9. The non-volatile switching element according to claim 1, wherein a material of the switching film has a thermal hysteresis.

10. The non-volatile switching element according to claim 1, wherein the switching film has electric resistivity at predetermined temperature, 10 times or more lower than electric resistance at a temperature 80 K lower than the predetermined temperature, or 10 times or more higher than a temperature 80 K higher than the predetermined temperature.

11. The non-volatile switching element according to claim 1, wherein:
    the heat conducting and electric insulating film is provided to cover the switching film from above;
    the Peltier element is located in a region that is immediately above the switching film and is on the heat conducting and electric insulating film; and
    the pair of electrodes are provided on both side faces of the switching film.

12. The non-volatile switching element according to claim 11, further comprising:
    at least one of a first insulator and a second insulator, the first insulator being provided between the substrate and the switching film and containing a material with heat conductivity lower than 2.0 (W/mK), and the second insulator covering side faces and a top face of the Peltier element and containing a material with heat conductivity lower than 2.0 (W/mK).

13. The non-volatile switching element according to claim 1, wherein:
    the heat conducting and electric insulating film is provided to cover a lower face, side faces, and a top face of the Peltier element; and
    the switching film is provided to cover the heat conducting and electric insulating film.

14. The non-volatile switching element according to claim 1, wherein:
    the heat conducting and electric insulating film is provided to cover a lower face and side faces of the switching film; and
    the Peltier element is provided on the side face of the switching film so as to interpose the heat conducting and electric insulating film therebetween.

15. An integrated circuit comprising:
    a plurality of cells arranged in a matrix form, each of the cells having the non-volatile switching element according to claim 1.

16. The integrated circuit according to claim 15, wherein:
    each of the cells includes a pair of first connection electrodes connected to the pair of electrodes, and a pair of second connection electrodes for applying current to the Peltier element,
    each of the cells is a memory cell in which the switching element operates as a memory element,
    electric power is supplied to the Peltier element of the memory element of at least one of the cells via the second connection electrodes, so as to change the electric resistivity of the switching film to perform writing in the cell, and
    current is applied to the switching film via the first connection electrodes, so as to perform reading from the cell.

17. The integrated circuit according to claim 16, further comprising a mechanism configured to supply electric power so as to cause a temperature change opposite from a temperature change of the Peltier electrode of at least one of the cells, when writing is to be performed in the at least one of the cells, the electric poser being supplied to the Peltier element of each cell adjacent to the cell in which the writing is to be performed.

18. The integrated circuit according to claim 16, wherein bias power is supplied to the Peltier element of each of the cells so as to set the switching film of each cell at the predetermined temperature.

19. The integrated circuit according to claim 18, wherein the bias power for setting the switching film at the predetermined temperature is superimposed on power for performing writing on a cell in which writing is to be performed.

20. A method for manufacturing a non-volatile switching element, comprising:
  forming a switching film on a substrate, the switching film made of a material causing a 10 times or more change in electric resistivity with a temperature change within a range of ±80 K from a predetermined temperature;
  forming a heat conducting and electric insulating film on the switching film;
  forming a first Peltier electrode film of a first conductivity type on the heat conducting and electric insulating film so as to overlap the switching film;
  forming a second Peltier electrode film of a second conductivity type on the first Peltier electrode film so as to overlap the switching film;
  forming a Peltier element that includes the first Peltier electrode film and the second Peltier electrode film by pattering the first and second Peltier electrode films;
  performing ion implantation to the switching film located on both sides of the Peltier element, so as to form a switching portion at the portion of the switching film that is located immediately below the Peltier element and to which ions are not injected; and
  forming electrodes of the switching portion by performing heat treatment to alloy the portion of the switching film to which the ions are injected.

21. The non-volatile switching element according to claim 1, wherein the heat conducting and electric insulating film is an AlN film.

22. The non-volatile switching element according to claim 1, wherein the heat conducting and electric insulating film is at least one selected from the group consisting of BN, diamond, $Si_3N_4$ and $Al_2O_3$.

23. The method for manufacturing a non-volatile switching element according to claim 20, wherein the heat conducting and electric insulating film is an AlN film.

24. The method for manufacturing a non-volatile switching element according to claim 20, wherein the heat conducting and electric insulating film is at least one film selected from the group consisting of BN, diamond, $Si_3N_4$ and $Al_2O_3$.

* * * * *